United States Patent
Engheta et al.

(10) Patent No.: US 11,494,461 B2
(45) Date of Patent: Nov. 8, 2022

(54) METASTRUCTURES FOR SOLVING EQUATIONS WITH WAVES

(71) Applicant: The Trustees of the University of Pennsylvania, Philadelphia, PA (US)

(72) Inventors: Nader Engheta, Berwyn, PA (US); Brian Edwards, Abington, PA (US); Nasim Mohammadi Estakhri, Philadelphia, PA (US); Mario Junior Mencagli, Philadelphia, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 785 days.

(21) Appl. No.: 16/387,326

(22) Filed: Apr. 17, 2019

(65) Prior Publication Data
US 2020/0257751 A1     Aug. 13, 2020

Related U.S. Application Data

(60) Provisional application No. 62/658,948, filed on Apr. 17, 2018.

(51) Int. Cl.
*G06F 17/11* (2006.01)
*G01B 9/02* (2022.01)
(Continued)

(52) U.S. Cl.
CPC ............... *G06F 17/11* (2013.01); *G01B 9/02* (2013.01); *G02B 1/002* (2013.01); *G02F 1/225* (2013.01);
(Continued)

(58) Field of Classification Search
CPC ...... G06F 17/11; G06F 17/12; G06F 2111/10; G06F 30/20; G06F 30/23; G01B 9/02; G02B 1/002; G02B 6/29355; G02F 1/212; G02F 1/225; H03M 1/72; G06E 3/003; G06E 3/005
See application file for complete search history.

(56) References Cited

U.S. PATENT DOCUMENTS 10,460,007 B1 * 10/2019 Zheng ..................... G06F 17/11
10,628,634 B1 * 4/2020 Ghaddar ................ G06F 17/11
(Continued)

OTHER PUBLICATIONS

Ambs, P. "Optical computing: a 60-year adventure." Advances in Optical Technologies 2010 (2010).
(Continued)

*Primary Examiner* — Ryan A Lepisto
*Assistant Examiner* — Erin D Cheim
(74) *Attorney, Agent, or Firm* — BakerHostetler

(57) ABSTRACT

Methods, devices, and systems for processing information are disclosed. An example device may comprise a metastructure comprising a plurality of physical features configured to transform an analog signal according to a kernel of an integral equation. The device may comprise one or more waveguides coupled to the metastructure and configured to recursively supply a transformed analog output signal of the metastructure to an input of the metastructure to iteratively cause one or more transformed analog signals output from the metastructure to converge to an analog signal representing a solution to the integral equation.

20 Claims, 44 Drawing Sheets
(44 of 44 Drawing Sheet(s) Filed in Color)

(51) Int. Cl.
  *G02B 1/00* (2006.01)
  *G02F 1/225* (2006.01)
  *H03M 1/72* (2006.01)
  *G02F 1/21* (2006.01)
  *G06E 3/00* (2006.01)
  *G02B 6/293* (2006.01)

(52) U.S. Cl.
  CPC ........... *H03M 1/72* (2013.01); *G02B 6/29355* (2013.01); *G02F 1/212* (2021.01)

(56) References Cited

U.S. PATENT DOCUMENTS 11,087,043 B2 * 8/2021 Tsang ...................... G06F 30/20
11,125,866 B2 * 9/2021 Sumi ................... G01S 7/52041

OTHER PUBLICATIONS

Azana, José, "Proposal of a Uniform Fiber Bragg Grating as an Ultrafast all-optical integrator", Opt. Lett., vol. 33, No. 1, Jan. 1, 2008, pp. 4-6.
Broyden, "A Class of Methods for Solving Nonlinear Simultaneous Equations", Math. Comput., 1965, 19, 577-593.
Bush, "The Differential Analyzer. A New Machine For Solving Differential Equations", J. Franklin Inst., 1931, 212, 447-488.
Caulfield et al., "Why Future Supercomputing Requires Optics", Nat. Photonics, 2010, 4, 261-263.
Caulfield, J. H. and Dolev, S. "Why future supercomputing requires optics." Nature Photonics 4, 261-263 (2010).
Cederquist et al., "Coherent Optical Feedback for the Analog Solution of Partial Differential Equations", J. Opt. Soc. Am., 1980, 70, 944-953.
Cederquist, "Integral-Equation Solution Using Coherent Optical Feedback", J. Opt. Soc. Am., 1981, 71, 651-655.
CST Studio Suite. 2016, http://www.CST.com.
D. A. B. Miller, "How complicated must an optical component be?," JOSA 30, 238-251 (2013).
D. A. B. Miller, "Meshing optics with applications," Nature Photonics 11, 403-404 (2017).
D. Miller Science 347 (2015).
Doskolovich et al., "Spatial Differentiation of Optical Beams Using Phase-Shifted Bragg Grating", Opt. Lett., 2014, 39,1278-1281.
Engheta, N. "Mathematical operations and processing with structured materials," a section in Urbas, A. M., et al. "Roadmap on optical metamaterials." Journal of Optics 18, 093005 (2016), pp. 9-10.
Ferrera et al., "On-chip CMOS-Compatible All-Optical Integrator", Nat. Commun., 2010, 1, 29.
Gok et al., "Tailoring The Phase and Power Flow of Electromagnetic Fields", Phys. Rev. Lett., Dec. 2013, 111(23), 233904.
Hildebrand, Methods of Applied Mathematics, Courier Corporation, pp. 266-269, 2012.
Hughes et al., "Training of Photonic Neural Networks through in situ Backpropagation and Gradient Measurement", Optica, 2018, 5, 864-871.
Javidi, B., and Horner, J. L. "Optical pattern recognition for validation and security verification." Optical engineering 33, 1752-1756 (1994).
Kulishov et al., "Long-Period Fiber Gratings as Ultrafast Optical Differentiators", Opt. Lett., vol. 30, No. 20, 2005, pp. 2700-2702.
Lin et al., "All-Optical Machine Learning Using Diffractive Deep Neural Networks", Science, 2018, 361, 1004-1008.
Liu et al., "A fully reconfigurable photonic integrated signal processor", Nat. Photonics, 2016, 10, 190-195.
Miller, "Establishing Optimal Wave Communication Channels Automatically", J. Lightwave Technol., 2013, 31, 3987-3994.

Miller, "Perfect Optics with Imperfect Components", Optica, 2015, 2, 747-750.
Miller, "Self-Aligning Universal Beam Coupler", Opt. Express, 2013, 21, 6360-6370.
Miller, "Self-Configuring Universal Linear Optical Component [Invited]", Photon. Res., 2013, 1,1-15.
Miller, D. A. B. "Are optical transistors the logical next step?" Nature Photonics 4, 3-5 (2010).
Miller, D. A. B. "Rationale and challenges for optical interconnects to electronic chips." Proceedings of the IEEE 88, 728-749 (2000).
N. Engheta, "Circuit with light at nanoscales: optical nanocircuits inspired by metamaterials," Science 317, 1698-1702 (2007).
N. Engheta, A. Salandrino, and A. Alu, "Circuit elements at optical frequencies: nano-inductor, nano-capacitor, and nano-resistor," Phys. Rev. Lett. 95, 095504 (2005).
N. Engheta, R.W. Ziolkowski, Eds., Metamaterials', Physics and Engineering Explorations, Wiley, 2006.
N. Mohammadi Estakhri, B. E. Edwards, and N. Engheta, "Solving Integral Equations with Optical Metamaterial-Waveguide Networks," in Conference on Lasers and Electro-Optics, OSA Technical Digest (online) (Optical Society of America, 2017).
Oldenburger, R. "Infinite powers of matrices and characteristic roots." Duke Mathematical Journal 6, 357-361 (1940).
Perez et al., "Field-programmable photonic Arrays", Opt. Express, 2018, 26, 27265-27278.
Perez et al., "Multipurpose Silicon Photonics Signal Processor Core", Nat. Commun., 2017, 8, 636.
Piggot et al., "Inverse design and demonstration of a compact and broadband on-chip wavelength demultiplexer," Nature Photonics, 2015, vol. 9, pp. 374-377.
Pors et al., "Analog computing using reflective plasmonic metasurfaces", Nano Lett., 2015, 15, 791-797.
Pors, A., Nielsen, M. G., and Bozhevolnyi, S. I. "Analog computing using reflective plasmonic metasurfaces." Nano letters 15, 791-797 (2014).
Preciado et al., "Ultrafast All-Optical Integrator Based on a Fiber Bragg Grating: Proposal and Design", Opt. Lett., 2008, 33, 1348-1350.
Rahmanzadeh et al., "Adopting Image theorem for Rigorous Analysis of a Perfect Electric Conductor-Backed array of Graphene Ribbons", Opt. Lett., 2015, 40, 5239-5242.
Rajbenbach et al., "Optical Implementation of an Iterative Algorithm Formatrix Invrsion", Appl. Opt. Mar. 15, 1987, 26(6), 1987, 1024-1031.
S. H. Lee, "Optical analog solution of partial differential and integral equation," Optical Engineering, vol. 24 No. 1, Jan.-Feb. 1985, pp. 041-047.
Silva et al., "Performing Mathematical Operations with Metamaterials", Science, 2014, 343, 160-163.
Slavik et al., "Photonic Temporal Integrator for All-Optical Computing", Opt. Express, 2008, 16, 18202-18214.
Solli et al., "Analog Optical Computing", Nat. Photonics, 2015, 9, 704-706.
Solli et al., "Fluctuations and Correlations in Modulation Instability", Nat. Photonics, 2012, 6, 463-468.
Thomson, "V. Mechanical Integration of the Linear Differential Equations of the Second Order with Variable Coefficients", Proc. R. Soc. London, 1876, 24, 269-271.
Wu et al., "Computing Matrix Inversion With Optical Networks", Opt. Express, 2014, 22, 295-304.
Xu et al., "High-Speed All-Optical Differentiator based on a Semiconductor Optical Amplifier and an Optical Filter", Opt. Lett., vol. 32, No. 13, 2007, pp. 1872-1874.
Yang et al., "All-Optical Differential Equation Solver with Constant-Coefficient Tunable Based on a Single Microring Resonator", Sci. Rep., 2014, 4, 5581.
Zhu et al., "Plasmonic Computing of Spatial Differentiation", Nat. Commun., 2017, 8, 15391.

* cited by examiner

US 11,494,461 B2

METASTRUCTURES FOR SOLVING EQUATIONS WITH WAVES

CROSS REFERENCE TO RELATED APPLICATIONS

This application claims the benefit of U.S. Provisional Patent Application No. 62/658,948, filed Apr. 17, 2018, which application is hereby incorporated by reference in its entirety for any and all purposes.

GOVERNMENT RIGHTS

This invention was made with government support under Contract No. N00014-16-1-2029 awarded by the Office of Naval Research and Contract No. FA9550-17-1-0002 awarded by the MURI Air Force Office of Scientific Research. The government has certain rights in the invention.

BACKGROUND

The growing demand for high-speed, large-capacity data communications and processing will rely on the development of novel platforms to optimize these functionalities. In view of their inherently large speed, electromagnetic waves, and in particular light, may provide interesting solutions to different aspects of data processing. Currently, long distance communications greatly relies on optical fibers and at the chip scale optical interconnects provide promising potentials to replace their electrical counterparts. However, exploiting the speed and parallel nature of light for data processing is still under development with the ultimate goal of realizing optical processors and other practical applications. Free-space optical signal processing setups have been around for several decades and largely studied for various applications such as optical pattern recognition. Yet, these systems typically include bulky lenses, spatial light modulators (SLMs), and diffractive optical elements and may be less suitable for chip level integration. Alternatively, the concept of all-optical digital computers faces many challenges concerning the practical implementation of optical transistors and optical logic circuits. Thus, there is a need for more sophisticated methods and devices for processing information.

SUMMARY

Methods, devices, and systems for processing information are disclosed. An example device may comprise a metastructure comprising a plurality of physical features configured to transform an analog signal according to a kernel of an integral equation. The device may comprise one or more waveguides coupled to the metastructure and configured to recursively supply a transformed analog output signal of the metastructure to an input of the metastructure to iteratively cause one or more transformed analog signals output from the metastructure to converge to an analog signal representing a solution to the integral equation.

An example method may comprise supplying an analog signal (e.g., analog spatial signal) to an input of a metastructure. The analog signal may represent an input value (e.g., or input function) of an integral equation. The metastructure may comprise a plurality of physical features configured to transform the analog signal according to a kernel of the integral equation. The method may comprise recursively supplying a transformed analog signal output from the metastructure to an input of the metastructure. The method may comprise determining a solution to the integral equation based on a recursively transformed analog signal output from the metastructure.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above-mentioned and other features and advantages of this disclosure, and the manner of attaining them, will become apparent and be better understood by reference to the following description of one aspect of the disclosure in conjunction with the accompanying drawings, wherein.

DETAILED DESCRIPTION OF ILLUSTRATIVE EMBODIMENTS

The computational capabilities of electromagnetic waves are of great interest for various applications such as analog computing and information processing. Fourier optics has been a rich platform to take advantage of the intrinsic parallel nature of light, and consequently large amounts of data—e.g., in form of an image—can be collectively processed through such systems. These structures, however, are typically much larger than the length scale of the operational wavelength [Rajbenbach et al. Applied Optics 26 (1987)], and impose challenges for integrated chip-scale platforms. Recently, it has been proposed that suitably designed metamaterials and metasurfaces can provide another route for analog computing based on wave-matter interaction [Silva et al. Science 343 (2014)]. In such paradigm, the complex-amplitude distribution of the electromagnetic wave is set to carry the data, which is then processed and evolves as it propagates through a properly designed metamaterial block. The size of the entire system is in order of the wavelength (e.g., a few wavelengths) and various mathematical operations such as differentiation, integration, and convolution have been numerically demonstrated. In this disclosure is presented another development in this line of research: solving integral equations using waves on a metamaterial platform. The method is based on integrating a feedback mechanism into the informatics metastructure, enabling a recursive calculation of solution of general linear integral equations. Two distinct approaches for such equation solving systems are disclosed: (1) metamaterials with inhomogeneous characteristics (e.g., permittivity) and (2) collections of Mach-Zehnder interferometers. Salient characteristics, design procedures for each technique, numerical simulation results and potential applications of these computing elements are provided.

Figure 1:
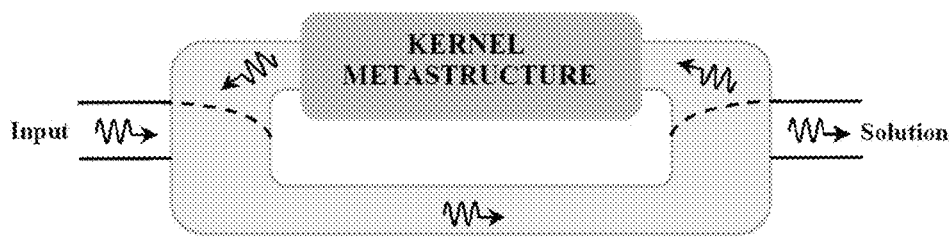
FIG. 1 shows an example metastructures connected to feedback loops.

FIG. 1 shows metastructures connected to feedback loops.

One can assume an integral equation which is Fredholm integral equation of the second kind (This is a standard and largely used form of integral equations). Now suppose design a metastructure to implement the kernel operator of the integral equation. The input to the metastructure will be g. Therefore, the output of the metastructure is the input (g) times the kernel (k) integrated from a to b. One can bring feedback into the system by taking the metastructure output and routing it into the input such that the two must be the same value and therefore equal. As a cartoon realization, one can do this using mirrors. Such a structure would be devoid of all fields unless one can introduce energy in some way. One can do this through a partial mirror and call this energy the system input (I). Now this system physically represents the initial integral equation. A the steady state, the fields at the input of the kernel (g) would be the solution of the Fredholm Integral Equation of the Second Kind. It is worth pointing out that the kernel can be translationally variant and the range of integration is finite, from a to b which are two real numbers. This makes the method very powerful.

Next, one can translate this concept into the world of metamaterials. One may use three things: (1) A kernel metastructure that implements the kernel of an integral equation, (2) a feedback mechanism and (3) to somehow inject an input wave and read the output, that is, the solution.

One can assume an input wave (g) with a certain profile. The metastructure would be capable of transforming the input wave into an output wave having a profile that corresponds to this mathematical operation. Via Nyquist theorem, a band-limited signal, if appropriately sampled, can fully capture a continuous distribution. As such, one can discretize the input (g) by sampling it with a series of waveguides.

Figure 2:
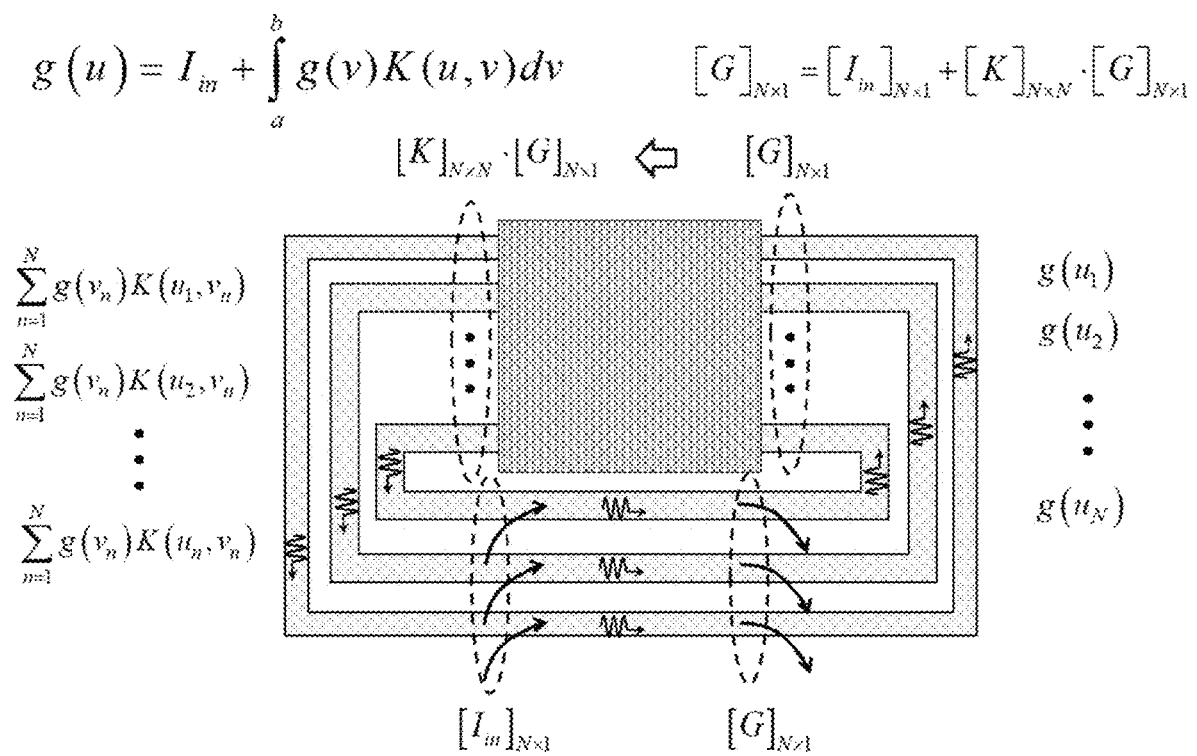
FIG. 2 shows discretized metastructures connected to feedback loops.

FIG. 2 shows discretized Metastructures connected to feedback loops.

One can assume N input waveguides attached to the kernel operating structure and the input of each one corresponds to value of g evaluated at points (y'1, y'2, ..., y'n). Let one further assume that one also has N output waveguides, the output of each one is equivalent to the numerical integral evaluated at the points (y1, y2, ..., yn). In other words, adding a set of input and output waveguides corresponds to a discretization of the integral equation. Now one can create a feedback mechanism by using a closed-loop waveguide network. Furthermore, one can use couplers for inserting the input and reading the output. These couplers will have weak coupling coefficients such that the majority of the energy is looped from the output of the kernel to the input of the kernel. Two sets of couples can also be used. One of the sets of couplers can be used for coupling in the input and the other can be used for coupling out the output.

Figure 3:
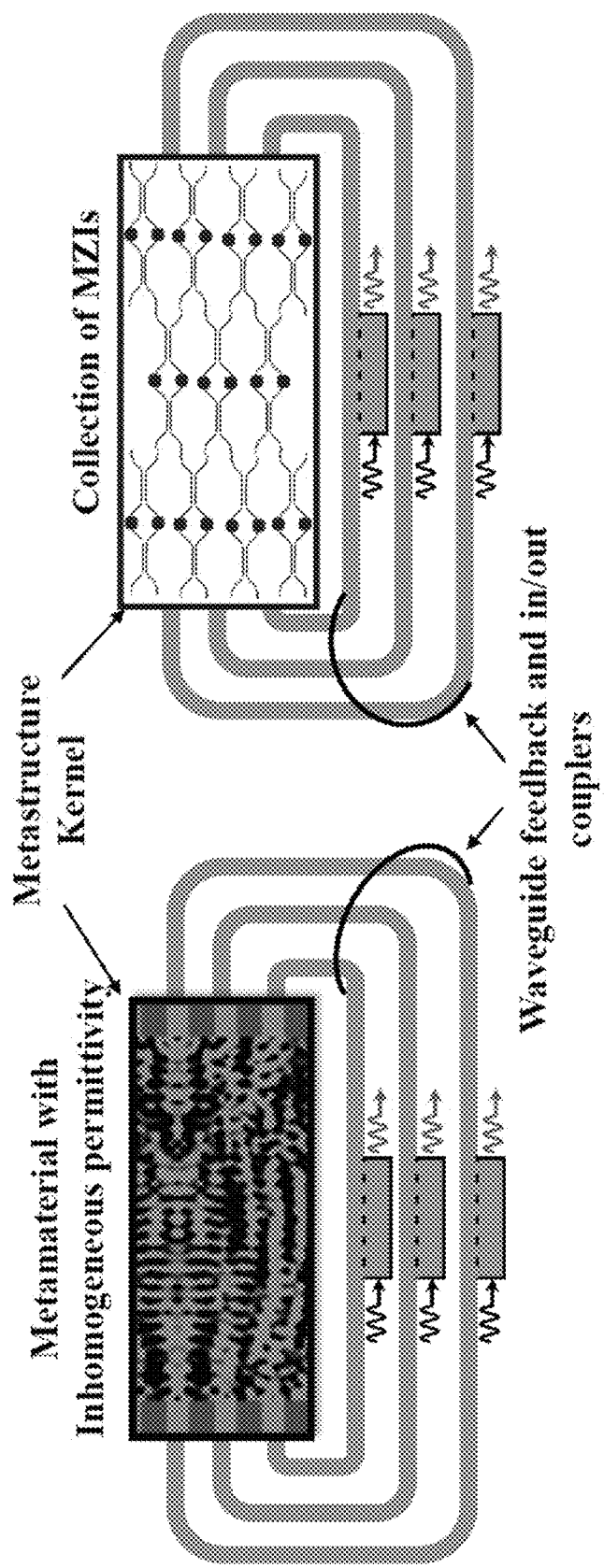
FIG. 3 shows two platforms for solving equations with waves inhomogeneous metastructures (left) and Collection of Mach-Zehnder Interferometers (MZI).

FIG. 3 shows two platforms for solving equations with waves: (left) inhomogeneous metastructures, (2) Collection of Mach-Zehnder Interferometers (MZI). Both platforms have feedback systems.

Based on this waveguide feedback network, proposed are two different approaches for solving integral equations.

The kernel of the integral equation is given, and one can implement that kernel as a metastructure. As the first approach, optimization algorithms can be used to find the distribution of permittivity in the structure to achieve a desired functionality. One can assume an initial structure with a known permittivity. To find the transfer function of the structure, one can solve the Maxwell equations and find fields everywhere. As an example, the transfer function given a structure can be found by solving the system $$[M]_{N \times N'} [X]_{N \times 1} = [B]_{N \times 1}$$

wherein X is the unknown electric and/or magnetic fields, B is a 'source' term, and M contains information about the physical structure relating the two. If the transfer function is what one wants, this would be the distribution of permittivity and optimization is done. If not, permittivity can be changed and the process can be repeated until converged. One approach for changing the permittivity is to enforce the goal of optimization as constraints while calculating system via a technique such as least-squares minimization. This will yield an estimate of the closest physical fields in the structure that satisfies the goal. These fields are then used to determine the permittivity for the next step. Mathematically this can be represented as:

$$\begin{bmatrix} M \\ aC \end{bmatrix}_{M \times N} \cdot [x]_{N \times 1} = \begin{bmatrix} 0 \\ aB \end{bmatrix}_{M \times 1} \rightarrow \varepsilon \equiv \frac{\nabla \times H}{-i\omega E}$$

Another class of techniques which similarly iteratively finds the desired permittivity is known as adjoint methods.

The second approach comprises using a Mach-Zehnder interferometer (MZI) mesh or array. Prior uses of Mach-Zehnder interferometer devices have been explained by David Miller (D. A. B. Miller, Opt. Express 21, 6360-6370 (2013); D. A. B. Miller, Photon. Res. 1, 1-15 (2013). According to Miller. MZI is constituted of two 50% splitters and two phase shifters. The operation of MZI can be found in Miller's references given above.

Figure 4:
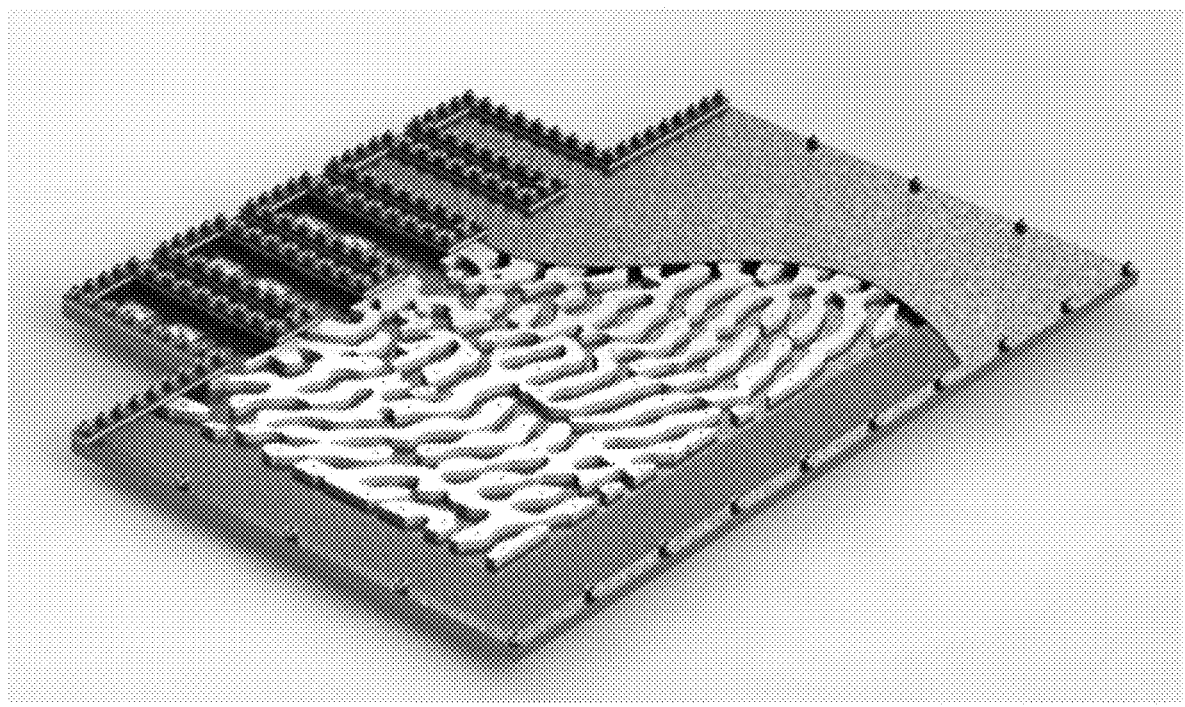
FIG. 4 shows an example metastructure.

FIG. 4 shows an example metastructure made in accordance with the present disclosure.

Figure 5:
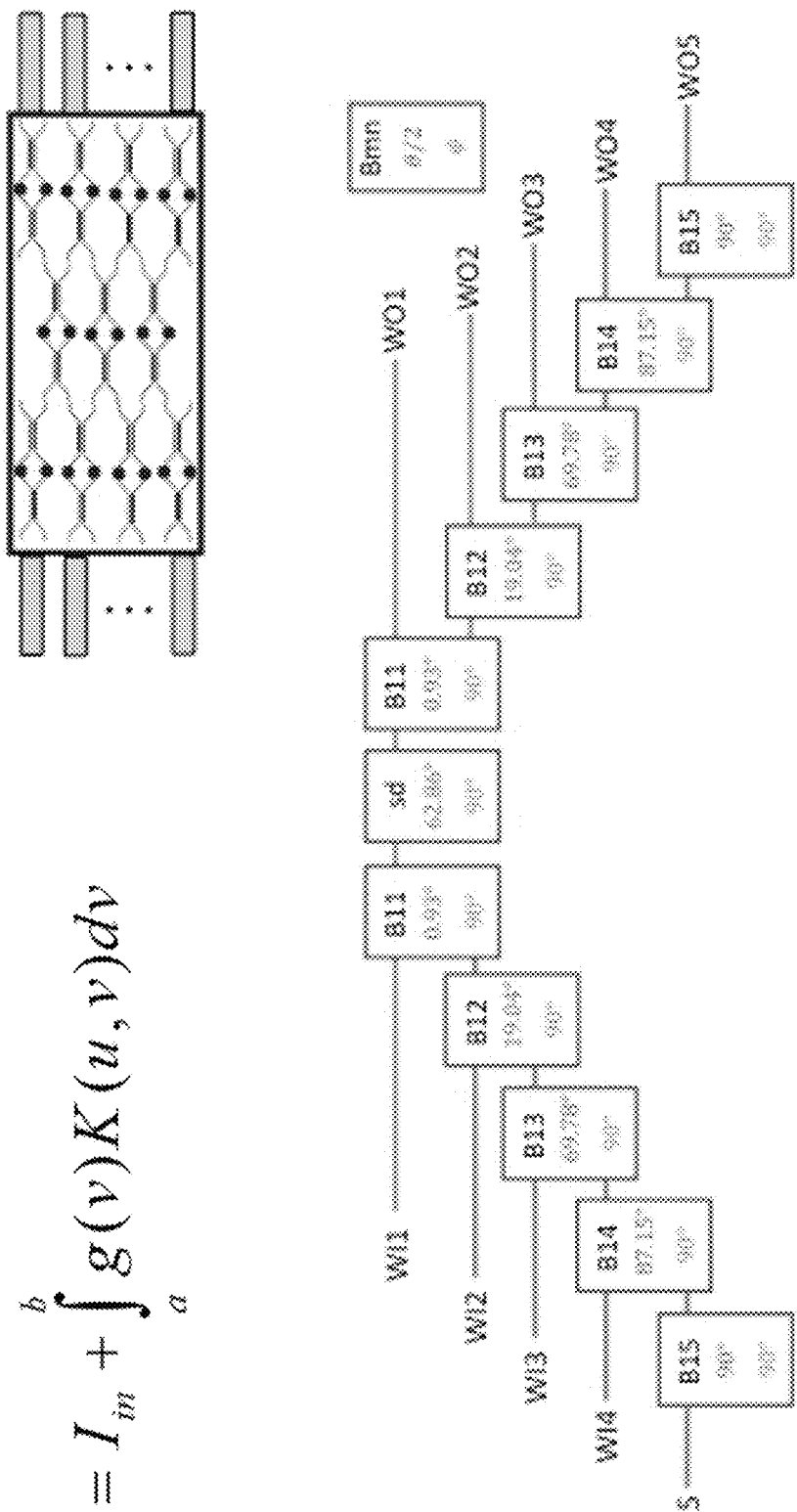
FIG. 5 shows a collection of MZIs for implementing the kernel operator $K(u,v)=0.7e^{-(u^2+v^2)}$.

FIG. 5 shows a collection of MZIs for an example of integral equation.

One approach may comprise extending the Miller approach to solving integral equations. As one example, one may choose an exponential function as kernel, and one can discretize it into a five by five matrix. Extending Miller's algorithm, one can obtain theta and phi of each MZI representing this kernel. The last figure of this slide shows the configuration of MZI mesh for implementing the kernel. Each block represents an MZI with the corresponding value of theta and phi.

Figure 6:
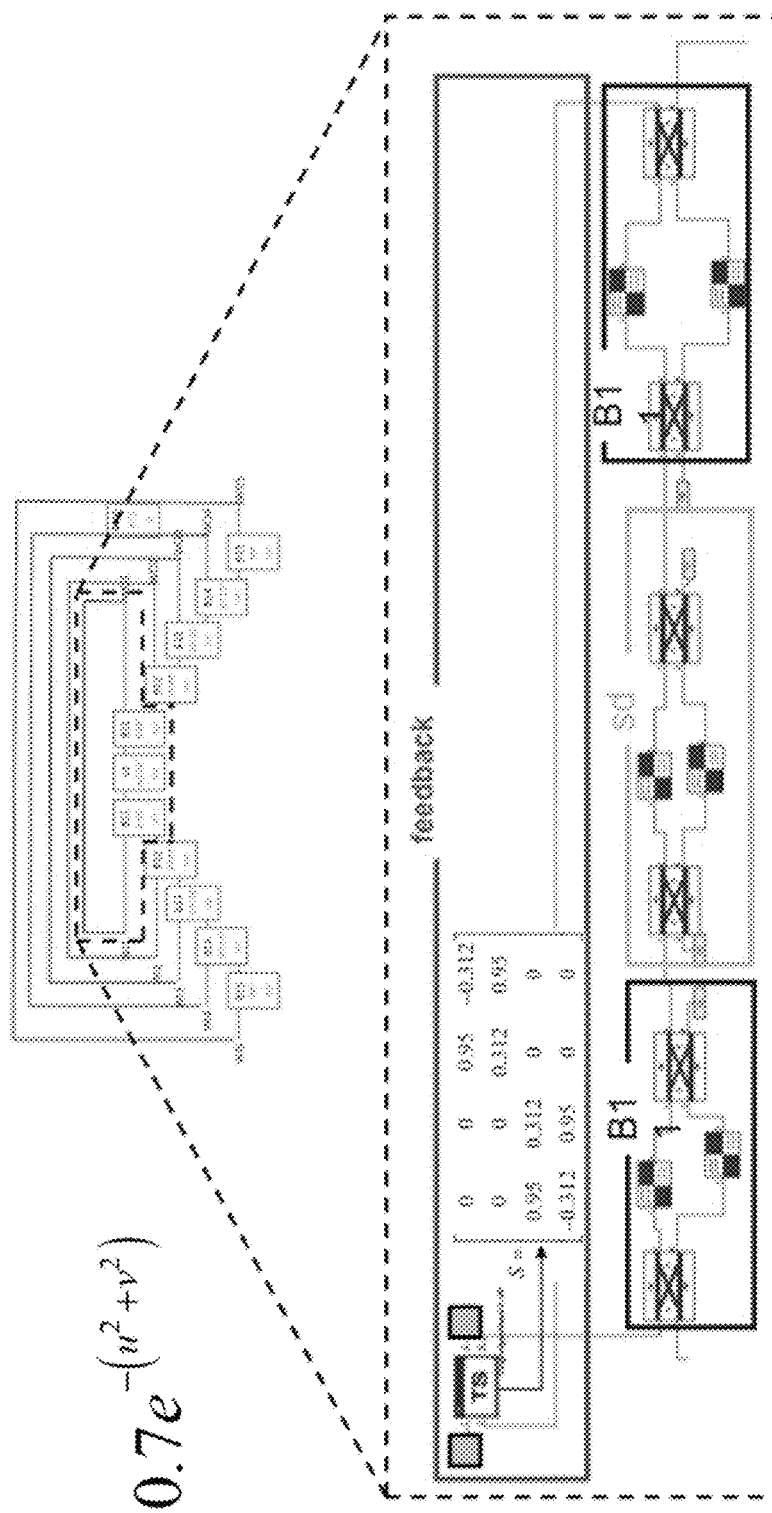
FIG. 6 shows the MZI mesh implementing the kernel operator $K(u,v)=0.7e^{-(u^2+v^2)}$ integrated with the feedback.
Figure 7:
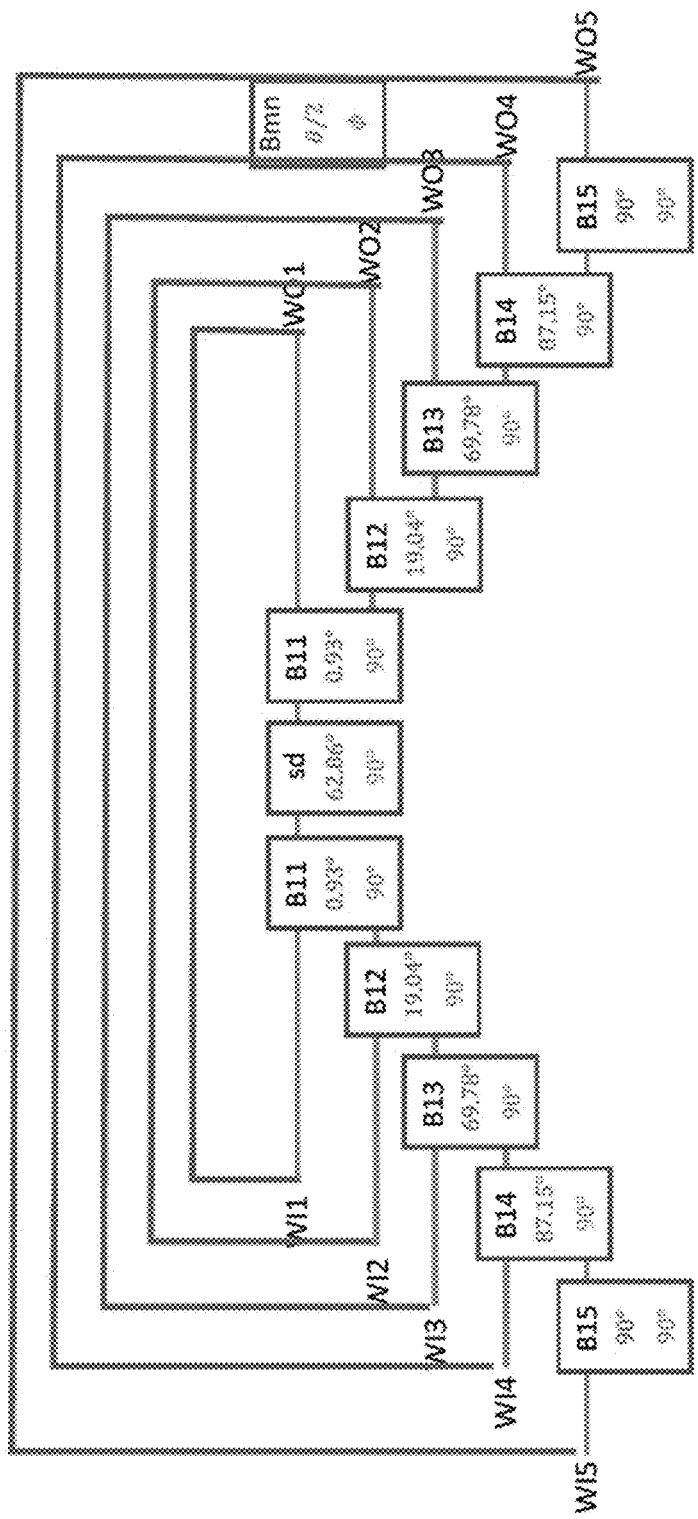
FIG. 7 shows a collection of MZIs.
Figure 8:
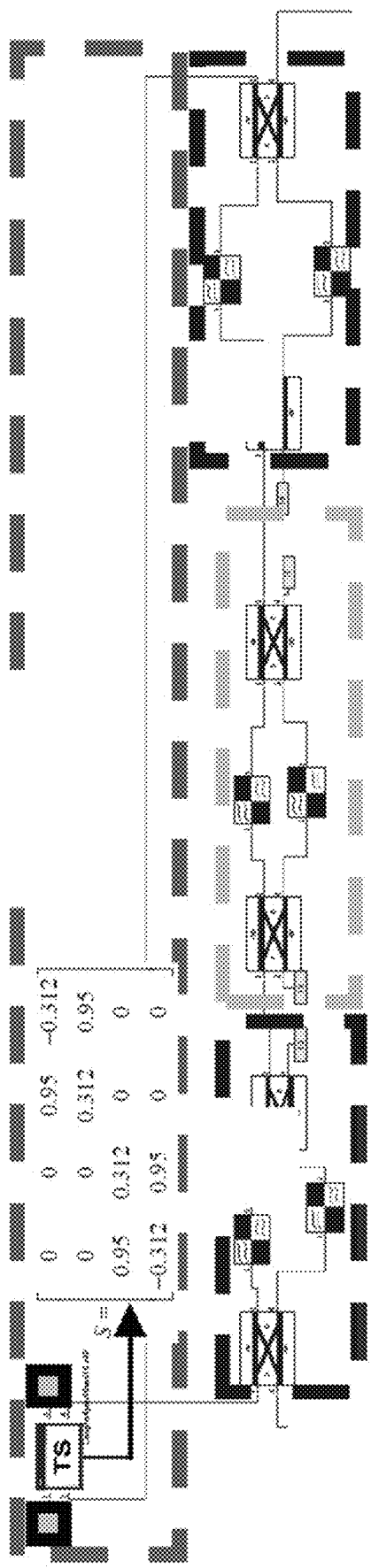
FIG. 8 shows information for the collection of MZIs.
Figure 9:
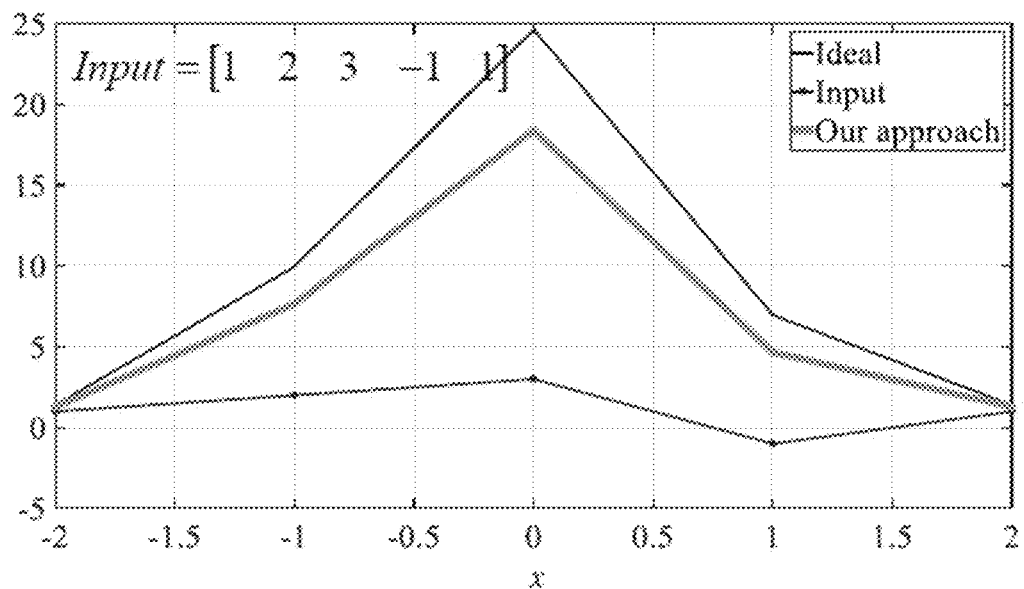
FIG. 9 shows a first comparison between the theoretical solution and the numerically simulated output signal as the solution of our MZI-based equation solver applied to solve an integral equation with the kernel operator $K(u,v)=0.7e^{-(u^2+v^2)}$.
Figure 10:
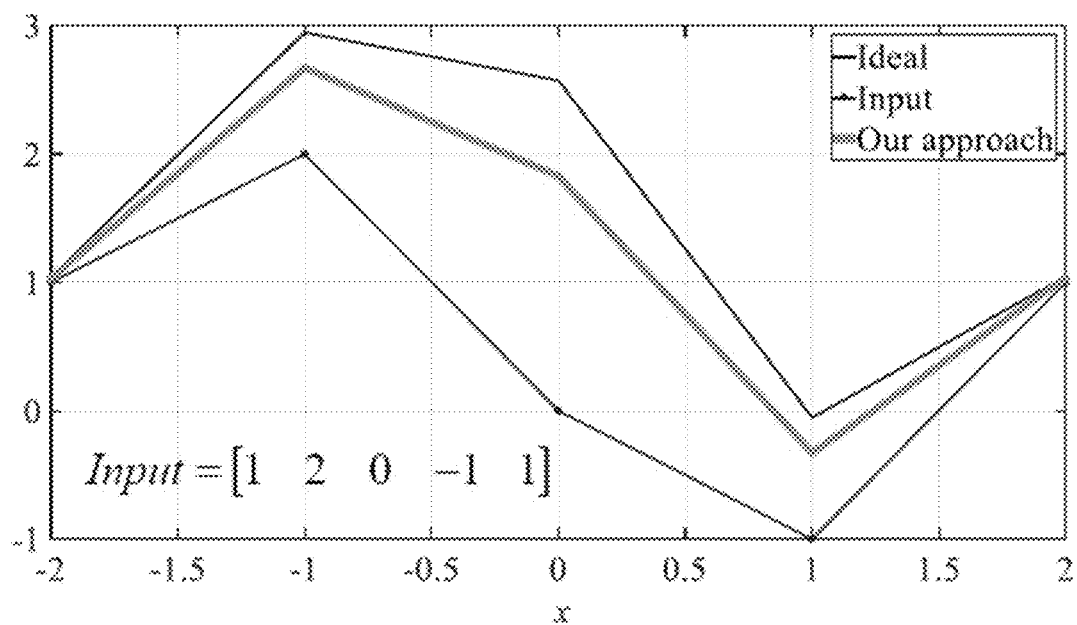
FIG. 10 shows the second comparison between the theoretical solution and the numerically simulated output signal as the solution of our MZI-based equation solver applied to solve an integral equation with the kernel operator $K(u,v)=0.7e^{-(u^2+v^2)}$.
Figure 11:
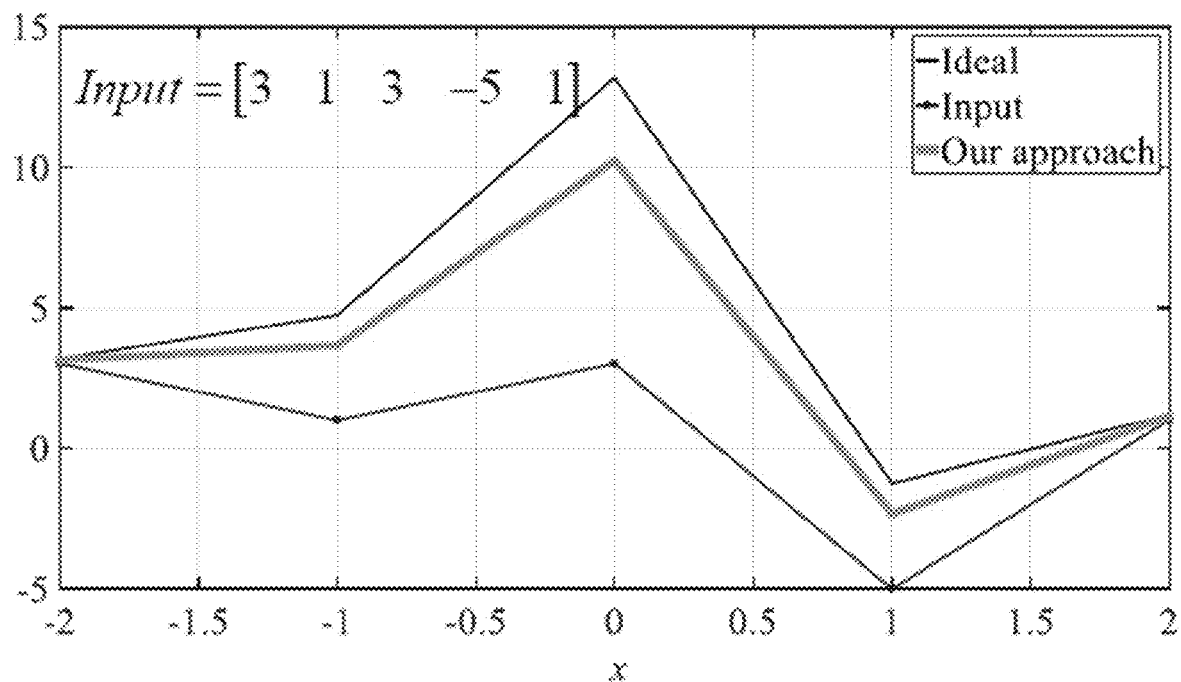
FIG. 11 shows the third comparison between the theoretical solution and the numerically simulated output signal as the solution of our MZI-based equation solver applied to solve an integral equation with the kernel operator $K(u,v)=0.7e^{-(u^2+v^2)}$.
Figure 12:
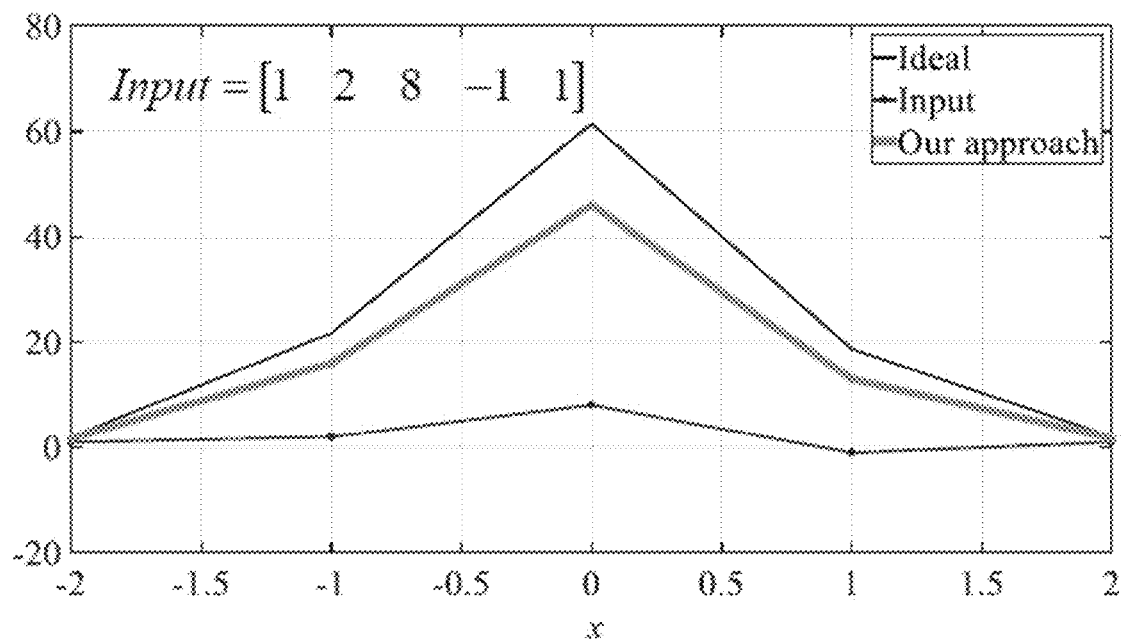
FIG. 12 shows the fourth comparison between the theoretical solution and the numerically simulated output signal as the solution of our MZI-based equation solver applied to solve an integral equation with the kernel operator $K(u,v)=0.7e^{-(u^2+v^2)}$.

FIG. 6 shows a collection of MZIs for an example of integral equation, with feedback included.

Now one can add the feedback to the MZI mesh. One can do this through looping the waveguides. Again, this is a closed system and energy may be introduced and sampled. This can be achieved through directional couplers. The entire structure was then simulated using CST schematic tool.

FIGS. 7-12 shows simulation results for the collection of MZIs to solve integral equation with the shown kernel, and for different inputs. In the figures, the blue curves are the input, the black curves correspond to the exact solution of the integral equation with the kernel shown in the previous slide, and the green curves are the solutions based on the MZI approach. The agreement between the "exact" solutions and the ones based on the MZI approach is good.

Figure 13A:
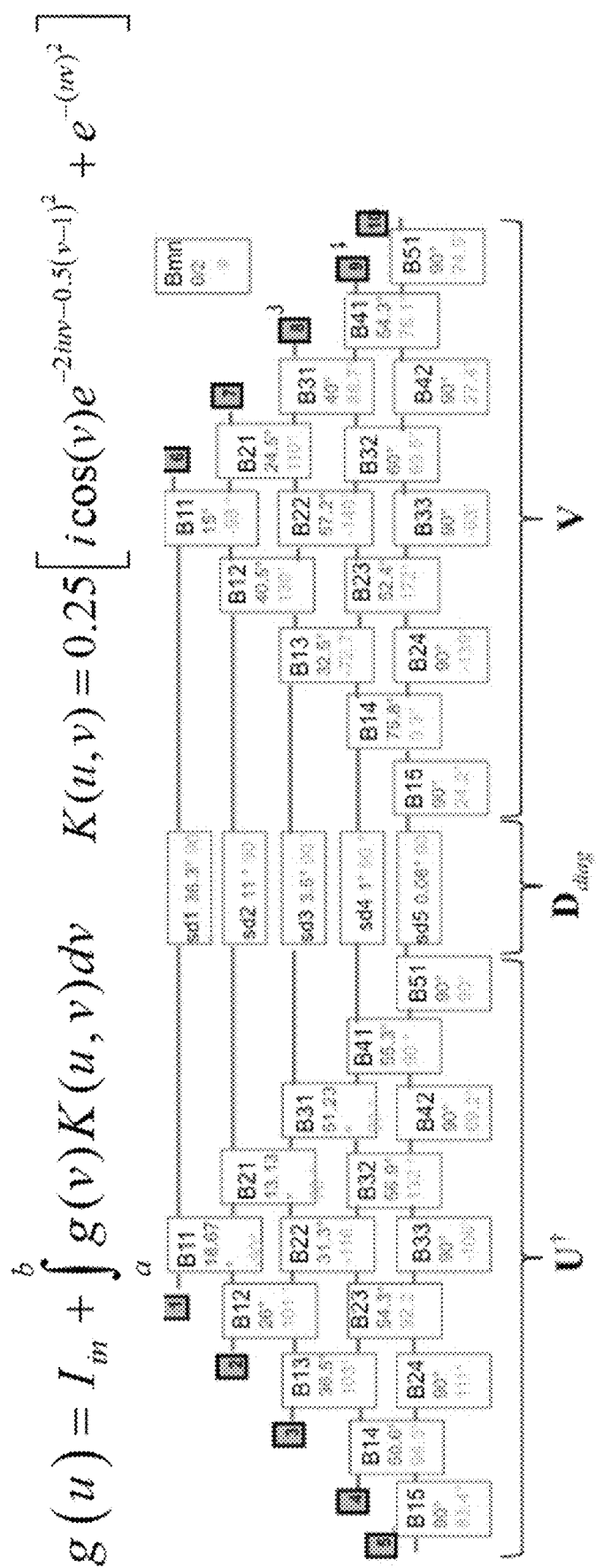
FIG. 13A shows another collection of MZIs to solve integral equation with another example kernel $K(u,v)=0.25[i\cos(v)e^{-2iuv-0.5(v-1)^2+e-(uv)^2}]$.
Figure 13B:
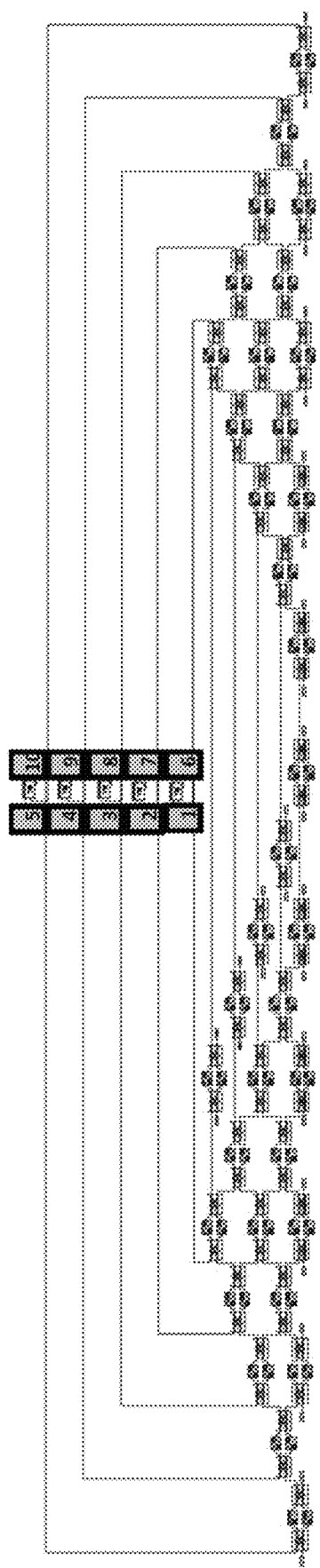
FIG. 13B shows another view of the collection of MZIs.
Figure 14A:
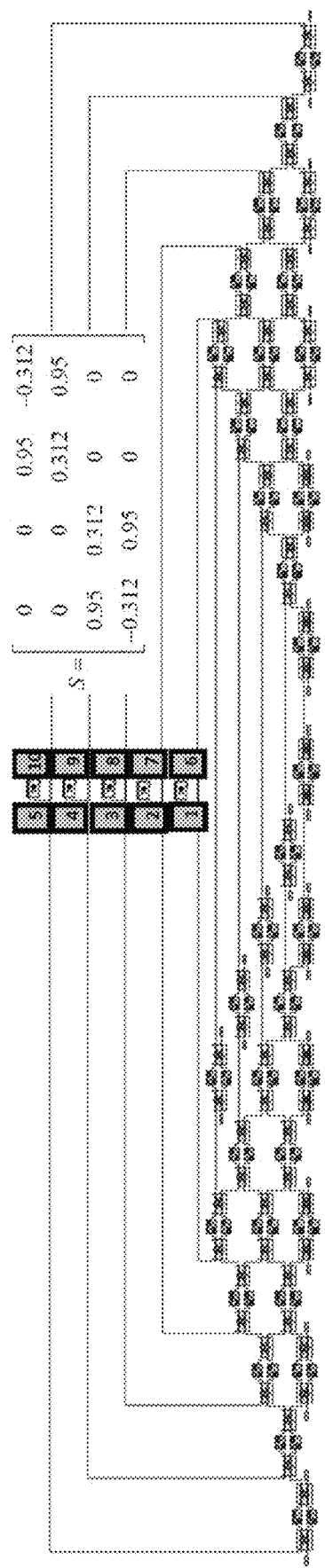
FIG. 14A shows a collection of MZIs to solve the integral equation with another example kernel.
Figure 14B:
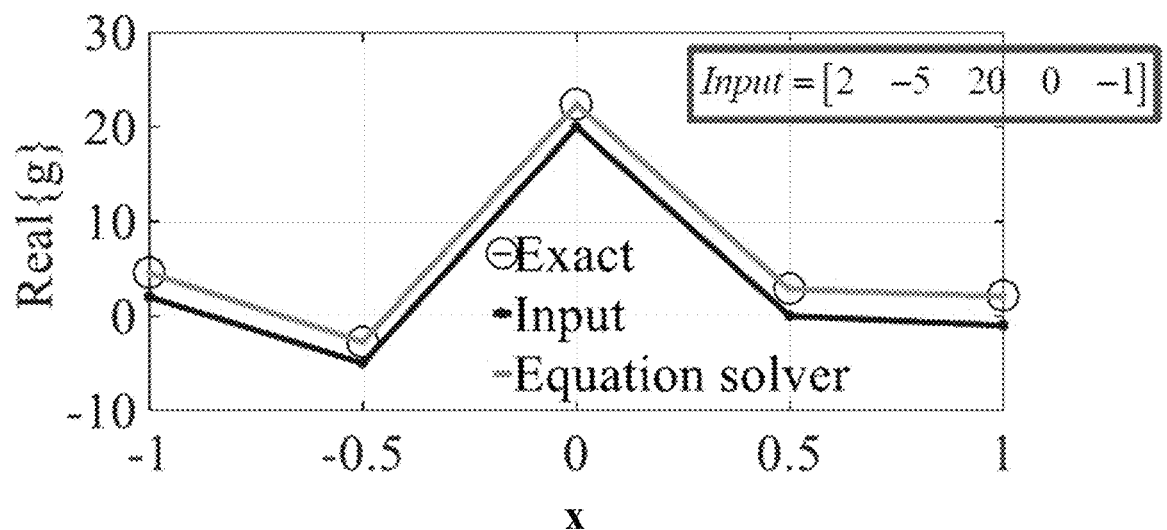
FIG. 14B shows a comparison between the real part of the theoretical solution and the numerically simulated output signal as the solution of our MZI-based equation solver applied to solve an integral equation with the kernel operator $K(u,v)=0.25[i\cos(v)e^{-2iuv-0.5(v-1)^2+e-(uv)^2}]$ for the input $[2 -5\ 20\ 0\ -1]$.
Figure 14C:
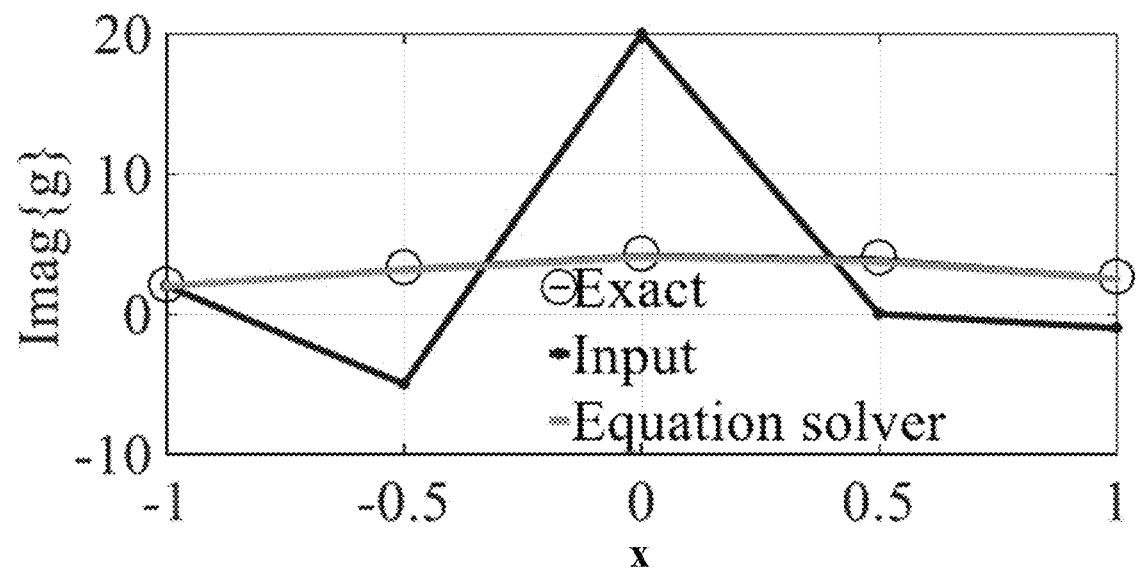
FIG. 14C shows a comparison between the imaginary part of the theoretical solution and the numerically simulated output signal as the solution of our MZI-based equation solver applied to solve an integral equation with the kernel operator $K(u,v)=0.25[i\cos(v)e^{-2iuv-0.5(v-1)^2+e-(uv)^2}]$ for the input $[2 -5\ 20\ 0\ -1]$.
Figure 14D:
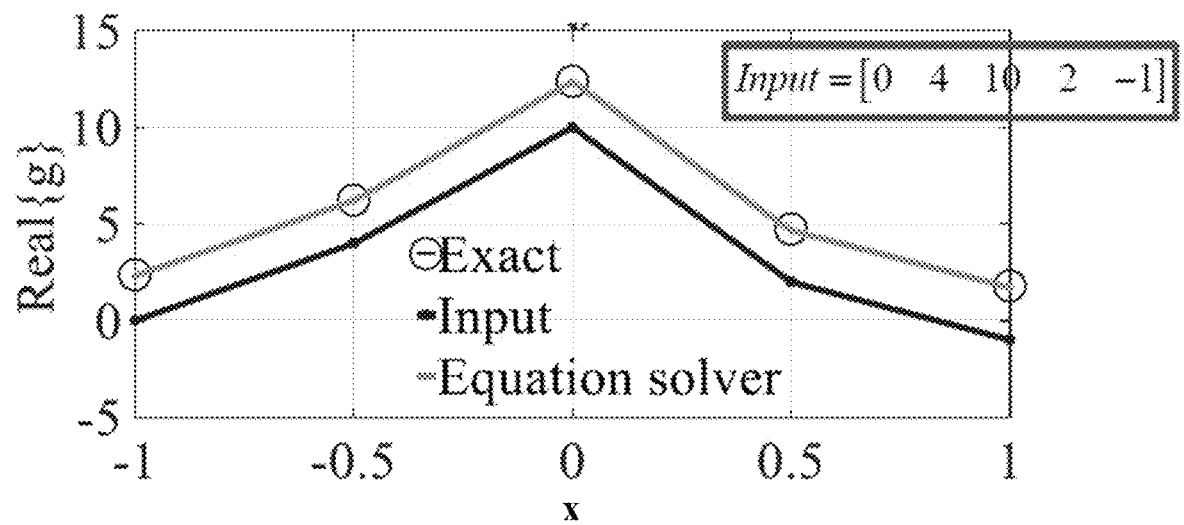
FIG. 14D shows a comparison between the real part of the theoretical solution and the numerically simulated output signal as the solution of our MZI-based equation solver applied to solve an integral equation with the kernel operator $K(u,v)=0.25[i\cos(v)e^{-2iuv-0.5(v-1)^2+e-(uv)^2}]$ for the input [0 4 10 2 −1].
Figure 14E:
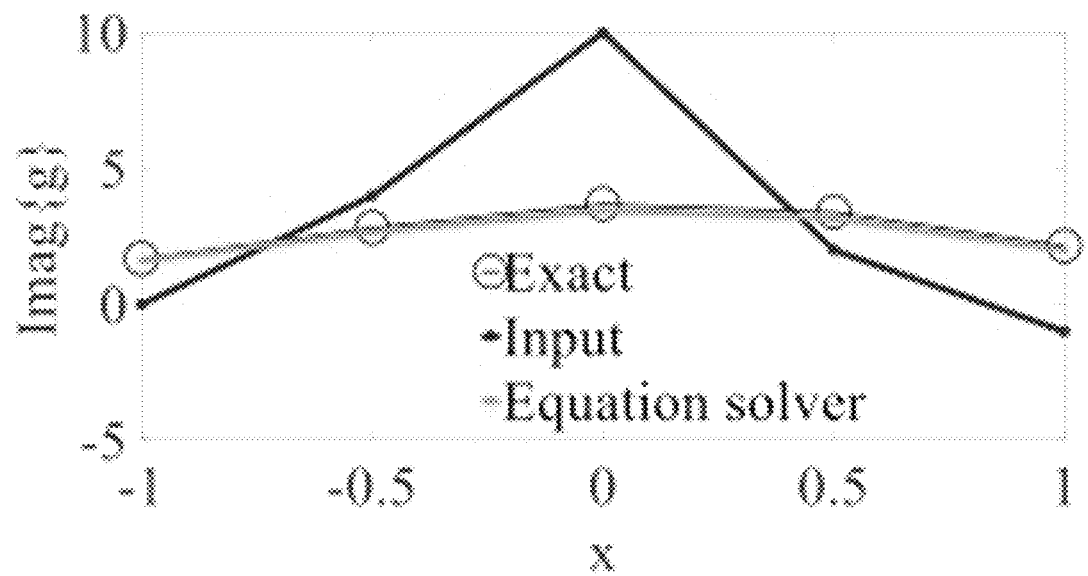
FIG. 14E shows a comparison between the imaginary part of the theoretical solution and the numerically simulated output signal as the solution of our MZI-based equation solver applied to solve an integral equation with the kernel operator $K(u,v)=0.25[i\cos(v)e^{-2iuv-0.5(v-1)^2+e-(uv)^2}]$ for the input [0 4 10 2 −1].

FIGS. 13A-B shows a collection of MZIs to solve integral equation with another example kernel, with the feedback included. The approach was also applied to a more general kernel which is complex-valued, translationally variant and non-separable. As in the previous case, by using Miller algorithm, one can obtain the value of theta and phi for each MZI for implementing the kernel. Following that, a feedback mechanism and couplers were added. Since the kernel is more complicated with respect to the previous one, the MZI mesh is more complex. However, it functions according to the same principles.

FIGS. 14A-E shows simulation results for the collection of MZIs to solve the integral equation with another example kernel, and with feedback included, for two arbitrary inputs.

Like before the blue curves correspond to the input, the black curves correspond to the exact solution of the integral equation, and the green curves are the solutions based on the disclosed approach. In this case, the solution of the integral equation has both a real and an imaginary part. Both for the real part and imaginary part, the agreement between the exact solution and the one based on the disclosed approach is excellent.

Figure 15:
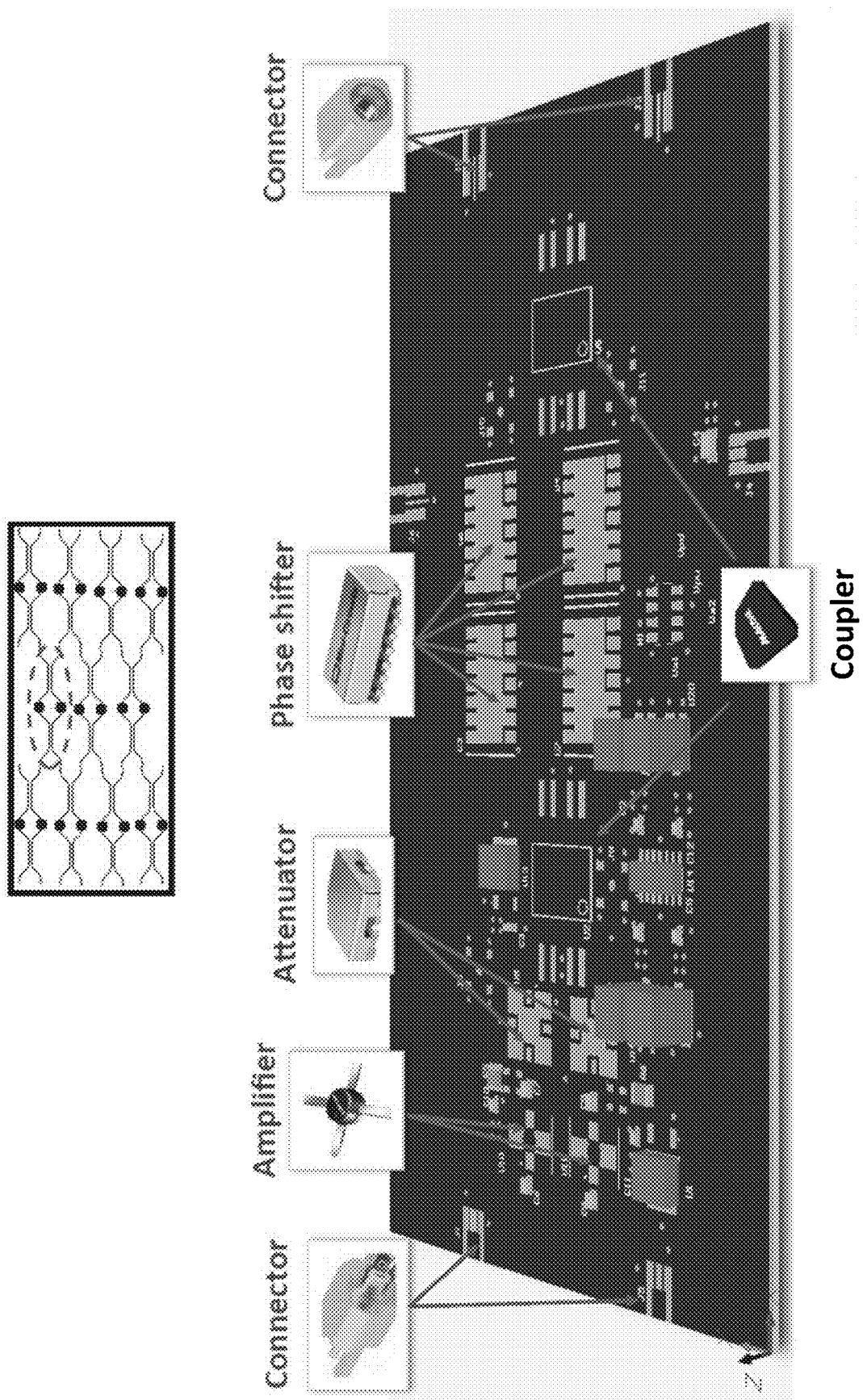
FIG. 15 shows an example single MZI using radio-frequency (RF) circuit elements.

FIG. 15 shows an example single MZI using radio-frequency (RF) circuit elements.

The numerical results that were obtained were favorable. Each MZI may be implemented using a printed circuit board (PCB) and discrete components. On each module there may be one or more couplers, phase shifters, amplifiers, or attenuators. The phase shifters may be voltage controlled such that the phase value can be tuned by changing a de voltage exterior to the system. This allows for real-time reconfigurability of the integral equation solver.

Figure 16:
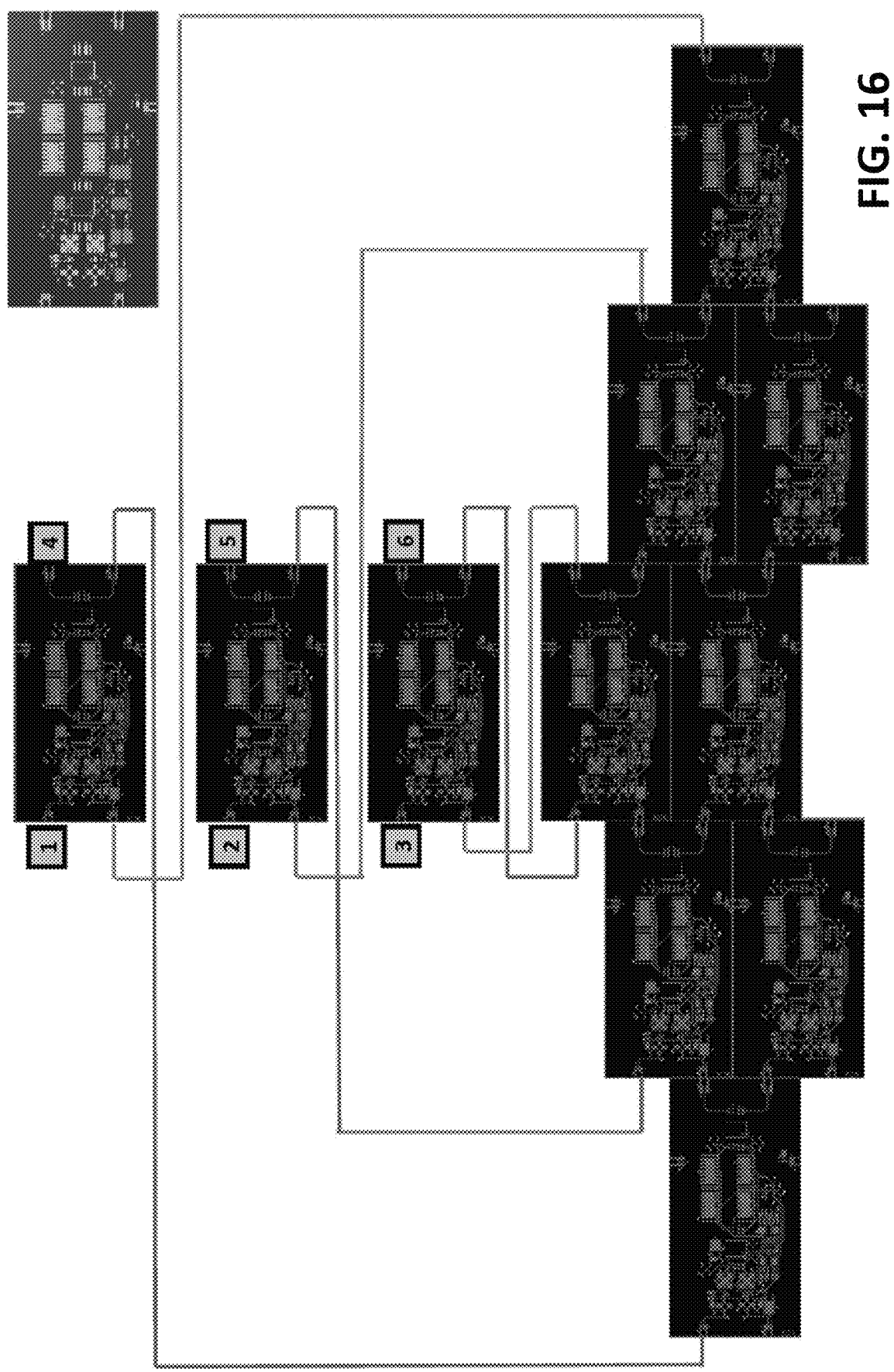
FIG. 16 shows an example of collections of MZIs using radio-frequency (RF) circuit elements.

FIG. 16 shows an example of collections of MZIs using radio-frequency (RF) circuit elements.

Each one of the module boards has been appropriately designed such that one can combine them together to form the MZI mesh that implements the kernel. The couplers in the feedback network will also be realized using discrete components on a PCB and the feedback connection can be realized using simple coaxial cables.

Figure 17:
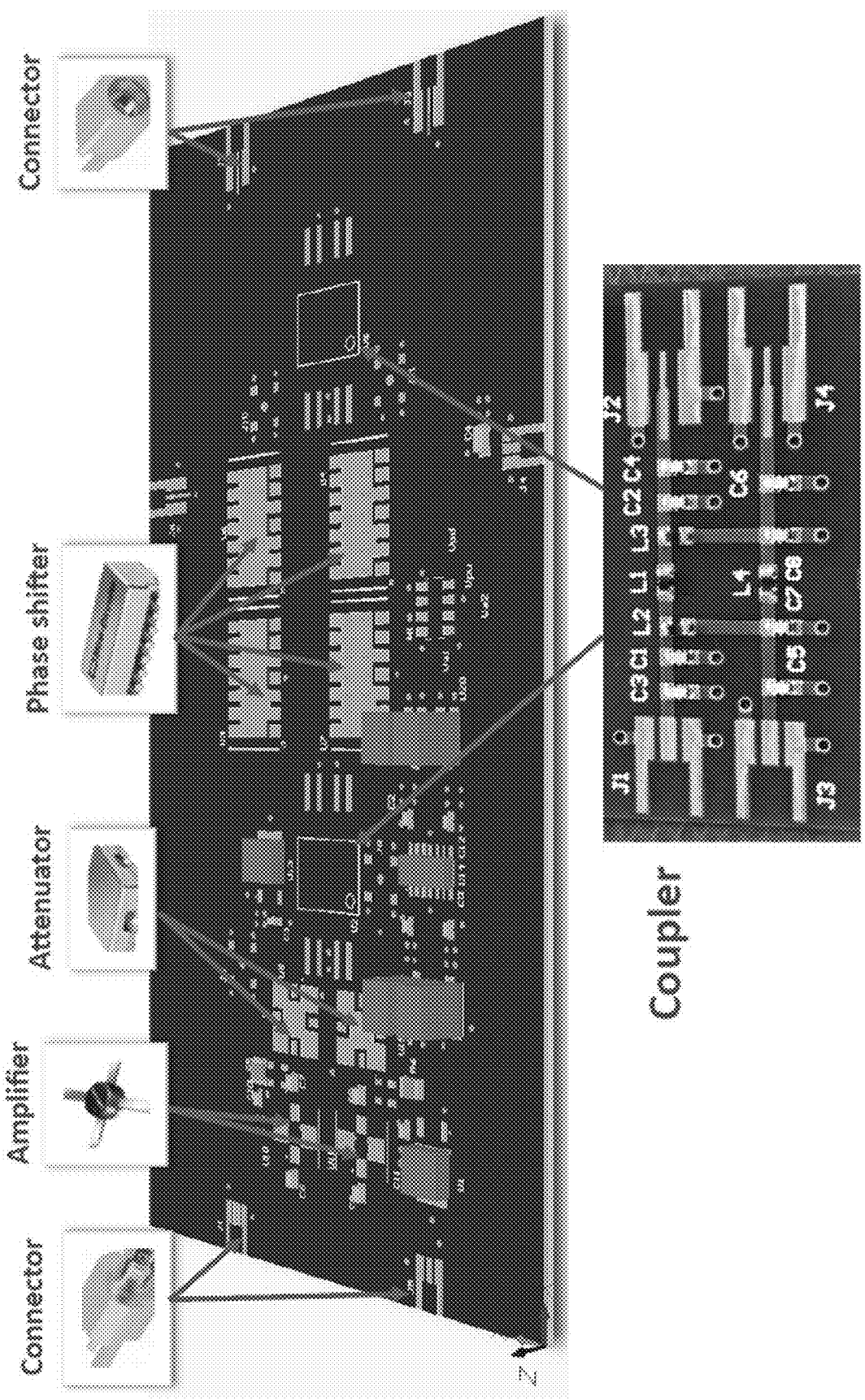
FIG. 17 shows an example of a single MZI using radio-frequency (RP) circuit elements.

FIG. 17 shows an example of a single MZI using radio-frequency (RF) circuit elements.

The process for determining the physical structures to implement a metastructure can be performed, e.g., as follows. A metastructure based on one or more MZI unit cells may be formed as follows. Given a kernel (K), its MZI mesh representation can be obtained. A singular value decomposition of K may be performed. The decomposition allows us to write the kernel as a product of three matrices (K=V Ddiag U*). U and V are unitary operators, and Ddiag is a diagonal matrix. Each unitary operator is trained separately with appropriate training vectors. The idea of this unitary transformation is that, if one illuminates from the left with the first training vector, all the power will come out of port one at the right. Similarly, illuminating with the second training vector will lead to all the power coming out of port two at the right, and so on. Mathematically, one can imagine that one shines the light back into the "output" ports, starting with the first row on the left. Progressively, one can calculate the device settings (e.g., theta and phi from the block B11 to the block B15 of the figure in slide 20) so that the field emerging from the "input" ports is the phase conjugate of the first training vector which is equal to the first column of U(V*). For all the subsequent rows, the nth training vector is different from the nth column of U(V*) because it passes through all the earlier rows of blocks. However, it is straightforward to calculate the nth training vector from the nth column of U(V*) as one calculates progressively through the rows. Finally, one can manually set the MZIs in the middle (e.g., the blocks sdm in slide 20) to implement the singular value amplitude.

The metastructure can be designed using an inverse design technique, an optimization process, and/or the like. An example of inverse design techniques is explained in A. Piggot, J. Luo. K. Lagoudakis, J. Petykiewicz, T. babinec, and J. Vuckovic, "Inverse design and demonstration of a compact and broadband on-chip wavelength demultiplexer," Nature Photonics, vol. 9, pp. 374-377 (2015). The structure may be discretized into pixels (2D) or voxels (3D) with some initial permittivity distribution. A system matrix is determined that describes the relationship between every point in space at one or several frequencies (e.g., Finite Difference Frequency Domain). Step 1. Rather than adding the input energy as a source vector, the fields on the various ports are treated as constraints that are added to the system matrix. Step 2. As such the system is now over defined. Solving the system via least-squares minimization will yield the "closest to physical" (CTP) electric and magnetic fields. Step 3. Taking the CTP fields and passing them through Ampere's law allows us to find a new permittivity field. This is repeated as necessary for column of the kernel. Step 4. The weighted average of the new permittivity fields may be combined. Other factors can be added at this step as well including techniques to encourage binary structures and limit curvature. A new permittivity field is then defined. Repeat Steps 2-4 repeat until the structure has sufficiently converged to have the properties of the kernel.

An example fabrication of an example device may be performed as follows. Fabrication may depend on the frequency of operation (e.g., GHz vs Optical) and the style of kernel (e.g., MZI vs metastructure). Metastructures configured for GHz operation may be fabricated as follows. GHz MZI metastructure: At GHz (and MHz) frequencies, the device can be realized using PCB boards and using either Mach-Zehnder Interferometers built from discrete components and connected using microstrip or stripline waveguides. This can be done either using module boards such that it can be expanded to larger matrices or using a single larger board of fixed size. GHz Inhomogeneous Metastructure: The metastructure can be CNC milled (alternatively, laser cut or waterjet cut) from a low loss dielectric (rexolite, eccostock, etc.) and sandwiched between two high conductivity plates (aluminum, copper). Such a structure can be interfaced with one or more waveguides. These waveguides can be rectangular, coax, stripline or microstrip. The structure can possess two sets of waveguides such that one set is the input and the other is the output, or possess one set such that the output signal is sent back down the only set. In the later configuration, feedback can be achieved by implementing partial reflectivity on this set of waveguides.

Metastructures configured for optical operation may be fabricated as follows. Optical Frequencies: At optical frequencies the feedback loops and couplers would be implemented using techniques familiar to the integrated photonics community. This comprise one or more of silicon or silicon-nitride waveguides. Optical MZI Metastructure: The kernel can be realized using the MZI approach. The MZI approach was developed because it only used components that are available at optical frequencies. Inhomogeneous Metastructure: The metastructure can be realized using EBeam or other appropriate high resolution lithographic process.

The metastructures may have different configurations of waveguides (e.g., feedback loops). The number of feedback loops may be equal to the number of samples chosen on the y axis (e.g., and y' axis). These points, however, are not necessarily at the same physical location on y-axis. The waveguides may all have equal length. The physical length of waveguides may differ but the electrical length of them may be exactly or substantially the same such that differ by an integer number of wavelengths. Alternatively or additionally, the difference in their lengths could be accounted for in the kernel design.

Meshes of MZIs can implement any arbitrary linear transforms between an optical input vector of complex amplitudes and a corresponding output vector by setting specific values for the phases of such MZIs. In the present disclosure such MZI meshes are used to implement integral operators onto which one can add a set of feedback waveguides to create an appropriate feedback mechanism that allows the wave to recirculate through the kernel. Upon reaching steady state, a device provides the solution to the integral equation in according to the implemented integral operator.

The present device can be used to solve a variety of equations. Specific examples of solving equations am given in FIGS. 18-20 and 12-14. In one implementation, the input of the integral equation (1) is implemented as inputs of couplers. The solution of the integral equation (g) is also extracted from coupler ports. The boundary conditions of the integral kernel may affect the implementation of the kernel. For instance, if the boundaries extend between −3 and 3, then the N points across the input are chosen in this range. In summary, the specific properties of the integral kernel play role in the implementation of the kernel and number of sampling points (e.g., the waveguides) that are chosen. The input of the integral equation (1) does not affect the implementation and design and is only applied as an external input to the system.

Solving an equation (e.g., or equivalently inverting a matrix) is now predominantly performed with electronic circuits (in computers). The clock rate of these systems may be in the GHz range which indicate the time for each calculation. (i.e., inverting a matrix) of order N requires at least N log N calculations (and often more than this). The present disclosure improves upon these conventional systems by using EM waves to perform such calculations. The use of EM waves to perform calculations can significantly decrease the calculation time. In general, problems in which the present state depends on the previous states (e.g., or one state depends on all other states) are formulated with integral equations. Almost all phenomena in various branches of science and engineering can be described by integral equations. For instance, the human population at any instant time or the distribution of the current on an antenna. Therefore, the disclosed ideas provide novel methods to solve integral equations using waves in metastructures with ultrafast speed, and are quite useful.

The follow information is provided to further explain the above disclosure. Metastructures hold the potential to bring a new twist to the field of spatial-domain optical analog computing: migrating from free-space and bulky systems into conceptually wavelength-sized elements. We introduce a metamaterial platform capable of solving integral equations using monochromatic electromagnetic fields. For an arbitrary wave as the input function to an equation associated with a prescribed integral operator, the solution of such an equation is generated as a complex-valued output electromagnetic field. Our approach is experimentally demonstrated at microwave frequencies through solving a generic integral equation and using a set of waveguides as the input and output to the designed metastructures. By exploiting subwavelength-scale light-matter interactions in a metamaterial platform, our wave-based, material-based analog computer may provide a route to achieve chip-scale, fast, and integrable computing elements.

Figure 18A:
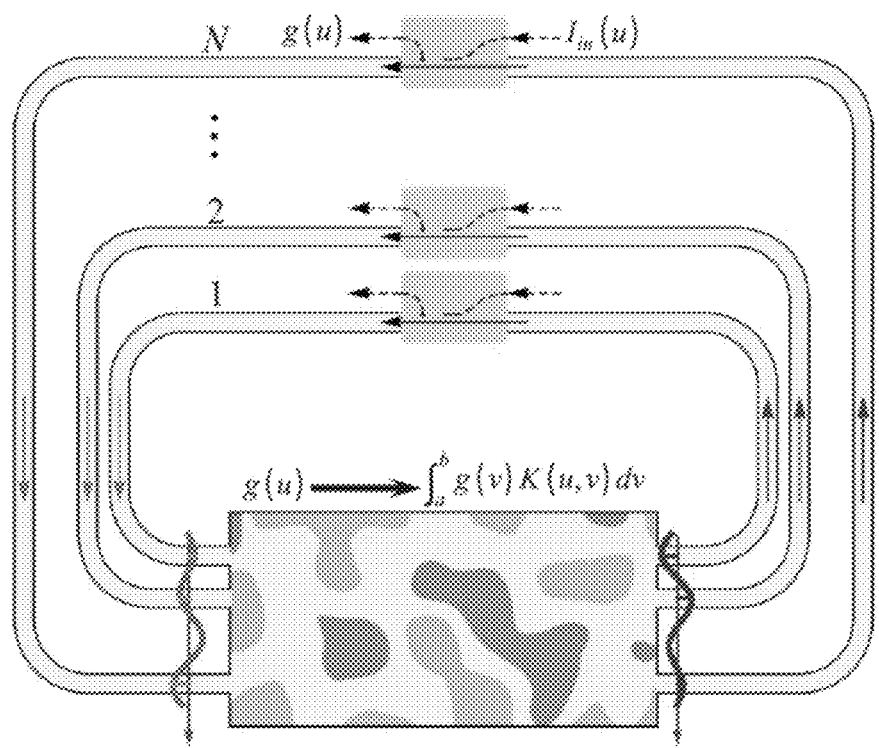
FIG. 18A shows a sketch of a closed-loop network.
Figure 18B:
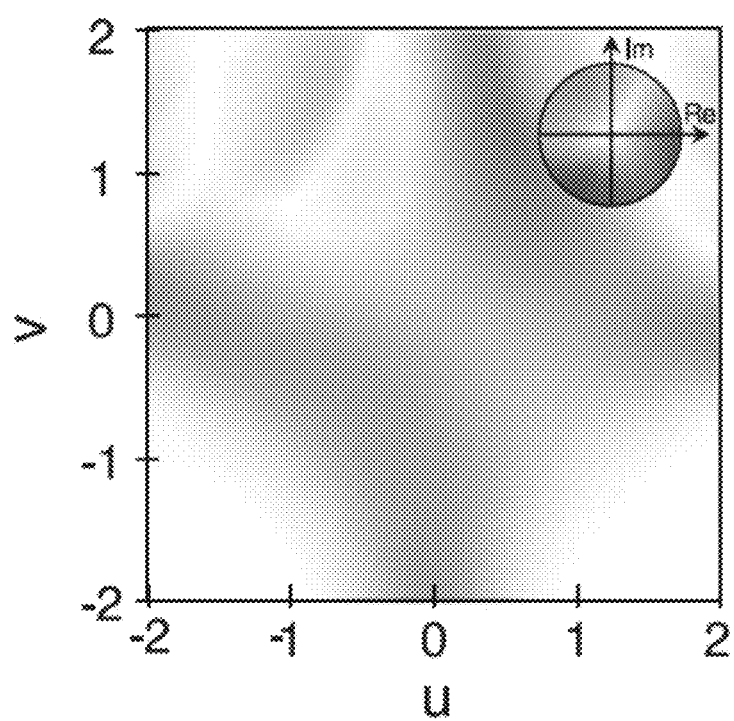
FIG. 18B shows a complex density plot representation of the first complex-valued kernel $K_1(u,v)$ in the (u,v) plane.
Figure 18C:
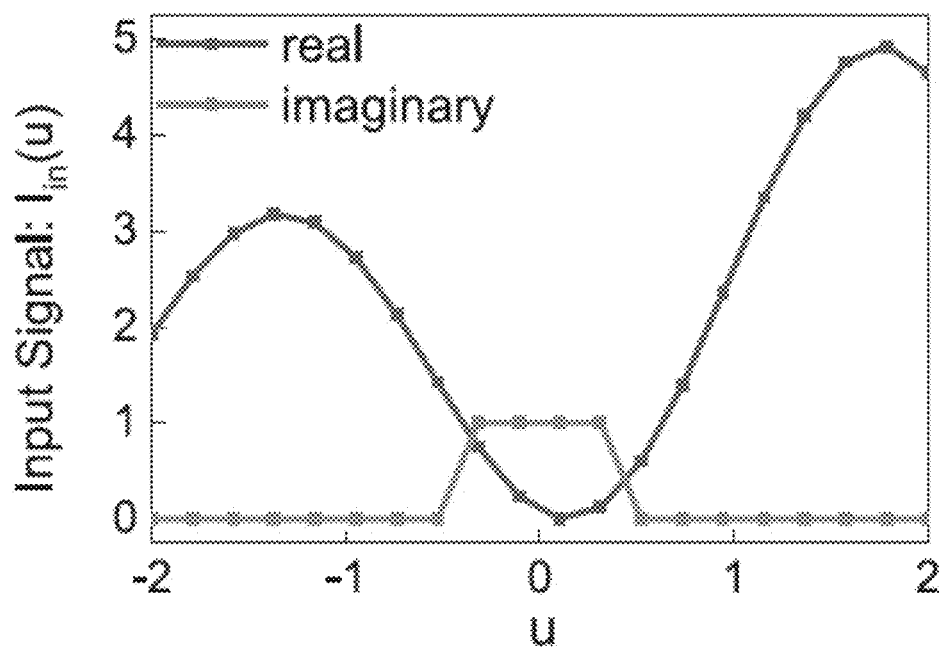
FIG. 18C shows an arbitrarily chosen complex-valued input signal.
Figure 18D:
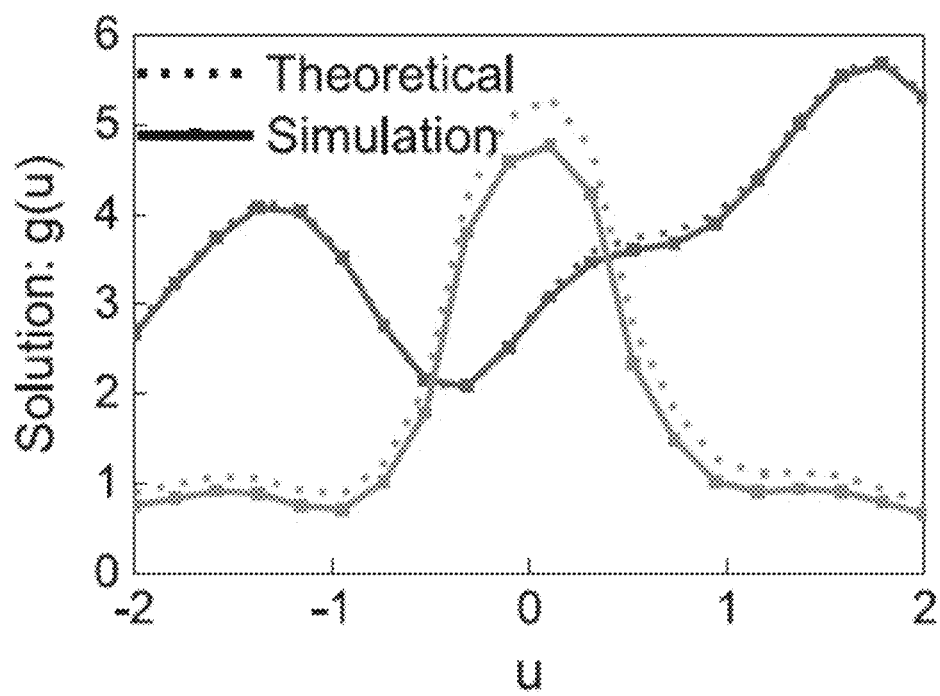
FIG. 18D shows simulation results extracted from the output of the coupling elements, by using schematic analysis based on the ideal scattering matrices of all the involved subsystems.

FIGS. 18A-D show solving integral equation with waves in metamaterials. FIG. 18A shows a sketch of a closed-loop network, comprising a suitably designed kernel operator (such as a metamaterial block that performs the desired integral operator on the arbitrary input wave), feedback mechanism to establish recursive wave propagation inside the network, and in/out coupling elements to excite and probe the waves. The N waveguides are used to create the feedback network, in this case an external feedback mechanism. Arrows indicate the direction of the wave flow across the structure. The scattering matrices of the blocks can be found in (36). Green and red curves indicate distribution of $g(u)$ and $\int_a^b g(v)K(u,v)dv$, sampled by using N waveguides. FIG. 18B shows a complex density plot representation of the first complex-valued kernel $K_1(u,v)$ in the (u,v) plane, as given in Eq. 2. The maximum amplitude of the complex value in the color circle inset is act to 0.5. FIG. 18C shows an arbitrarily chosen complex-valued input signal. FIG. 18D shows simulation results [real (blue) and imaginary (red) parts] extracted from the output of the coupling elements, by using schematic analysis based on the ideal scattering matrices of all the involved subsystems. Simulation results are compared with the expected theoretical results (dashed lines), showing a good agreement.

Figure 19A:
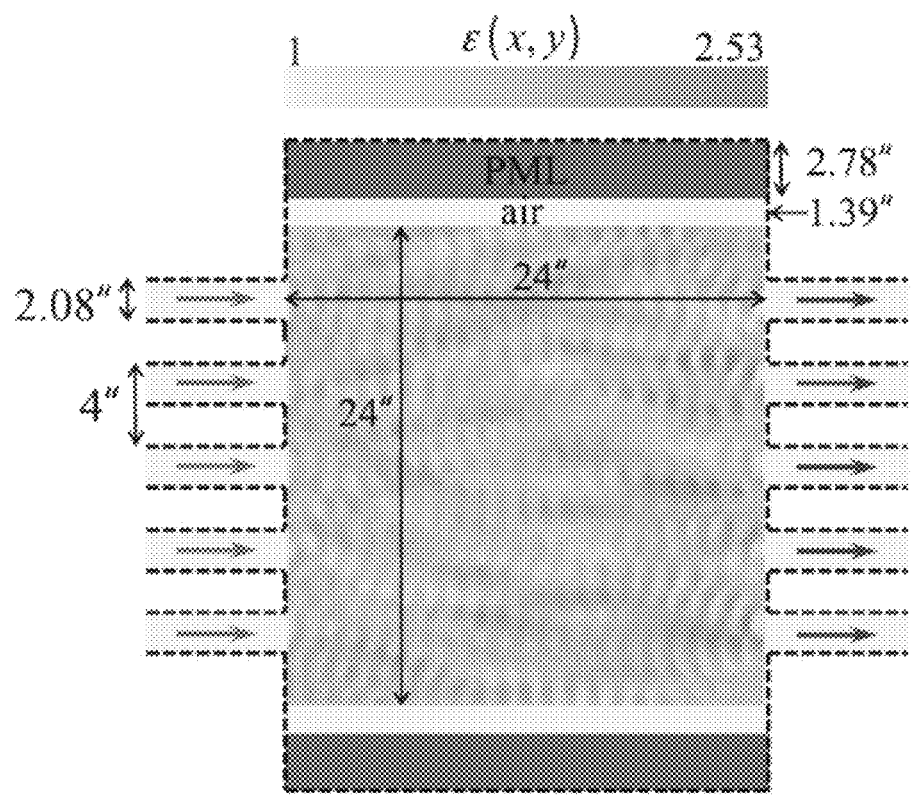
FIG. 19A shows an inhomogeneous metamaterial kernel.
Figure 19B:
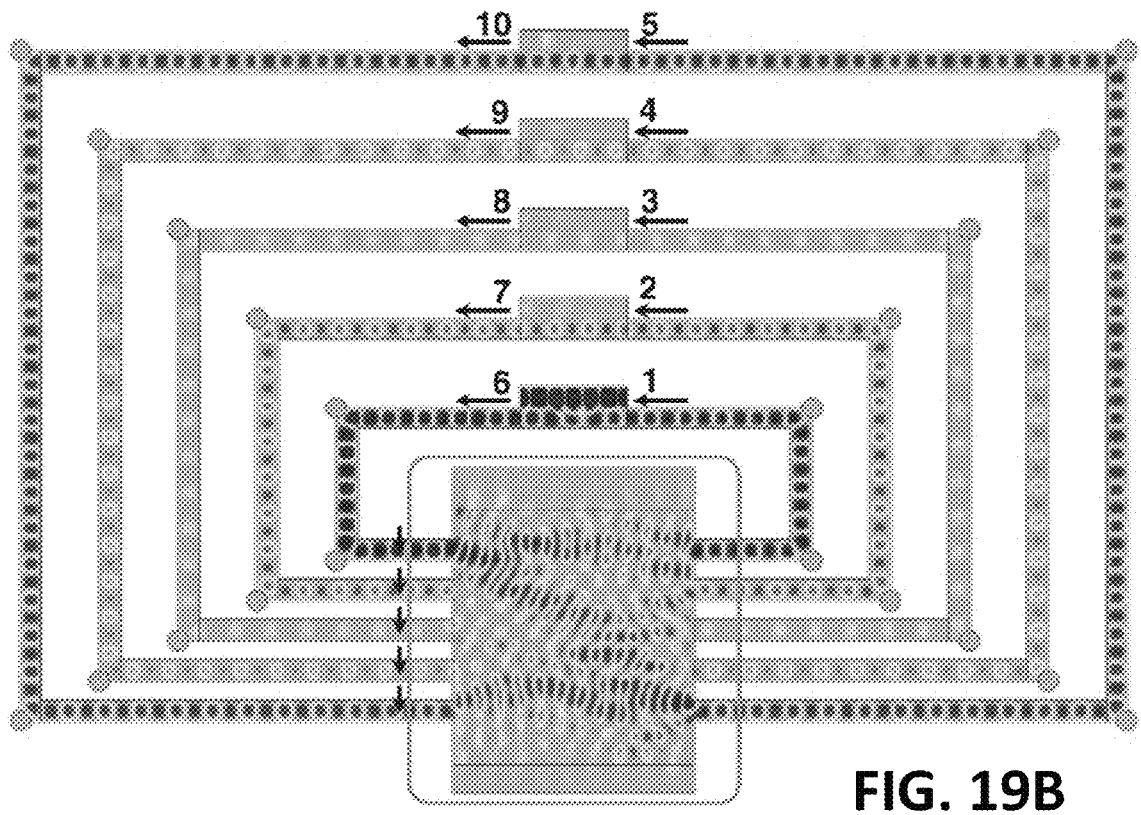
FIG. 19B shows a time snapshot of the simulation results for the out-of-plane component of the electric field in the closed-loop network, when excited at port 1, with the other four ports unexcited.
Figure 19C:
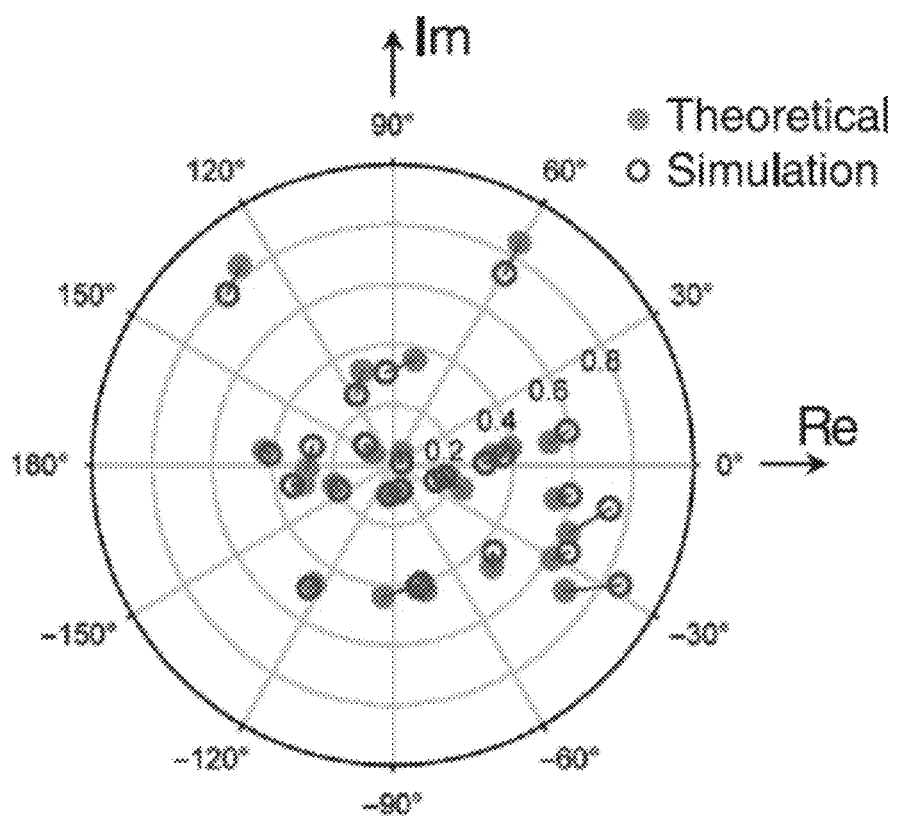
FIG. 19C shows a comparison between the simulated results and the exact theoretical values for the elements of the inverse matrix in the polar complex plane, showing a good agreement.

FIGS. 19A-C show calculating the inverse of a matrix with a material platform. FIG. 19A shows an inhomogeneous metamaterial kernel designed for the original matrix (I−A, where A is given in Eq. 3). Distribution of the relative permittivity ε(x,y) inside the two-dimensional region enclosed with absorbing layers [perfectly matched layer (PML)] on top and bottom with the thickness of one-wavelength at the initial design frequency, and perfect electric conducting walls on all other sides (dashed lines). Five equidistance waveguide ports are placed on each side of the block. Arrows indicate the direction of wave flow in the structure. A thin air layer is placed between the metamaterial and the absorbing layer to minimize local reflections. FIG. 19B shows a time snapshot of the simulation results for the out-of-plane component of the electric field in the closed-loop network, when excited at port 1, with the other four ports unexcited: $I_{in}=[I_{in,1} \cos(\omega t+\varphi_{in,1}),0,0,0,0]$. First column of the inverse matrix is built up at the position of vertical black arrows as the complex-valued amplitudes of the fields. The kernel in (A) is highlighted in the orange box. Input and output ports of the couplers are sequentially numbered from 1 to 5 and 6 to 10, respectively. FIG. 19C shows a comparison between the simulated results (blue circles) and the exact theoretical values (gray circles) for the elements of the inverse matrix in the polar complex plane, showing a good agreement.

Figure 20A:
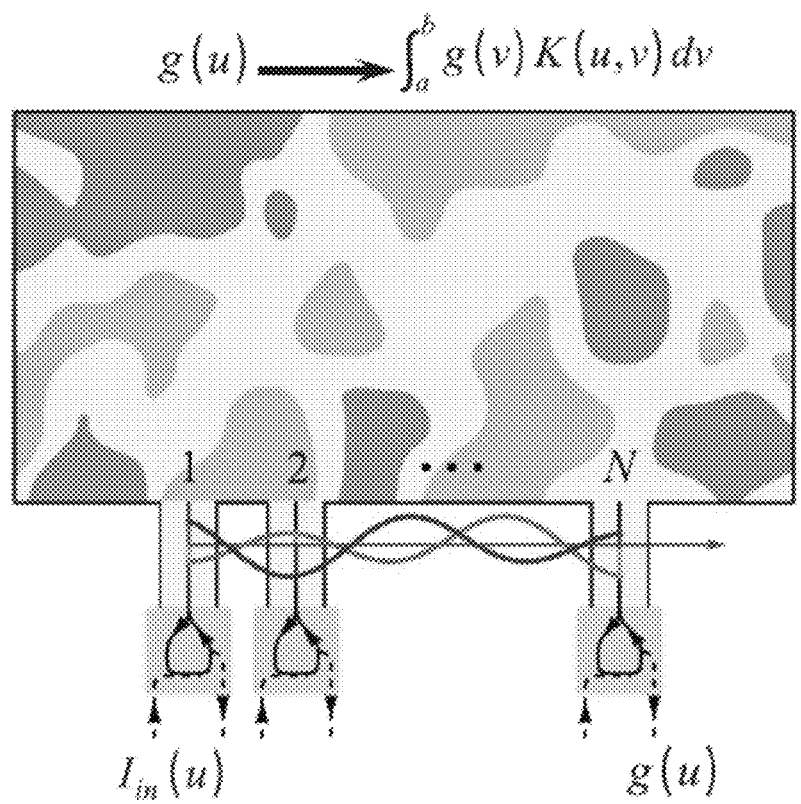
FIG. 20A shows a conceptual sketch of a closed-loop network in the reflective set-up.
Figure 20B:
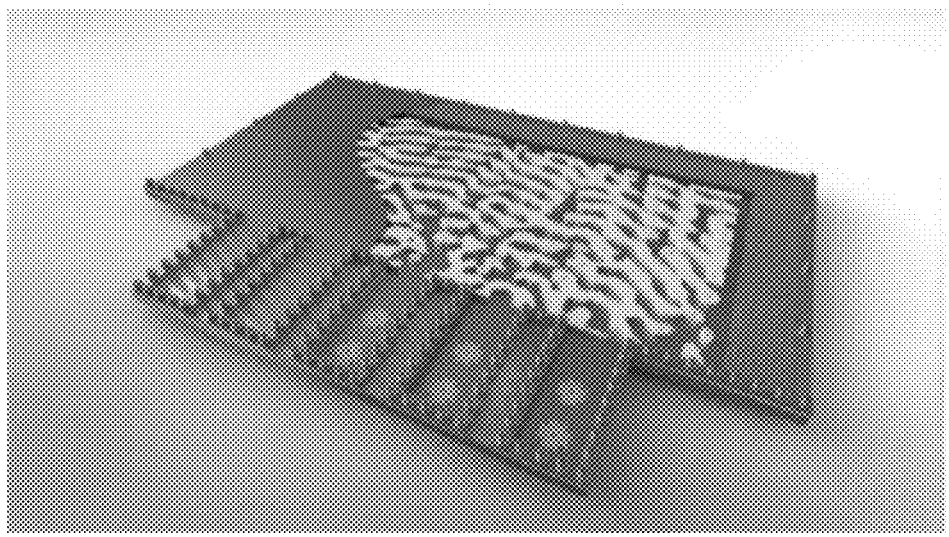
FIG. 20B shows a three-dimensional rendering of a constructed metamaterial structure.
Figure 20C:
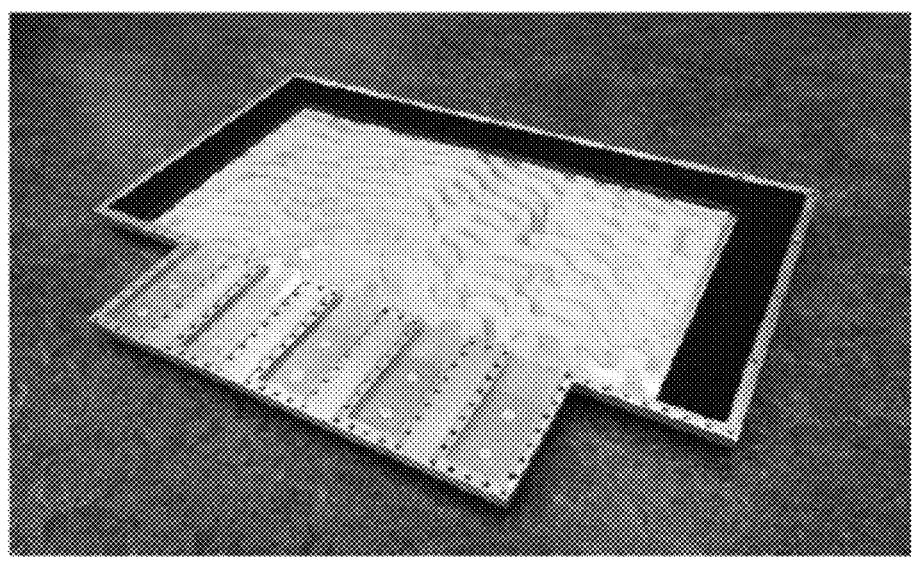
FIG. 20C shows a photograph of a constructed metamaterial structure.
Figure 20D:
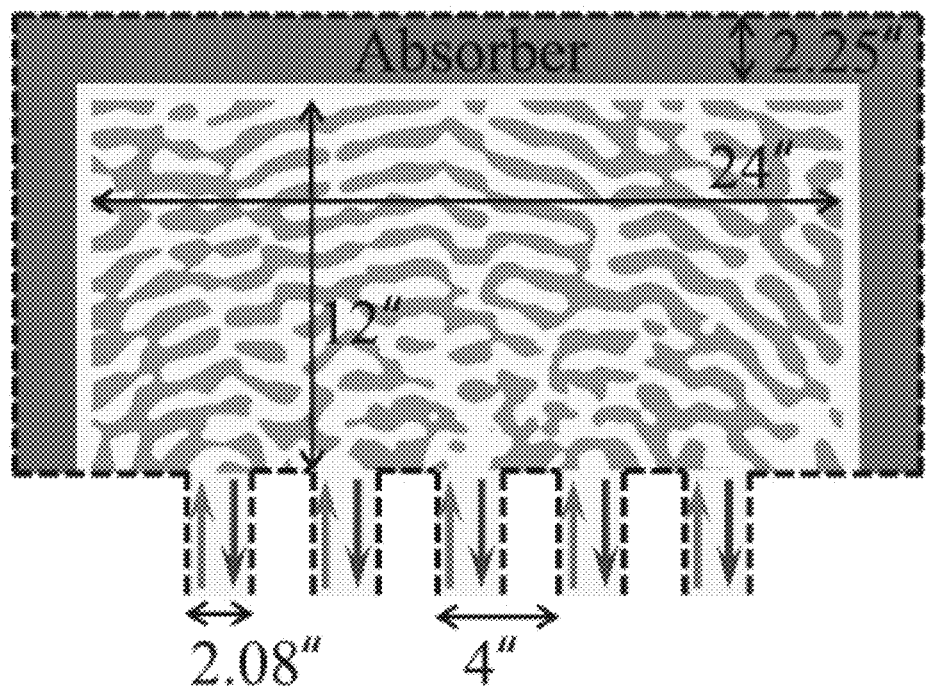
FIG. 20D shows an inhomogeneous distribution of the relative permittivity $\varepsilon(x,y)$ inside the metamaterial kernel representing the kernel $K_3(u,v)$.
Figure 20E:
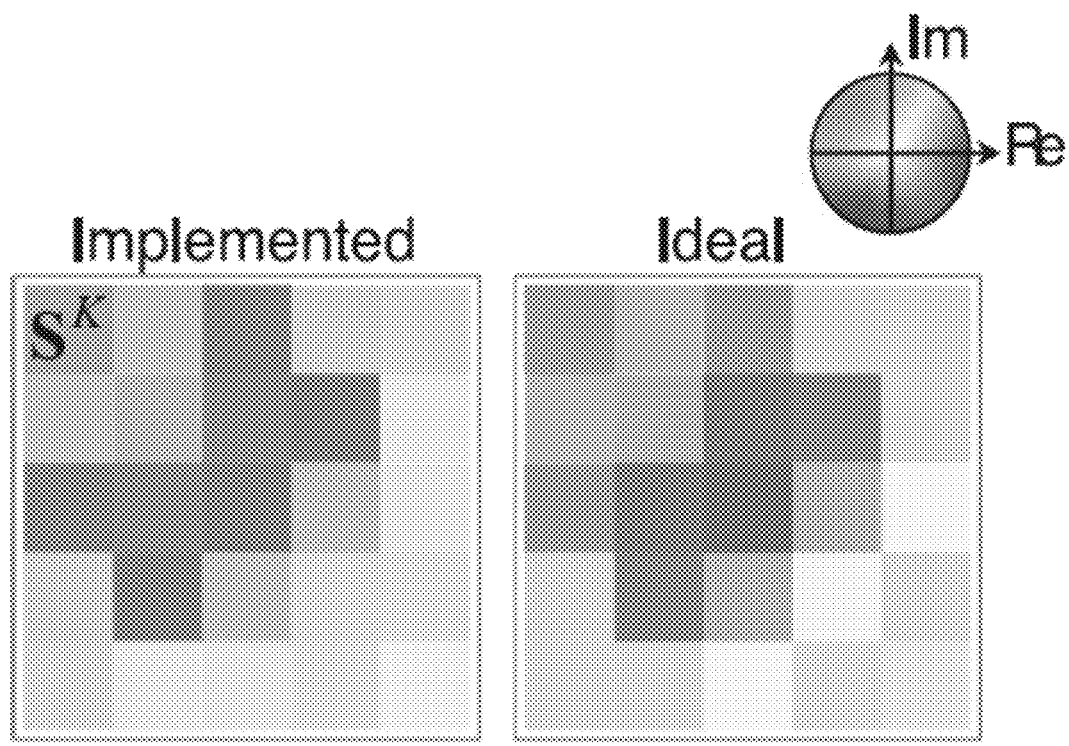
FIG. 20E shows a comparison between the implemented (left) and the desired (right) kernel operator $K_3(u,v)$ as the 5×5 scattering matrix $S^K$.
Figure 20F:
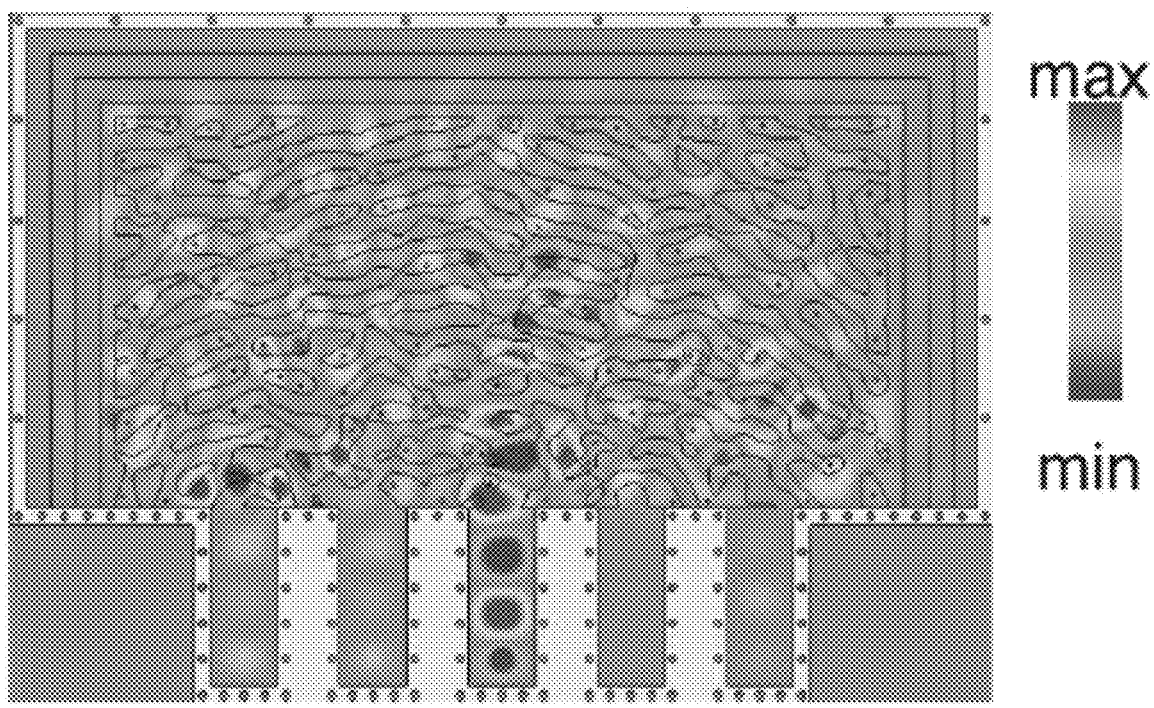
FIG. 20F shows a time snapshot of the simulated out-of-plane component of the electric field distribution inside the structure, when excited at port 3.
Figure 20G:
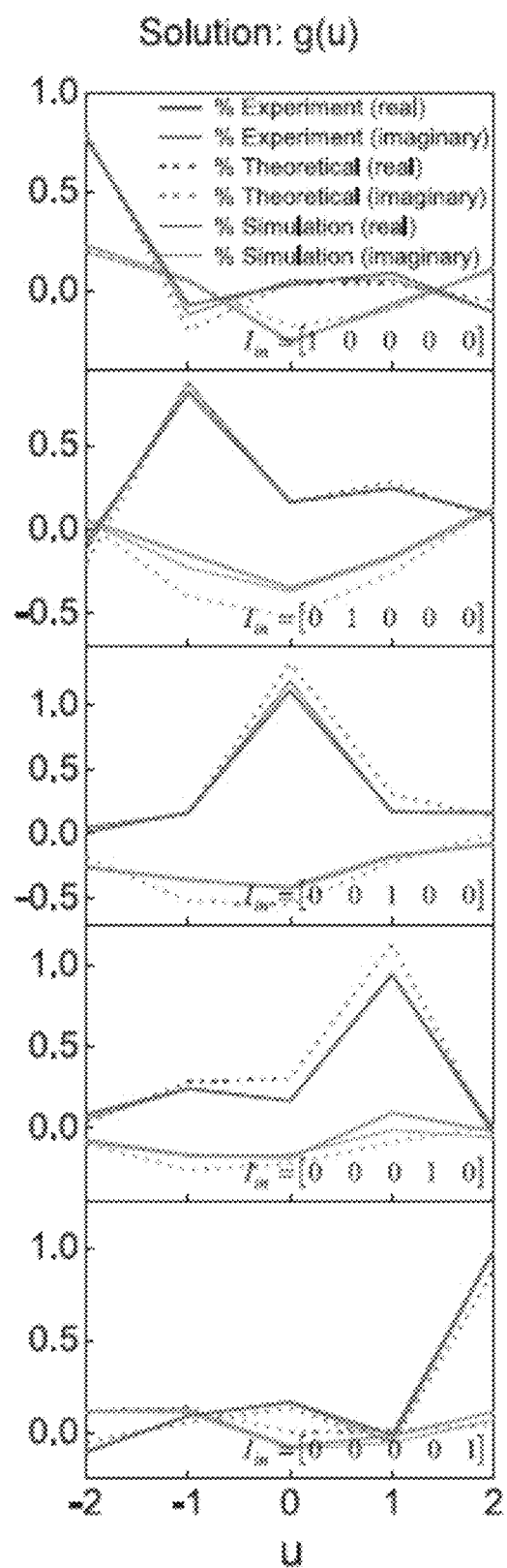
FIG. 20G shows experimentally measured, theoretical and simulation results of the output signals as the solutions to our integral equation with kernel $K_3(u,v)$.

FIGS. 20A-G show experimental demonstration of metamaterial platform that can solve integral equations. FIG. 20A shows a conceptual sketch of a closed-loop network in the reflective set-up, comprising the suitably designed metamaterial kernel and in/out coupling elements to excite and probe the waves. The N waveguides are used to connect the kernel and couplers, forming an internal feedback mechanism. The scattering matrices of the blocks can be found in (36). Green and red lines indicate distribution of g(u) (ingoing wave) and $\int_a^b g(v)K(u,v)dv$ (outgoing wave), sampled by using N waveguides. FIG. 20B shows a three-dimensional rendering of a constructed metamaterial structure. FIG. 20C shows a photograph of the constructed metamaterial structure. Polystyrene, air, and absorbing materials are shown in white, gray, and black, respectively. The outer conducting body is made of aluminum. FIG. 20D shows the inhomogeneous distribution of the relative permittivity ε(x,y) inside the metamaterial kernel representing the kernel $K_3(u,v)$. A two-dimensional system is effectively implemented by operating the rectangular waveguides at the fundamental $TE_{10}$ mode and sandwiching the structure between two conducting plates (top and bottom of the structure) separated by 6 mm. The structure is closed from all sides with conducting aluminum walls, except for the coaxial ports in the waveguide stubs (coupling elements). FIG. 20E shows a comparison between the implemented (left) and the desired (right) kernel operator $K_3(u,v)$ as the 5×5 scattering matrix $S^K$. The maximum amplitude of the complex value in the color circle inset is set to 0.5. FIG. 20F shows a time snapshot of the simulated out-of-plane component of the electric field distribution inside the structure, when excited at port 3. FIG. 20G shows experimentally measured output signals [real (blue) and imaginary (red)] as the solutions to our integral equation with kernel $K_3(u,v)$, for applied input signals at each of the five ports (one by one). (Insets) The input for each case. Measurements are compared with the expected theoretical results (dashed lines) and full-wave simulations (thin lines), showing a good agreement.

Equations are the ubiquitous means to express the fundamental characteristics of a system, and solving them is to unravel and predict the behavior of the system. Mot scientific and technological phenomena are described through systems of differential and/or integral equations (1,2), and today, numerous analytical and numerical methods are available to compute and obtain solutions of a given equation (3-5). Computers are among the most popular tools used to simulate, model, and numerically solve systems of equations. However, as computer technology reaches its physical limitations (6), there is an ongoing quest to discover other platforms and disruptive approaches that may afford improved performances, particularly for specialized tasks such as object classification and edge detection (7-9).

Optical analog computing has recently gained renewed attention as an alternative paradigm to contribute to computing technology. Temporal data processors enable high-speed pulse manipulation (10-15), which is relevant for solving differential equations in real time (16, 17). Ultrafast optical systems provide a surprisingly rich platform to model and probe the dynamics of stochastic and complex nonlinear systems (18, 19). Progress in programmable microwave/photonic processors provides the opportunity to implement arbitrary linear transformations and operators, such as spatial differentiators (20-22). Moreover, analog computing in the spatial domain offers computational parallelism, enabling huge amounts of data to be processed simultaneously (23). Recent developments in this field point to the benefits of structured materials—metamaterials (24)—to achieve basic mathematical operations such as spatial differentiation and integration over wavelength-comparable dimensions (25-27). The spatial properties of the artificial medium or surface are suitably engineered to enable computation occurring upon interaction over substantially smaller volumes as compared with conventional Fourier-based devices (23). In extreme scenarios, the simplest configuration, such as a Bragg reflector or metal-dielectric interface, has also been shown to hold some limited form of computational capabilities (9, 28).

We introduce a platform for analog computing in which specially designed megastructures can solve linear integral equations with waves. Information is carried as complex-valued electromagnetic fields, and the solution is attained in the steady state through propagation in a recursive path inside the designed medium. Historically, analog mechanical devices suited to solve differential equations were presented mom than a century ago (29, 30). More recently, coherent optical feedback systems (31-33) and fiber-optic networks (34) have emerged as optical computing machines capable of solving integral and differential equations and performing matrix inversion. These proposals, however, face challenges in terms of large size and incompatibility with integrated devices, as well as maintaining phase information over large fiber-optic networks. As will be shown below, our platform does not face these challenges.

A conceptual representation of our idea for solving integral equations with wave propagation in megastructures is shown in FIG. 18A. An integral equation is characteristically an inverse problem, and a feedback mechanism—internal or external—can be used to generate the solution to such an equation in the form of a Neumann series (35). Let us assume that the operator, implemented as a metamaterial block in FIG. 18A, is designed to transfer any arbitrary monochromatic wave g(u) based on a given integral operator with kernel K(u,v). By routing the output of the operator back to the input side, the system can be forced to obey the source-free equation $g(u)=\int_a^b K(u,v)g(v)dv$. An input signal $I_{in}(u)$ is then introduced into the integral equation (in the format of the Fredholm integral equation of the second kind) by exploiting a set of coupling elements along the feedback waveguides (FIG. 18A). In general, various types of linear and nonlinear integral equations are used across different scientific fields. The Fredholm integral equation of the second kind represents a general case of linear integral equations used in several fields of science and technology, such as in antenna theory (magnetic field integral equation) and in the perturbation theory in quantum mechanics. With this class of examples, we want to provide a roadmap for how to build an equation-solver possibly for other types of integral equations, through properly modifying this approach. For example, one may explore how the solution to a nonlinear Fredholm integral equation of the second kind may be obtained by judiciously introducing nonlinearity in the metamaterial platforms.

The general relation governing the system at the steady state then follows $$g(u)=I_{in}(u)+\int_a^b K(u,v)g(v)dv \tag{1}$$

where g(u) is the (unknown) solution of this integral equation for the arbitrary input function $I_{in}(u)$ and the known operator K(u,v). K(u,v) can be nonseperable and complex valued and is in general translationally variant; it can not be expressed in the form of K(u−v).

Using the metamaterial kernel, the system is visualized in FIG. 18A in a planar, discretized configuration. We used N feedback waveguides that sample the input of the operator g(u) and its output $\int_a^b K(u,v)g(v)dv$ at N points across the [a, b] interval (36). In this form, the system implements the equivalent N×N matrix equation of the integral equation in Eq. 1. This approach provides four immediate advantages: First, this platform is suitable for direct integration into an optical processor by using currently available silicon photonics technology. Second, the overall footprint of the structure is in the order of few wavelengths, which is orders of magnitude smaller than the conventional optical signal processing schemes based on Fourier transform (23, 31-33). Third, the feedback mechanism and the excitation are fully controlled; both the phase and amplitude of the monochromatic signals are accessible and controllable, circumventing the limitations associated with fiber-based configurations (34) and/or free-space phase retrieval. In general, it is not easy to preserve the phase information of the signal along a fiber-based or free-space setup because the overall size of the system is much larger than an integrated setup. Fourth, because the device entirely operates in the spatial domain, more general translationally variant kernels am straightforwardly accessible and implementable, a feature that is not fully present in Fourier-based designs.

We now discuss three examples of equation solving by use of our proposed platform: (i) numerical block diagram analysis of a general integral equation, (ii) design and simulation of a physical structure to calculate inverse of a N×N matrix, and (iii) design and experimental validation of a metamaterial structure that can solve integral equations. Without loss of generality, we focused on one-dimensional linear integral equations (as in Eq. 1). The $e^{j\omega t}$ time dependence is assumed throughout.

Our first example is based on the ideal block diagram configuration depicted in FIG. 18A. The entire system comprises (e.g., or consists of) three distinct subsystems: (i) the prescribed kernel, (ii) feedback waveguides, and (iii) coupling elements. Subsystems can be designed and assembled depending on the frequency of operation and the technological platform of choice (as seen in examples two and three). To decouple the limitations associated with the specific physical implementation of the device from those related to the system-level design, for the first example we considered ideal blocks described with known scattering matrices (37). We chose a general kernel, Eq. 2, that is asymmetric, nonseparable, translationally variant, and complex-valued (FIG. 11B)

$$K_1(u,v)=0.25i\cos(u)\exp[-2iuv-0.5(v-1)^2]+0.25\exp(-u^2v^2) \quad (2)$$

over [a, b]=[−2,2]. Elements of this kernel's scattering matrix. $S^K$, are calculated based on the distribution of the kernel $K_1(u,v)$ over the chosen spatial domain (36). Our implementation also entails reciprocity; the scattering matrix associated with any chosen kernel corresponds to a reciprocal system that facilitates the physical implementation of the solver. The integral equation in Eq. 1 may originate from a physical problem itself (for example, a thermodynamic, biological, or mechanical problem) or may be a purely mathematical one. Our representation of the equation in a material platform (with the complex amplitude of the electromagnetic waves corresponding to the mathematical quantities described by Eq. 1) treats u and v as dimensionless variables, independent from the original concept. Discussions on the characteristics of the scattering matrix, including reciprocity and passivity, can be found in (36).

Once the scattering matrices are known, for any arbitrary input signal we used numerical, system-level simulations (38) to calculate the solution of the integral equation associated with the kernel shown in Eq. 2—fields generated on the waveguides at the points that the wave enters the kernel (FIG. 18A). The solution was then extracted by using ideal directional couplers embedded along the feedback loops, each with a coupling coefficient of 10%. Ideally, probing couplers are expected to impose minimal perturbation to the flow of the wave inside the loop, and the coupling coefficient is desired to be as small as possible. We confirmed, however, that the process is stable, and the solution is highly resilient to such probing leakages (36). Shown in FIG. 18C is an arbitrary input function, which is proportional to the distribution of the complex valued fields applied to the couplers' input ports. In this example, N=20 waveguides are used to sample the waves across the u∈[−2,2] range. The extracted output signal is shown in FIG. 18D (real and imaginary parts; solid lines), corresponding to g(u) in Eq. 1. The solution faithfully follows the same trajectory as the expected exact solution of the corresponding N linear equations, calculated with conventional numerical tools (39) (FIG. 18D, dashed lines). The input signal, which represents the input function of the Fredholm integral equation with the kernel given in Eq. 2, was arbitrarily chosen for illustration of the ability of our system to generate the solution at the steady state. In general, and to assess the performance of the solver, the structure may be excited at all N ports (one by one), as seen in the following two examples.

To demonstrate the performance of this technique in a physical system, for the second example we considered realization of matrix inversion with a designed metastructure. In general, calculating the inverse of a known, nondegenerate, N×N matrix is equivalent to simultaneously solving N linear equations. The process, therefore, is also implementable with our platform because it solves the equivalent system of equations associated with the given linear integral equation in Eq. 1. While it is an interesting mathematical problem by itself, efficient calculation of the inverse of matrices is also of great importance for many applications across physics, mathematics, and computer science. In general, our system can handle any linear problem if the eigenvalues of the scattering matrix associated with the kernel are smaller than unity (40). This condition ensures the convergence of the fields across the system at the steady state (32, 40) and may be straightforwardly satisfied by normalizing the kernel with an appropriate scaling factor related to its eigenvalues [a detailed discussion is provided in (36)]. We considered an arbitrary 5×5 asymmetric matrix with complex-valued elements $$A = \begin{pmatrix} 1.4+0.25i & 0.25-0.35i & -0.35+0.15i & -0.3+0.15i & -0.5+0.15i \\ 0 & 0.6 & -0.2+0.1i & -0.65+0.2i & 0.35-0.3i \\ 0.3-0.15i & 0.30+0.55i & 1.25+.2i & -0.35-0.25i & 0.3i \\ 0.2+0.5i & 0.2-0.2i & 0.25+0.4i & 1.2-0.1i & 0.45-0.2i \\ -0.5+0.2i & -0.15-0.2i & 0.55+0.25i & -0.3 & 0.65+0.1i \end{pmatrix} \qquad (3)$$

In order to compute the inverse of matrix A, $A^{-1}$, the equation system $A \cdot X = I_{in}$ is to be solved for an arbitrary input vector $I_{in}$. Following Eq. 1, the relevant kernel operator is thus associated with the transfer matrix (I–A), in which I is the identity matrix of order N=5. We considered a realistic and physically accessible material design to numerically implement this system. Subsystems in FIG. 1A are each separately designed to operate at microwave frequency with $\lambda_0 \approx 7$ cm (36). We considered conventional rectangular waveguides to carry information to and across the system (via complex amplitude of the out-of-plane component of the electric field in the fundamental $TE_{10}$ mode of the waveguide). The electrical lengths of all waveguides connecting the kernel to couplers are multiples of the $TE_{10}$ guide wavelength, ensuring zero phase difference between the two ends of each waveguide. We adapted an Inverse design optimization algorithm (41) to design an inhomogeneous permittivity distribution inside a predefined, compact region to yield the transfer properties of the kernel (36). We used the objective-first optimization technique, which has proven advantageous for the design of compact photonic structures such as demultiplexers and couplers (41). In this technique, the transfer function of the kernel is maintained as a constraint, and with each iteration, the relative permittivity becomes successively closer to that which achieves our goal. The results of this process are shown in FIG. 19A, where the metamaterial kernel is designed for the transfer matrix (I–A). The dimensions of the kernel were chosen to be large enough for there to be sufficient degrees of freedom in the optimization process yet still on the order of multiple wavelengths to develop the design in a reasonable amount of time. These dimensions are not unique and may be chosen differently. Mathematically, it is shown to be possible to achieve any arbitrary linear kernel by using a set of input and output waveguides (42); thus, the optimization is expected to converge for general kernels. The physical specifications of the structure are not directly related to the equation parameters u and v, which merely determine the sampling points in the integral equation. For example, the physical positions of the waveguides connecting to the kernel (as in FIG. 19A) can be arbitrarily chosen, even though they represent specific values of u.

Illustrated in FIG. 19B are our numerical simulation results for the distribution of the out-of-plane component of the electric field (snapshot in time) in the assembled system, which includes our designed metastructure and the five feedback waveguides and directional couplers. The structure is excited at the first waveguide (through the corresponding coupler) with a monochromatic signal with electric field of amplitude $I_{in,1}$ and phase $\varphi_{in,1}$, whereas the other four input couplers are not excited. This represents an analog input signal of $[I_{in,1} \cos(\omega t + \varphi_{in,1}), 0, 0, 0, 0]$ at ports 1 through 5 marked on FIG. 19B. The complex values of the field distribution constructed on the waveguides (at the position of small vertical arrows in FIG. 19B) represents the first column of $A^{-1}$ (extracted via ports 6 through 10 of the couplers shown in FIG. 19B). The process may be repeated with excitation on all five ports one by one to obtain all the columns of this inverse matrix. We compared our simulation results with those obtained through a conventional numerical tool (39), as shown in FIG. 19C, which reveals good agreement. Details on the design of couplers, obtaining the solution, and calculating errors can be found in (36).

In the second example, with the operation on the complex-valued field (rather than intensity), we successfully obtained the inverse of the arbitrary complex-valued matrix. The computation time after the implementation of the setup (designing metamaterial kernel and assembling the feedback structure) is linearly dependent on the size of the matrix because we needed to excite the structure on each of the N waveguides to calculate one column of the inverse matrix. The specific metamaterial platform exploited here—inhomogeneous distribution of permittivity $\varepsilon(x,y)$—is not the only possible approach to physically realize the kernel (FIG. 19A). Alternatively, we could use techniques such as self-configuring and programmable optical networks (20-22, 42) and power-flow engineering (43) for the implementation of the same subsystem. Each form of implementation of kernel provides advantages that may suit different applications. Our designs here are fixed (for a specific kernel, but for arbitrary inputs) yet provide a small footprint. Alternatively, reconfigurable networks can provide similar functionalities, yet over larger footprints (20-22, 42). Self-configuring systems can be also used to find the singular value decomposition of a physical system (kernel in our approach), which may be used to calculate the inverse of the transfer function of the physical system (44). By embedding the feedback mechanism inside the system, we directly generated the inverse matrix.

In the third example, we validated the performance of our equation-solving metastructures by designing, numerically simulating, and experimentally demonstrating a proof-of-concept structure at microwave frequencies. Although the design approach is applicable to any wavelength, we chose microwaves to facilitate the fabrication and measurement processes. The kernel of choice is $$0.06 \left\{ K_3(u,v) = (4-4i)J_0(uv) + 3\exp\left[i\frac{2\pi}{5}(u+v)\right] - (1-2i) \right\} \qquad (4)$$

defined over [a, b]=[−2, 2]. We provide two distinct arrangements of the feedback system to solve the integral equation associated with $K_3(u,v)$. In general, in our technique the solution of the integral equation is attained through creation of the proper recursive path for the propagation of the electromagnetic waves. The structure in FIG. 18A illustrates the suitable setup to realize an external feedback mechanism. Alternatively, feedback process can be executed internally and in a reflective setup, as conceptually shown in FIG. 20A. In this configuration, the metastructure is designed—by using the inverse design optimization technique (41)—to modify the reflected wave based on the kernel operator. A set of N coupling elements (one in each waveguide) was then used to apply the input signal and probe the response of the system in the steady state. This configuration provides an alternative arrangement to physically implement Eq. 1, and the solution of the integral equation is accessible through the coupling elements (36).

The advantage of the reflective configuration is threefold: First, in comparison with the transmissive configuration with external feedback lines, the kernel's footprint is approximately shrinkable by half. Second, the feedback paths are equilength in a planar structure, yielding a better control of their effective electrical size, which is particularly useful for the experimental validation. Third, there are no possibilities for scattering and propagation in the reverse direction, and every available mode in the system is directly used. In general, however, the reflective configuration requires a symmetric kernel so that K(u,v)=K(u,v), or equivalently, $S^K=(S^K)^{tr}$. This restriction may be deduced from the reciprocity that exists in conventional linear structures. In the case of asymmetric kernel operators, the reflective configuration may require nonreciprocal physical implementation (which is in general a disadvantage), and therefore, the transmissive configuration with external feedbacks (as in FIG. 18A) would instead be more preferred for asymmetric kernels.

For our third example, and to explore the reflective arrangement, we intentionally chose a symmetric kernel (yet otherwise a general one), Eq. 4. Additionally, the same kernel was also numerically studied by using the transmissive configuration with an external feedback setup, the results for which are reported and compared with this experiment in (36).

A schematic rendering and photographs of the fabricated structure are shown in FIG. 20B and FIG. 20C. Here, and for our experiment, the inverse design optimization algorithm constraints are properly modified to achieve a binarized metastructure; only two materials are present inside the structure: air and low-loss polystyrene, indicated with light and dark orange, respectively, in FIG. 20D. Five sampling points are used across the u∈[−2,2] range in our kernel designed based on Eq. 4, each represented by the monochromatic wave propagating in a metallic waveguide operating at the fundamental $TE_{10}$ mode at $\lambda_0$=6.85 cm, $f_0$=4.38 GHz.

The input of the kernel, g(u), which is the unknown solution of the integral equation, is defined as the complex amplitudes of the waves incident on the five waveguides (FIG. 3D, green arrows) and the output of the integral operator, $\int_a^b K(u,v)g(v)dv$, is defined as the complex amplitudes of waves reflecting from the kernel (FIG. 20D, red arrows). The frequency of operation of the physical system, size of the metamaterial kernel, and the materials used (the polystyrene) are not special choices dictated by the characteristics of the equation; u and v are dimensionless. In other words, our choices merely facilitated the design and experimental procedure, and the same equation can be implemented and solved at, for example, optical or teraherz frequencies. Each of the five waveguides were terminated with a shorted waveguide stub so that the waves emanating from the kernel were fed back into the kernel with identical phase (they have "zero" electrical length), serving the same role as the feedback loops in the two previous examples. Two coaxial probes were placed on each stub, one to introduce the input signal $I_{in}$ and the other to sample the solution g(u). In total, 90% of the power entering the coupling elements cycles back into the kernel.

To characterize the performance of the system, first, the scattering properties of the implemented kernel (before mounting it into the feedback loop) were estimated through full-wave simulation and compared with the desired distribution (FIG. 20E). Next, the entire system was assembled and excited with input signals on all five input ports, one by one (simulation results for excitation at port 3 are shown in FIG. 20F). The input signal may, in general, be an arbitrary complex distribution of monochromatic waves at the five input ports. To fully characterize the system, we used five orthogonal input signals (each case includes exciting one of the five input ports and leaving the other four ports unexcited). Any arbitrary input signal may be attained through linear combination of these "orthogonal" bases. The measured complex-valued fields on the coaxial probes (which are directly proportional to the solution of the equations) were then used to extract the solution (FIG. 20G). Although small variations compared with the ideal theoretical results were observed (FIG. 20G, dashed lines), we attained excellent agreement between theoretical and experimental results. The experimental results are almost indistinguishable from the full-wave simulations, indicating the possibility of removing such small differences through de-embedding the effect of couplers (36). These slight differences are attributed to (i) probing the reflected fields with coupling elements; (ii) variations in the length of connecting waveguides, resulting in nonzero electrical length; (iii) unintended differences in the coupling coefficients; and (iv) minor differences between the implemented and desired kernel, highlighted in FIG. 20E. A detailed discussion on the effect of noise due to variations in different subsystems and the tolerance of the solution is presented in (36).

The structure was numerically simulated by using commercially available CST Studio Suite full-wave simulation software (38). The out-of-plane component of the electric field (snapshot in time) for the given input signal $I_{in}$=[0,0, $I_{in,3}$ cos($\omega t+\varphi_{in,3}$),0,0] is shown in FIG. 20F. The solution was the portion of the wave propagating toward the kernel from the coaxial ports (FIG. 20D, green arrows), extracted via coupling elements [more results can be found in (36)].

Our inverse-designed metamaterial platform provides a powerful tool and methodology for solving the general Fredholm integral equation of the second kind in an analog manner and at the hardware level. Similar configurations may potentially be explored to estimate eigenvalues of an integral operator (a matrix in the discretized form) by adding a controllable amplifier/attenuator and phase-shifter in the feedback path. Adding nonlinearity may also provide another degree of freedom to tackle nonlinear equations. The designs we explored are orders of magnitude smaller than Fourier-based systems, with potentially very low energy consumption. Our numerical analysis (36) indicates that the steady-state response may be achievable in less than 300 cycles of the monochromatic wave used, predicting nanosecond and picosecond estimated times for obtaining the solutions at microwave and optical frequencies, respectively. Implementing the technique on a silicon photonic platforms may lead to chip-scale, ultrafast, integrable, and reconfigurable analog computing elements.

The followings paragraph provide supplemental information for the above description.

Figure 21:
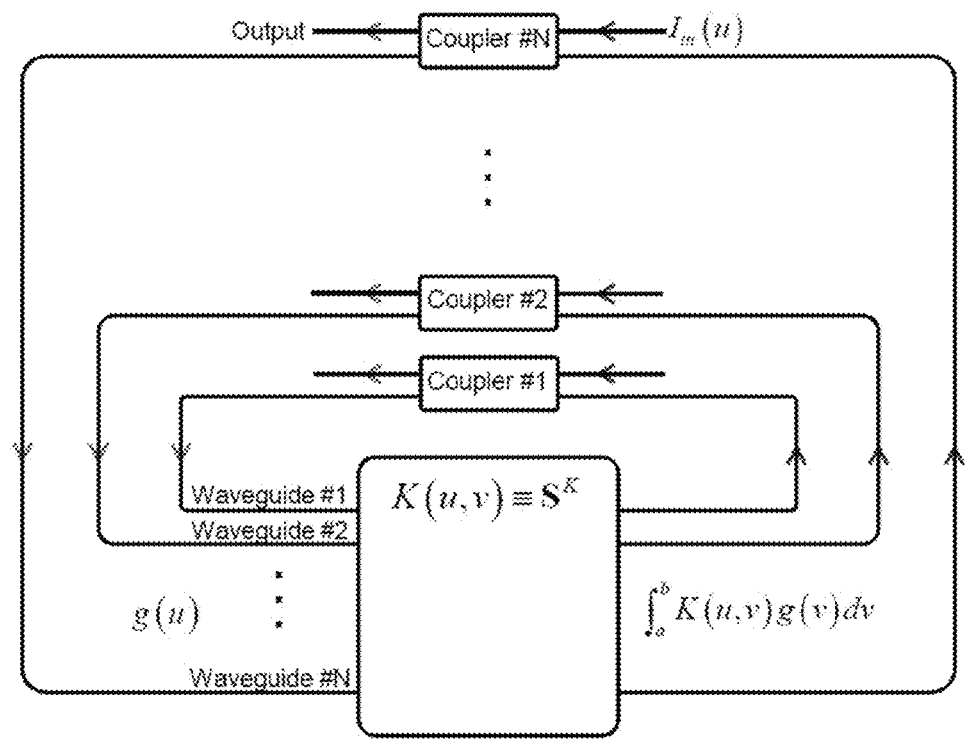
FIG. 21 shows detailed block diagram of the solver using N-waveguides to create the external feedback network.

FIG. 21 shows detailed block diagram of the solver using N-waveguides (corresponding to FIG. 18A), to create the external feedback network. Arrows indicate the direction of the wave flow. This block diagram corresponds to all simulations reported in "transmissive setup".

Figure 22:
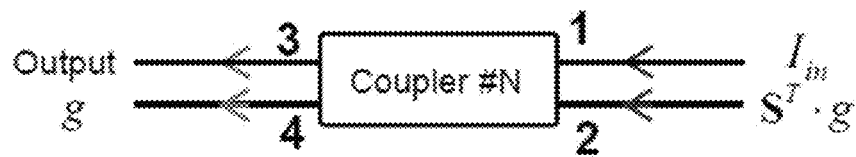
FIG. 22 shows the coupling elements of the integral equation solver in FIG. 21.
Figure 22:
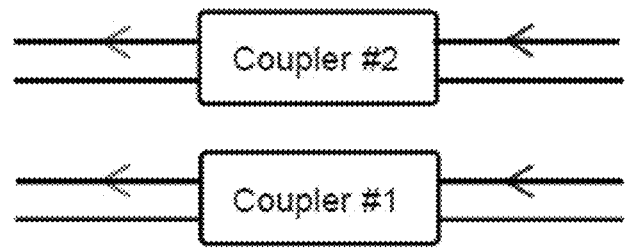

FIG. 22 shows the coupling elements of the integral equation solver in FIG. 21.

Figure 23:
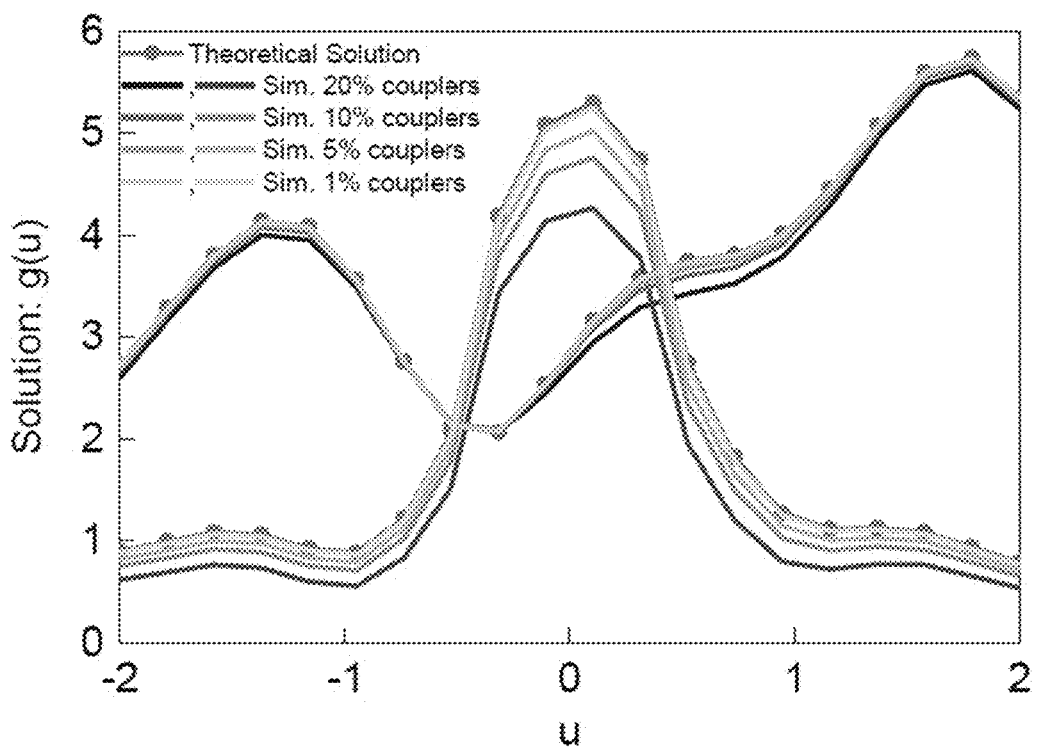
FIG. 23 shows the effect of coupling efficiency (or coupling coefficient) of sampling couplers on the accuracy of the response.

FIG. 23 shows the effector coupling efficiency (or coupling coefficient) of sampling couplers on the accuracy of the response. N=20 sampling points are used across [a, b]=[−2,2]. As the coupling efficiencies/coefficients decrease, the obtained solutions approach the exact expected solution.

Figure 24:
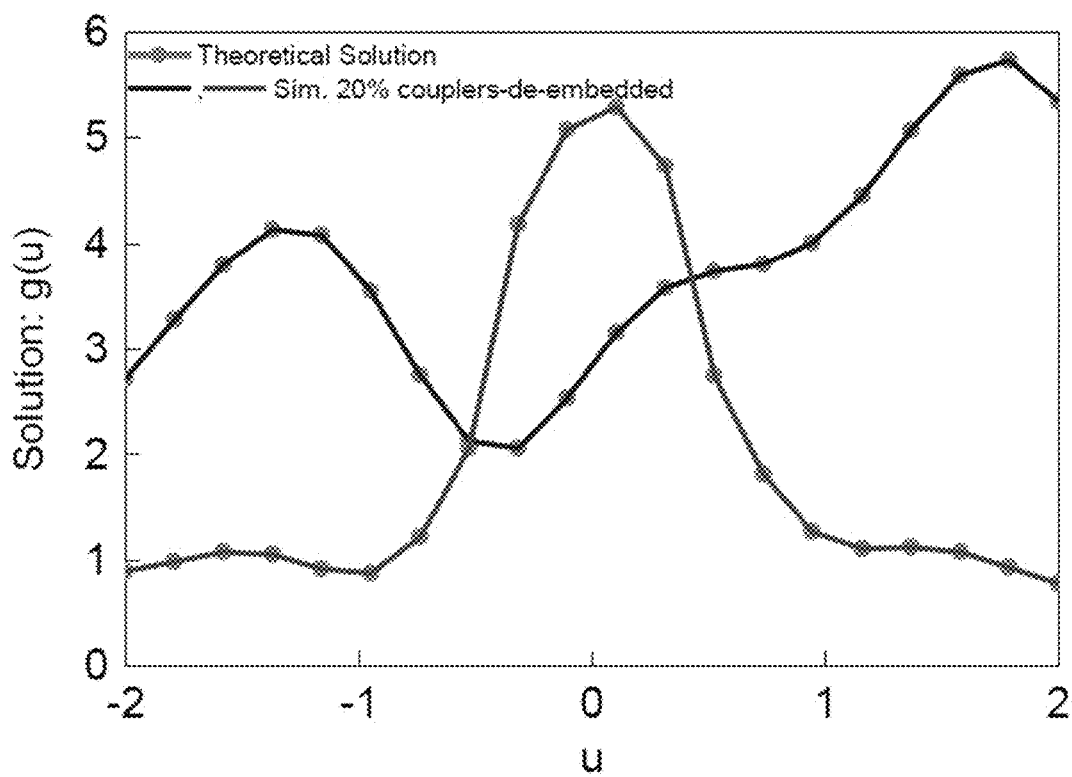
FIG. 24 shows de-embedding the effect of couplers.

FIG. 24 shows de-embedding the effect of couplers for $t_1$=0.8944 and $t_2$=0.4472 (20% power coupling coefficient). Blue and red lines indicate the real and imaginary parts of the calculated solution in our system and gray dots correspond to the exact solution. The input signal is shown in FIG. 18C.

Figure 25:
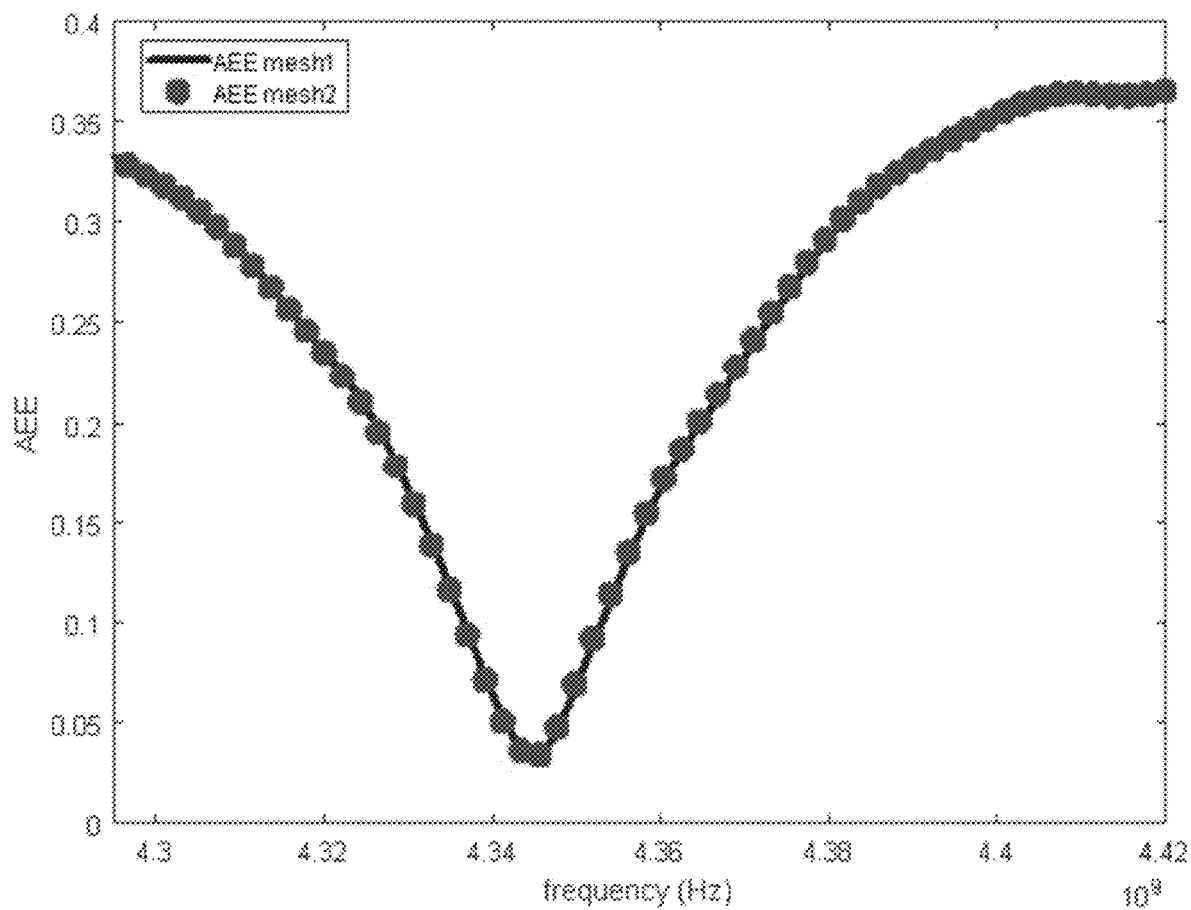
FIG. 25 shows Average Element Error (AEE) for an example kernal implemented with the inhomogeneous cavity in FIG. 19A and simulated in COMSOL Multiphysics® software.

FIG. 25 shows Average Element Error (AEE) for the kernel in Eq. (S7), implemented with the inhomogeneous cavity in FIG. 19A and simulated in COMSOL Multiphysics® software. Two different mesh sizes are used to confirm convergence of the simulation in the highly inhomogeneous media. The blue line and red dots correspond to COMSOL simulation with mesh sizes of $\lambda_0/15$ and $\lambda/20$, respectively. The optimum design frequency is at $f_{optimal}$=4.344 GHz.

Figure 26:
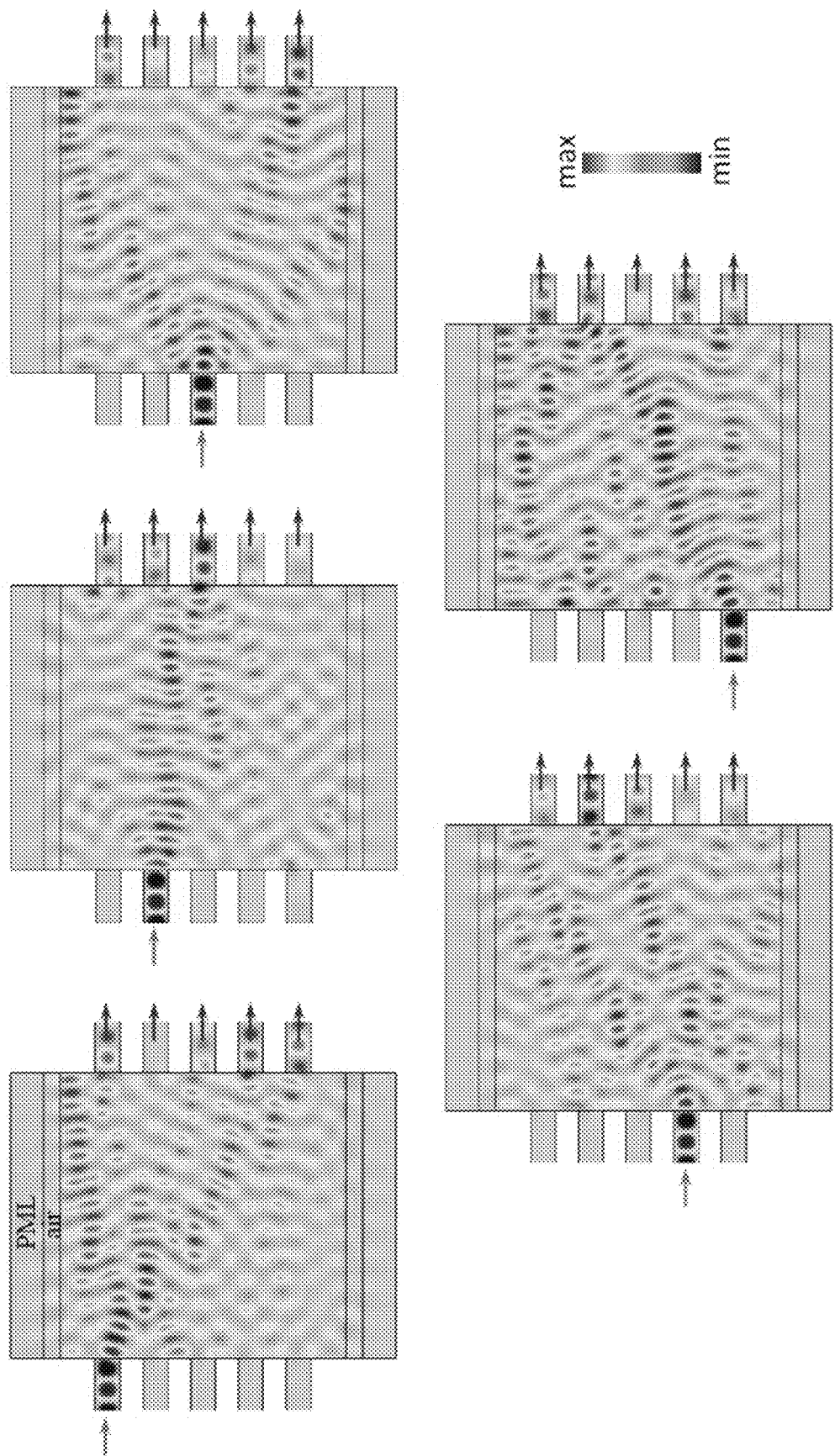
FIG. 26 shows time snapshot of the out-of-plane component of the electric field inside the metamaterial kernel when excited at ports 1 through 5 (one-by-one).

FIG. 26 shows time snapshot of the out-of-plane component of the electric field inside the metamaterial kernel when excited at ports 1 through 5 (one-by-one). These simulations are used to extract the scattering matrix of the kernel reported in Eq. (S10) and calculating AEE.

Figure 27:
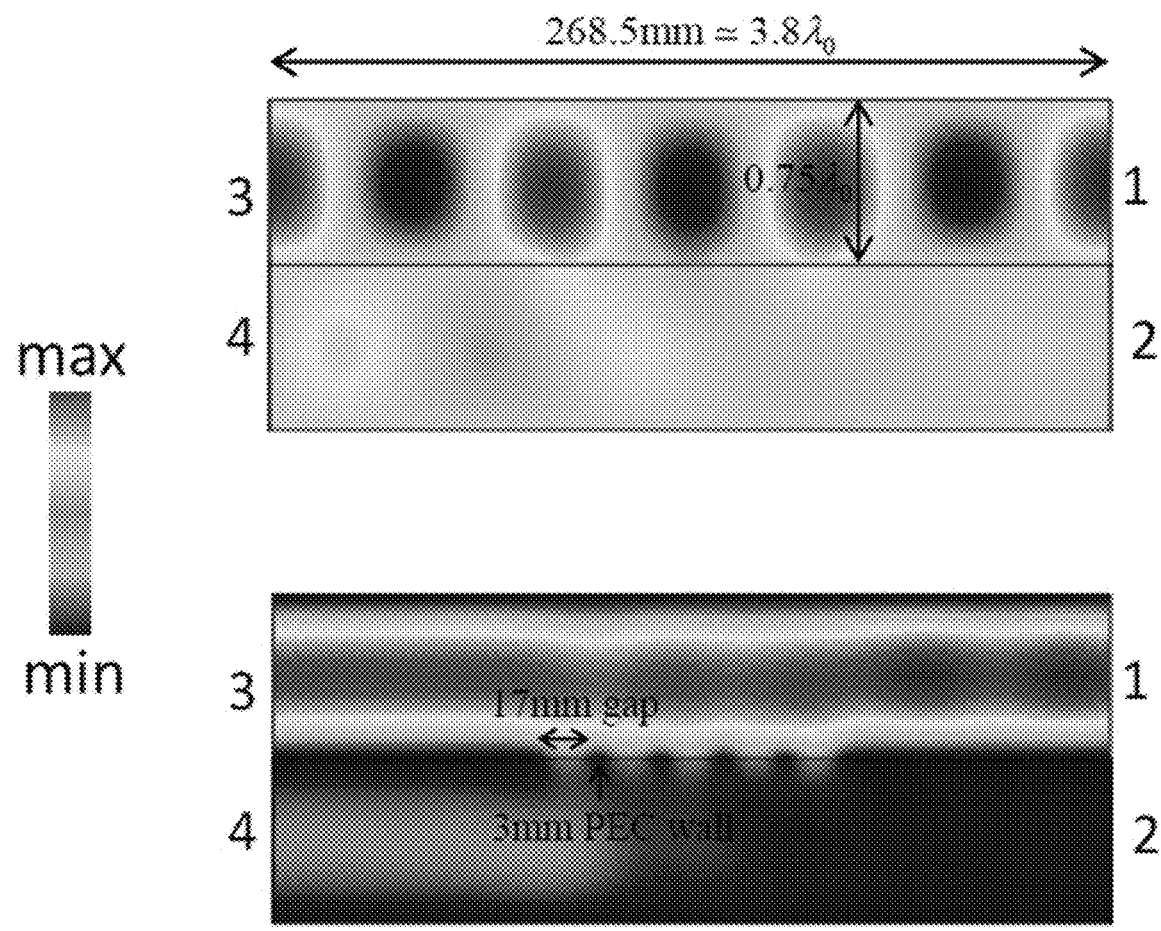
FIG. 27 shows a time snapshot of the out-of-plane component of the electric field inside the coupler when excited at port 1, simulated in COMSOL Multiphysics® software at $f_{optimal}=4.344$ GHz.

FIG. 27 shows a time snapshot (upper panel) of the out-of-plane component of the electric field inside the coupler when excited at port 1, simulated in COMSOL Multiphysics® software at $f_{optimal}$=4.344 GHz. The coupler corresponds to the block diagram in FIG. 22. The corresponding field intensity distribution is also shown (lower panel).

Figure 28A:
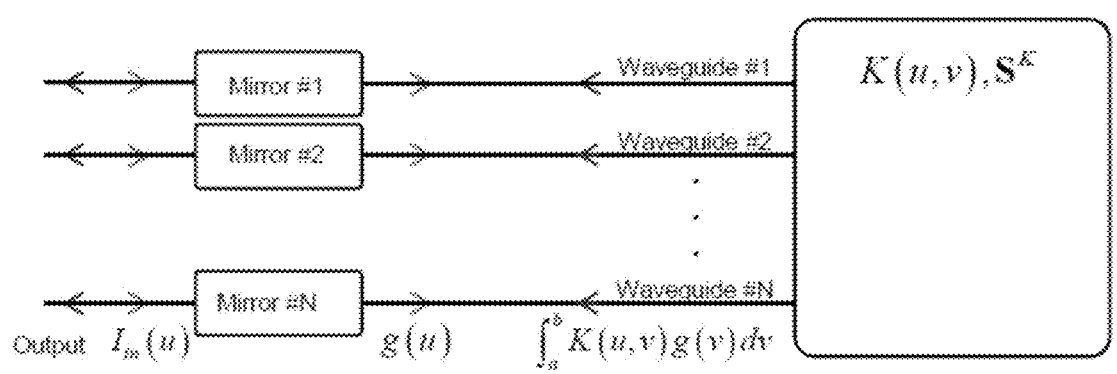
FIG. 28A shows a solver with partially reflecting mirrors.
Figure 28B:
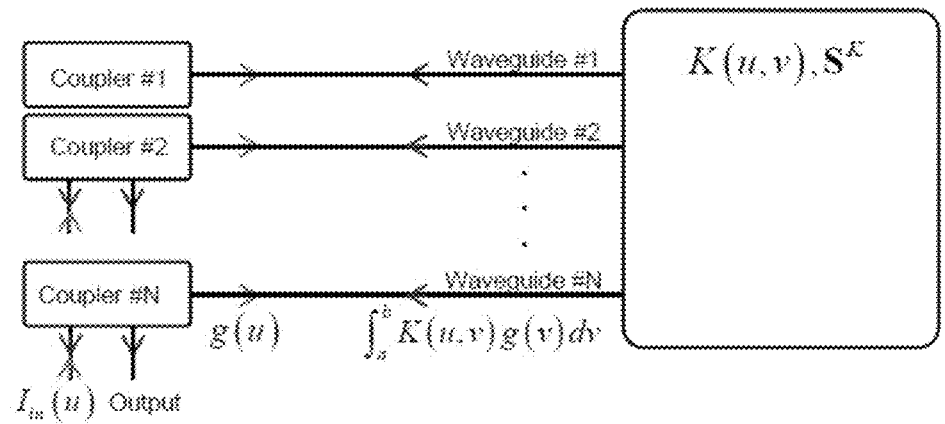
FIG. 28B shows a solver with terminated couplers.

FIG. 28A-B show block diagrams of a solver with internal feedback mechanism (reflective arrangement). FIG. 28A shows a solver with partially reflecting mirrors. FIG. 28B shows a solver with terminated couplers. Red and green arrows indicate the direction of the wave flow on each line.

Figure 29:
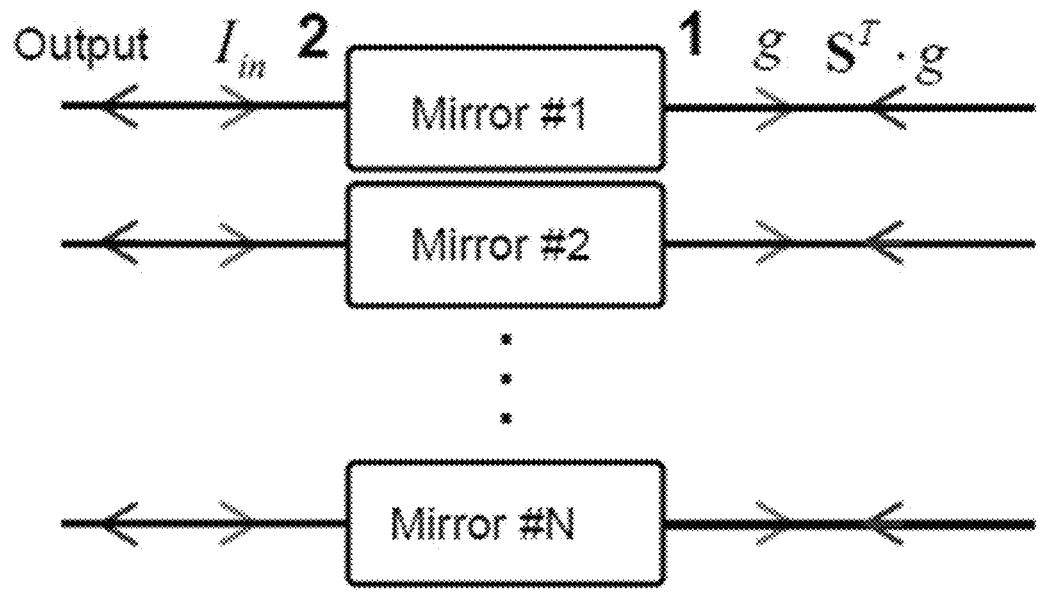
FIG. 29 shows partially reflecting mirrors (coupling elements) in the reflective setup shown in FIG. 28A.

FIG. 29 shows partially reflecting mirrors (coupling elements) in the reflective setup shown in FIG. 28A.

Figure 30:
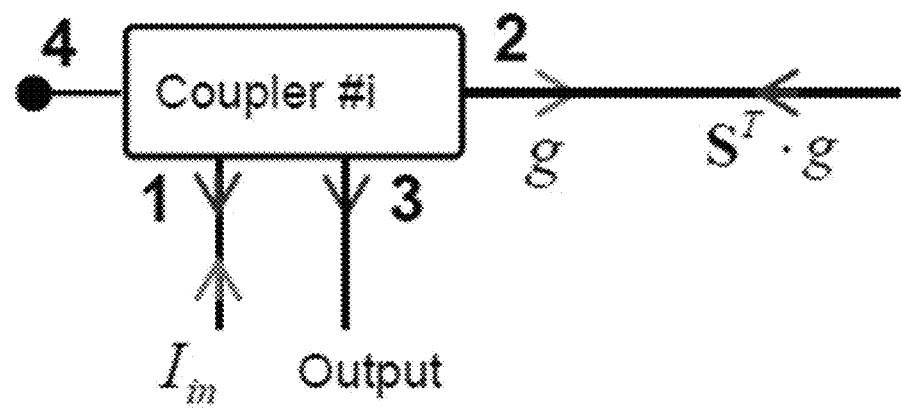
FIG. 30 shows one of the terminated couplers considered in the reflective setup shown in FIG. 28B.

FIG. 30 shows one of the terminated couplers considered in the reflective setup shown in FIG. 28B, and the experimental example 3 above.

Figure 31:
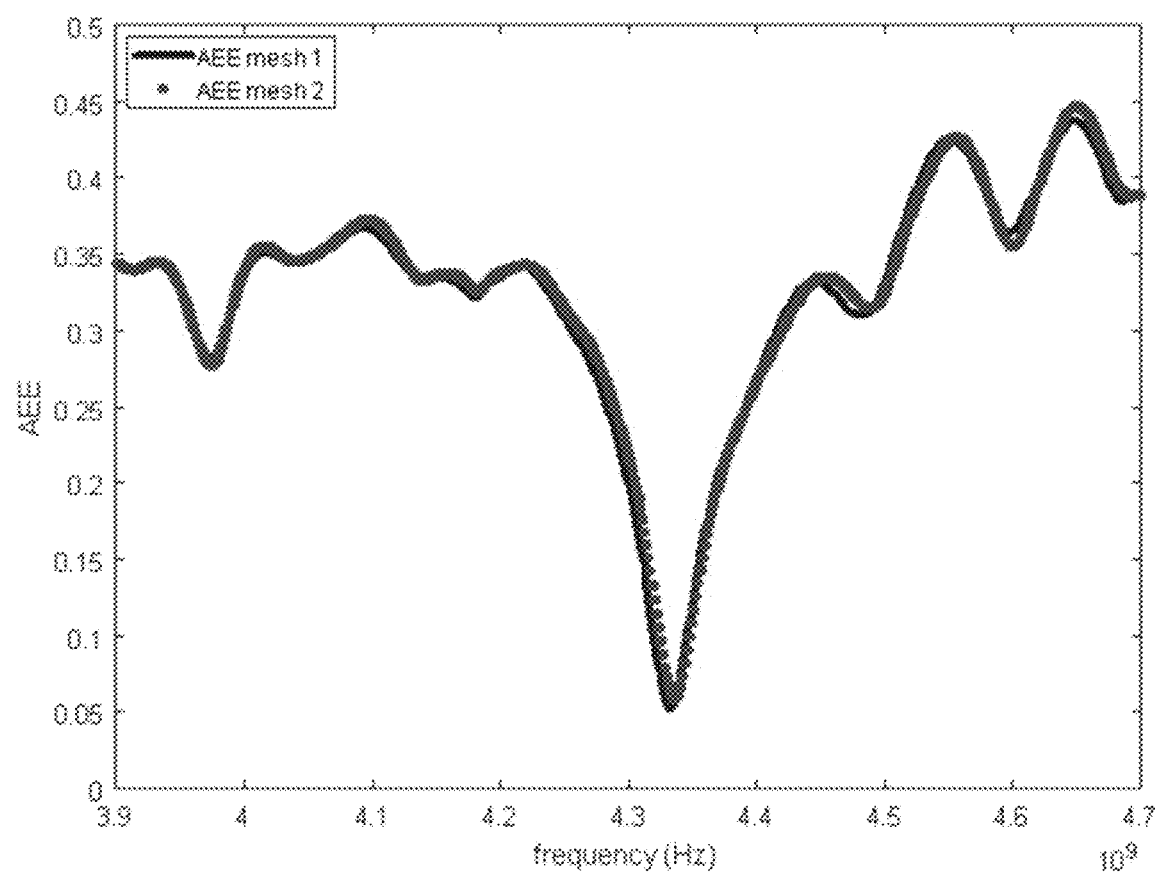
FIG. 31 shows AEE for the third kernel implemented with the binary inhomogeneous cavity in FIG. 20D and simulated in CST Studio Suites software.

FIG. 31 shows AEE for the third kernel in Eq. (4) above, implemented with the binary inhomogeneous cavity in FIG. 20D and simulated in CST Studio Suites software. Two different mesh sizes are used to confirm convergence of the simulation in the inhomogeneous media. The blue line and red dots correspond to CST simulation with 215 k and 980 k total mesh cells, respectively. The optimum design frequency is at $f_{optimal}$=4.344 GHz.

Figure 32:
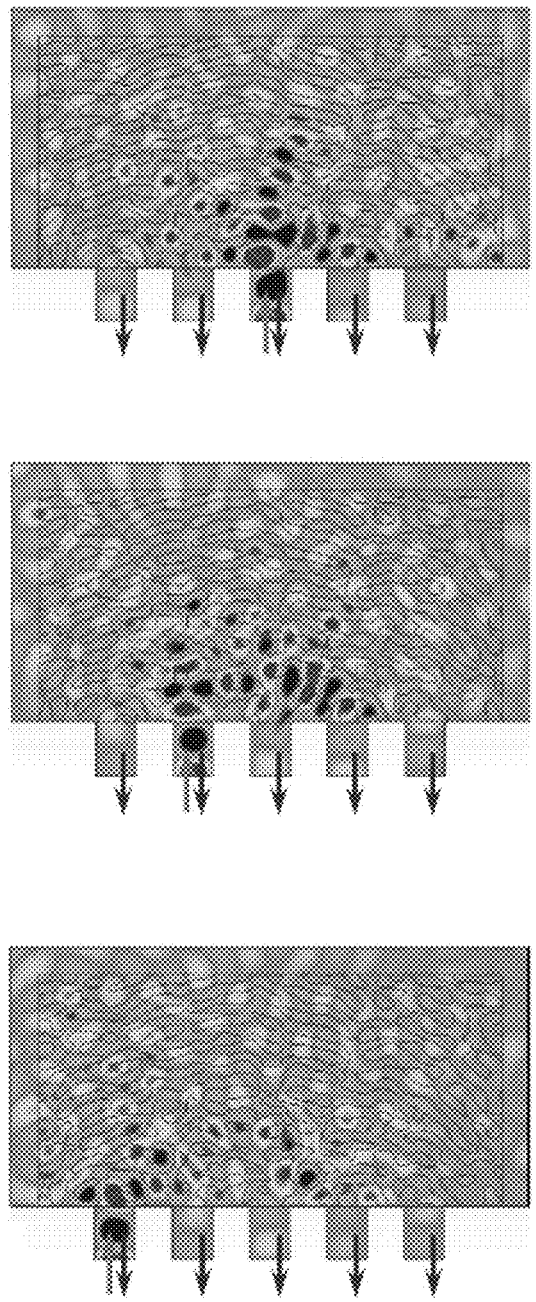
FIG. 32 shows a snapshot of the out-of-plane component of the electric field inside the reflective kernel when excited at ports 1 through 5 (one-by-one), plotted at the optimal design frequency.
Figure 32:
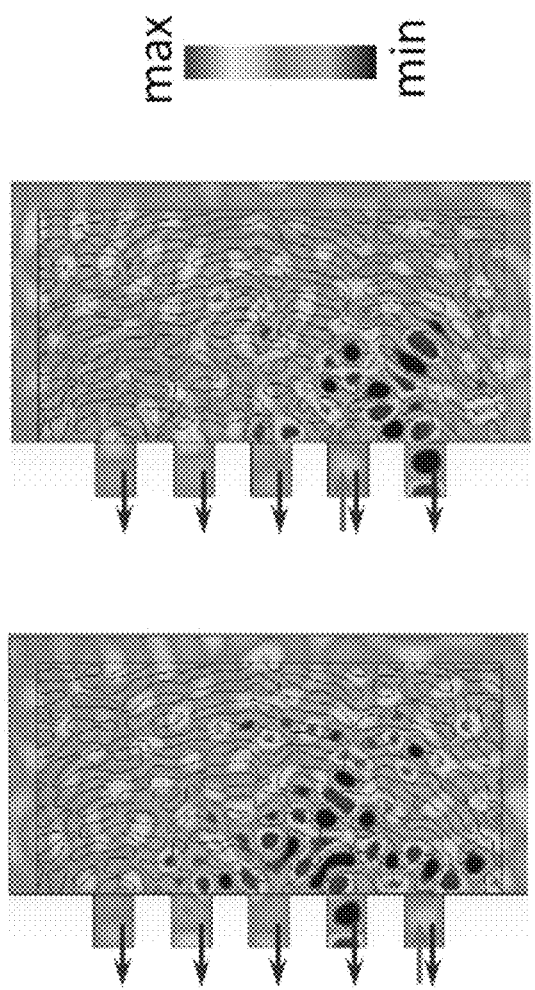

FIG. 32 shows a snapshot of the out-of-plane component of the electric field inside the reflective kernel (e.g., as shown in FIGS. 20A-G) when excited at ports 1 through 5 (one-by-one), plotted at the optimal design frequency.

Figure 33:
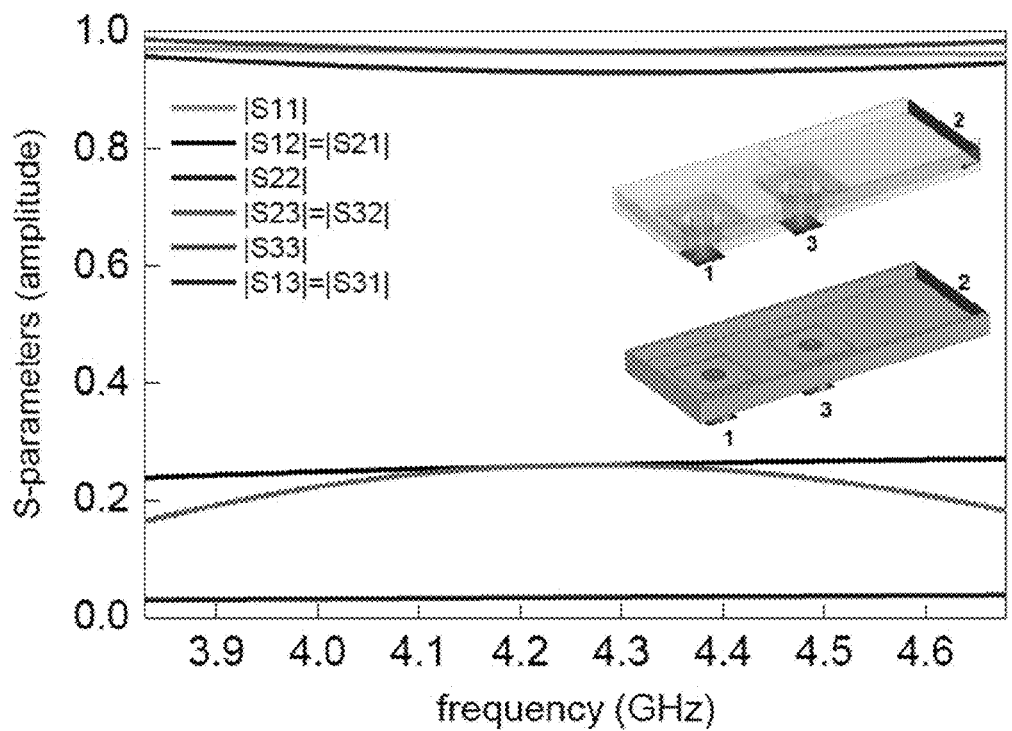
FIG. 33 shows dispersion diagram of the terminated 3-port coupler.

FIG. 33 shows dispersion diagram of the terminated 3-port coupler. Inset shows renderings of the coupler and the excitation/sensing ports consistent with the structure in FIG. 30.

Figure 34:
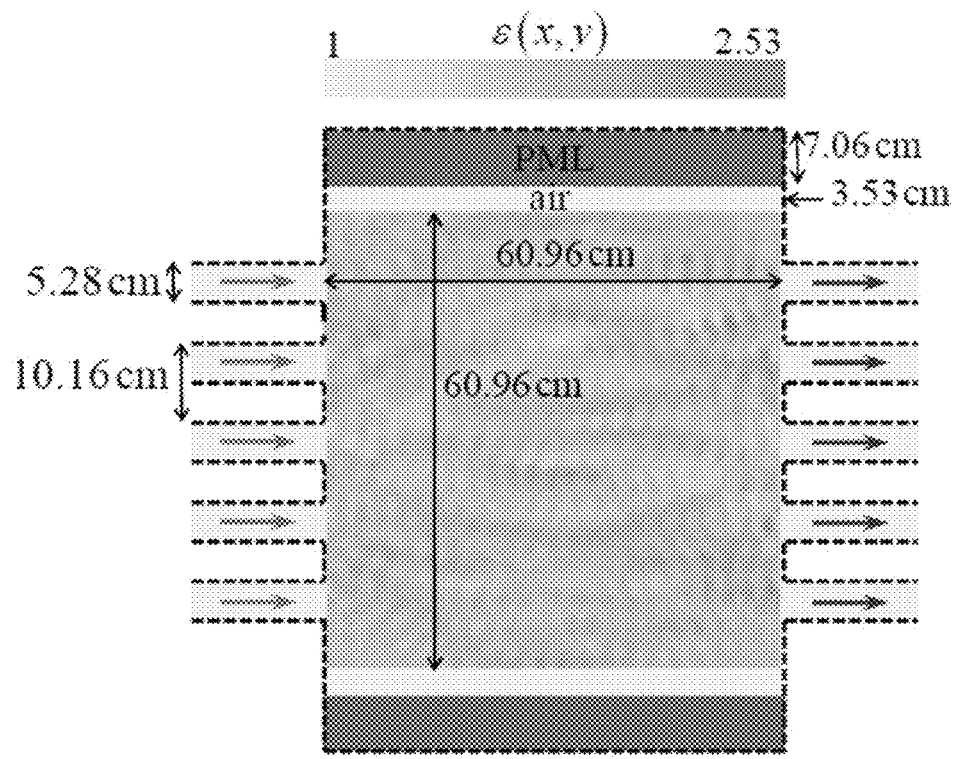
FIG. 34 shows inhomogeneous metamaterial kernel designed for the transmissive setup for $K_3(u,v)$.

FIG. 34 shows inhomogeneous metamaterial kernel designed for the transmissive setup for $K_3(u,v)$. The matrix representation of the kernel for 5-point sampling across [−2,2] is given in Eq. (S19). Distribution of the permittivity ε(x,y) inside the two-dimensional enclosed region with absorbing layers (PML) on top and bottom with the thickness of one wavelength at the initial design frequency, and perfect electric conducting (PEC) walls on all other sides (dashed lines). Five equidistance waveguide ports are placed on each side of the block. Arrows indicate the direction of waveflow in the structure. A thin air layer is placed between the metamaterial and absorbing layer to minimize local reflections.

Figure 35:
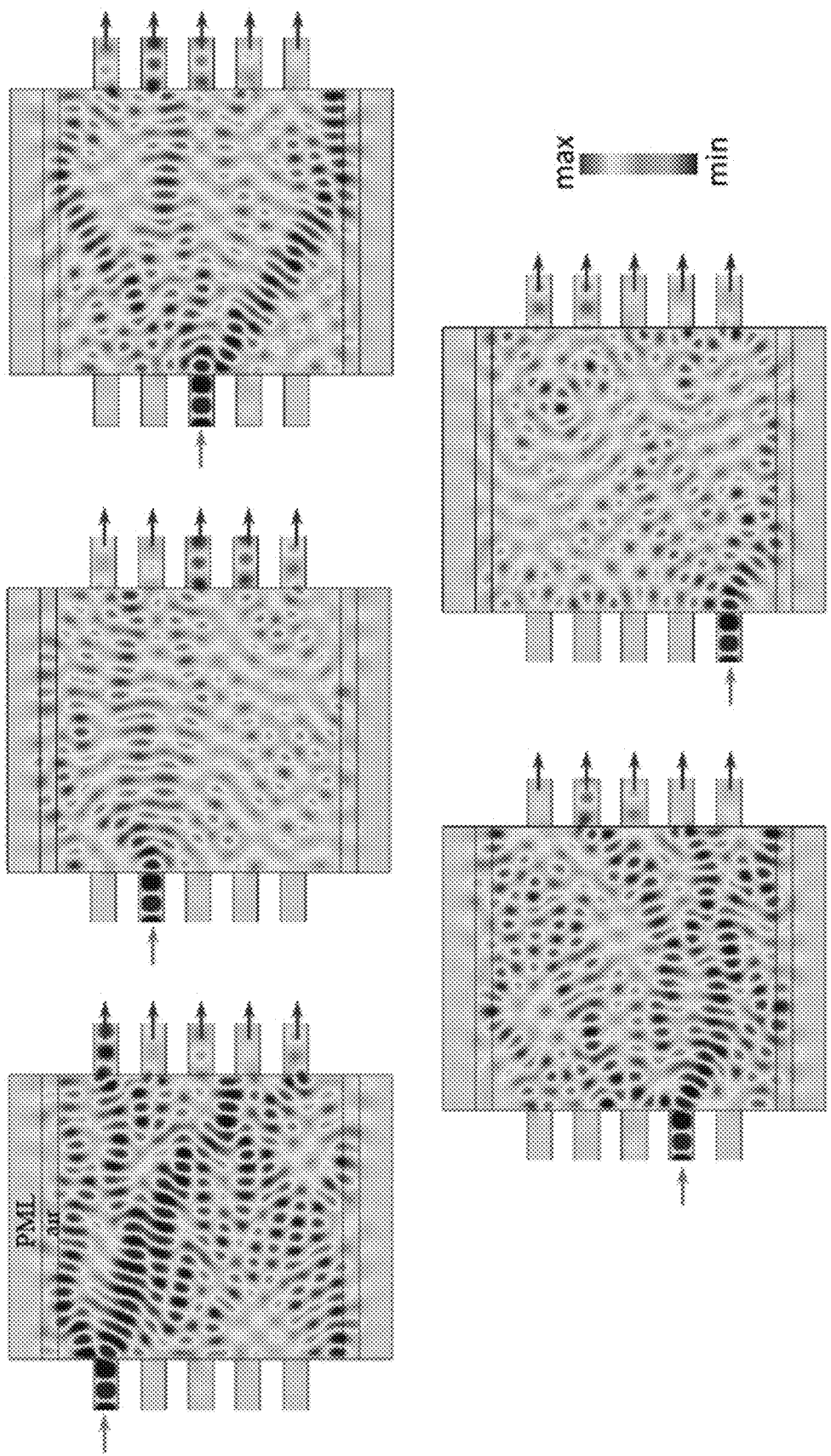
FIG. 35 shows a snapshot of the out-of-plane component of the electric field inside the kernel $K_3(u,v)$ when excited at ports 1 through 5 (one-by-one).

FIG. 35 shows a snapshot of the out-of-plane component of the electric field inside the kernel $K_3(u,v)$ when excited at ports 1 through 5 (one-by-one), also given in Eq. (S20). These simulations are used to extract the scattering matrix of the kernel and calculating AEE.

Figure 36:
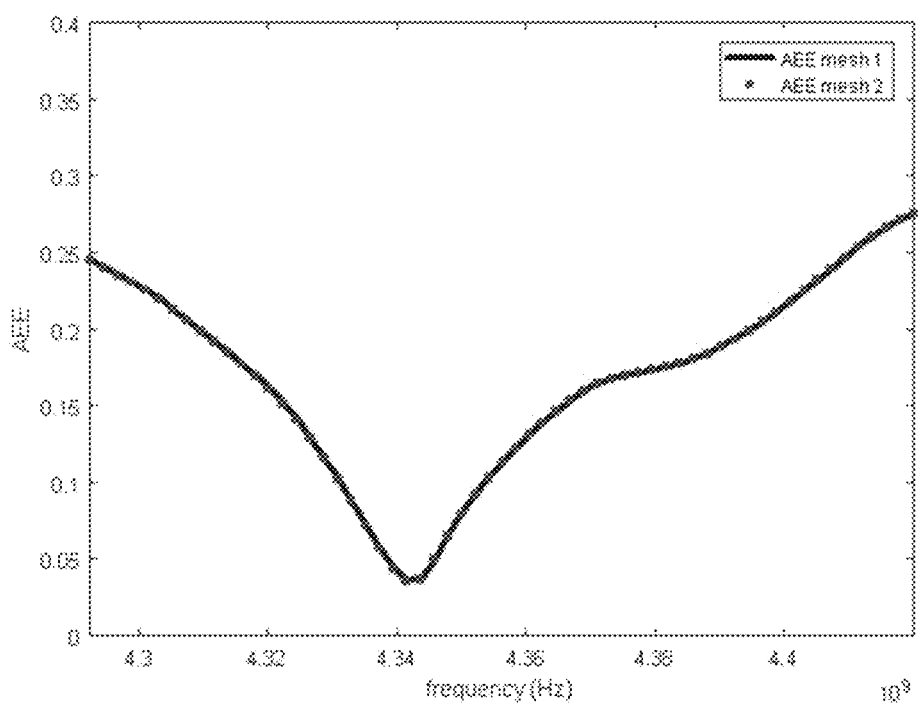
FIG. 36 shows AEE for the kernel $K_3(u,v)$ implemented with the inhomogeneous cavity in FIG. 34 in transmissive setup and simulated in COMSOL Multiphysics® software.

FIG. 36 shows AEE for the kernel $K_3(u,v)$, also given in Eq. (S19), implemented with the inhomogeneous cavity in FIG. 34 in transmissive setup and simulated in COMSOL. Multiphysics® software. Two different mesh sizes are used to confirm convergence of the simulation in the highly inhomogeneous media. The blue line and red dots correspond to COMSOL simulation with mesh sizes of $\lambda_0/15$ and $\lambda_0/20$, respectively. The optimum design frequency is at $f_{optimal}$=4.344 GHz.

Figure 37A:
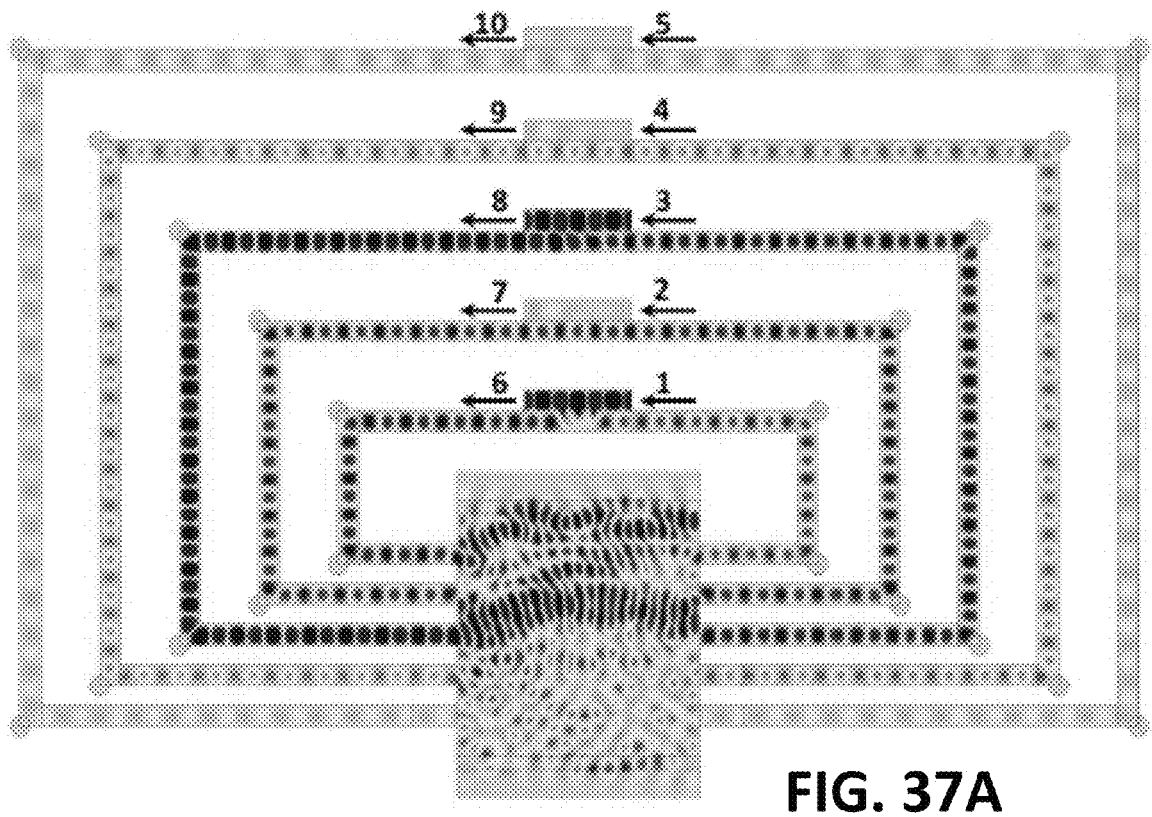
FIG. 37A shows a distribution of power inside the closed-loop network for kernel 3, when excited at ports 1 and 3 with the same amplitude and phase.
Figure 37B:
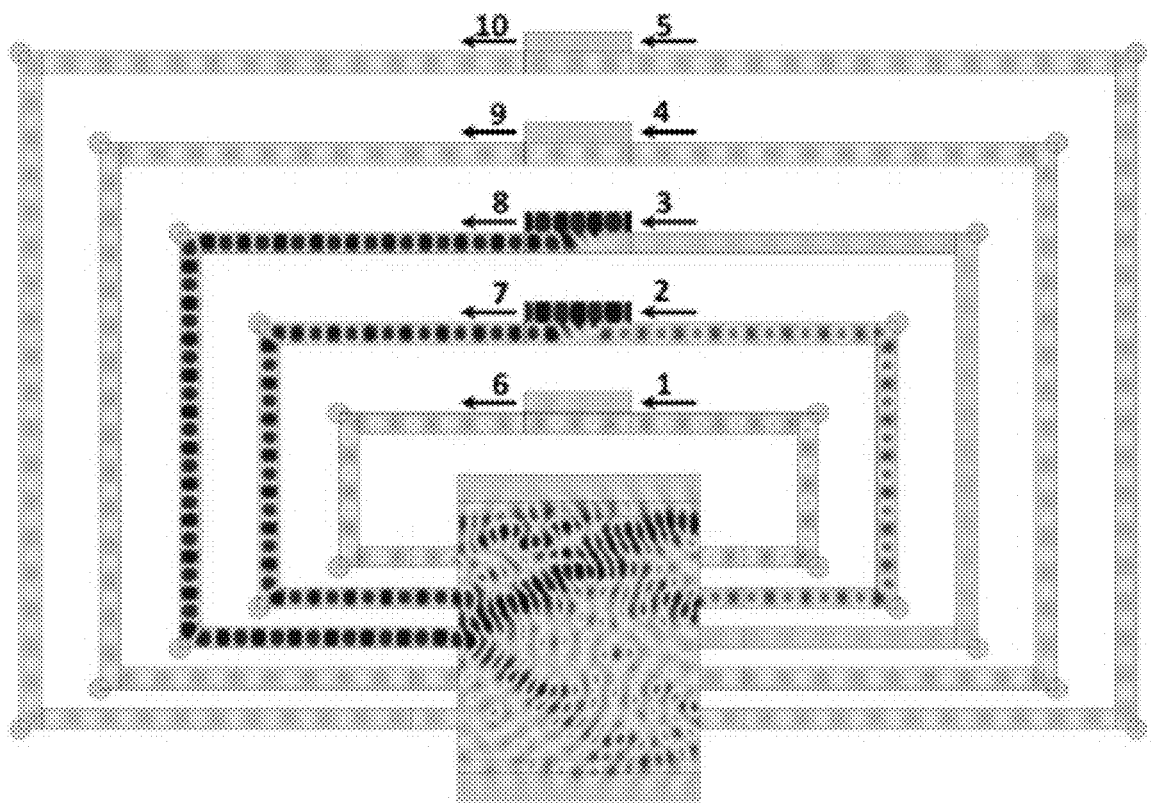
FIG. 37B shows a distribution of power inside the closed-loop network for kernel 3, when excited at ports 2 and 3 with same amplitude and 180 degrees phase difference.

FIG. 37A shows a distribution of power inside the closed-loop network for kernel 3, when excited at ports 1 and 3 with the same amplitude and phase, with the other three ports unexcited, i.e., $I_{in}=I_{in,3} \cos(\omega t+\varphi_0)[1, 0, 1, 0, 0,]$. FIG. 37B shows a distribution of power inside the closed-loop network for kernel 3, when excited at ports 2 and 3 with the same amplitude and π phase difference, with the other three ports unexcited i.e., $I_{in}=I_0[0, \cos(\omega t+\varphi_0), -\cos(\omega t+\varphi_0), 0, 0]$.

Figure 38:
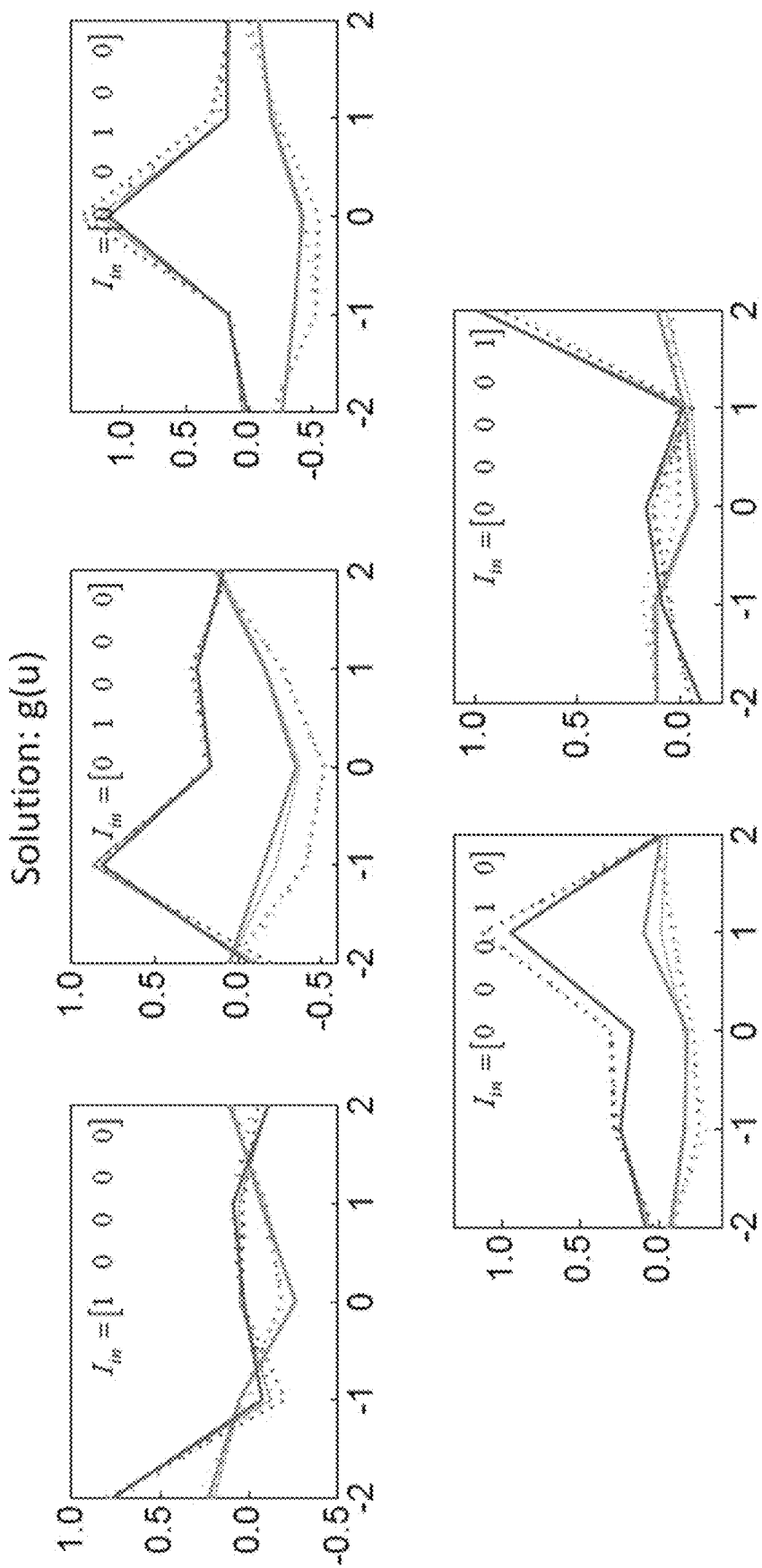
FIG. 38 shows output wave [real (blue) and imaginary (red)] for applied input signals at each of the five ports (one-by-one).

FIG. 38 shows output wave [real (blue) and imaginary (red)] for applied input signals at each of the five ports (one-by-one). Measurements in the reflective setup (thick lines) are compared with the full-wave simulations of the reflective setup (thin lines) and full-wave simulations of the transmissive setup for the same kernel function (dotted lines). The expected theoretical results are shown with dashed lines. The horizontal axis in all plots is u=[−2,2].

Figure 39:
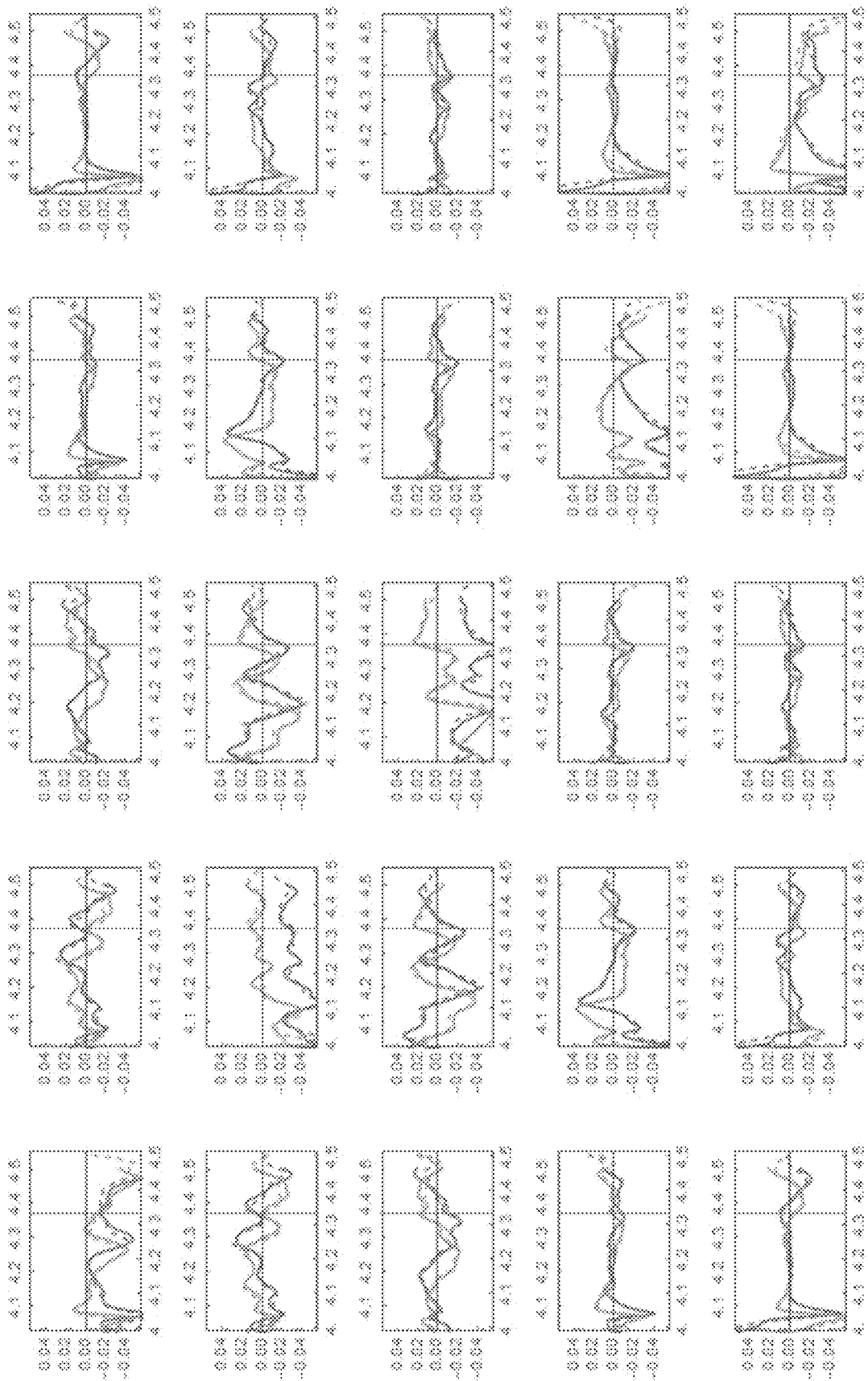
FIG. 39 shows measured (solid) and simulated (dashed) scattering parameters for $K_3(u,v)$ in the reflective setup.

FIG. 39 shows measured (solid) and simulated (dashed) scattering parameters for $K_3(u,v)$ in the reflective setup. All 25 scattering parameters are shown.

Figure 40A:
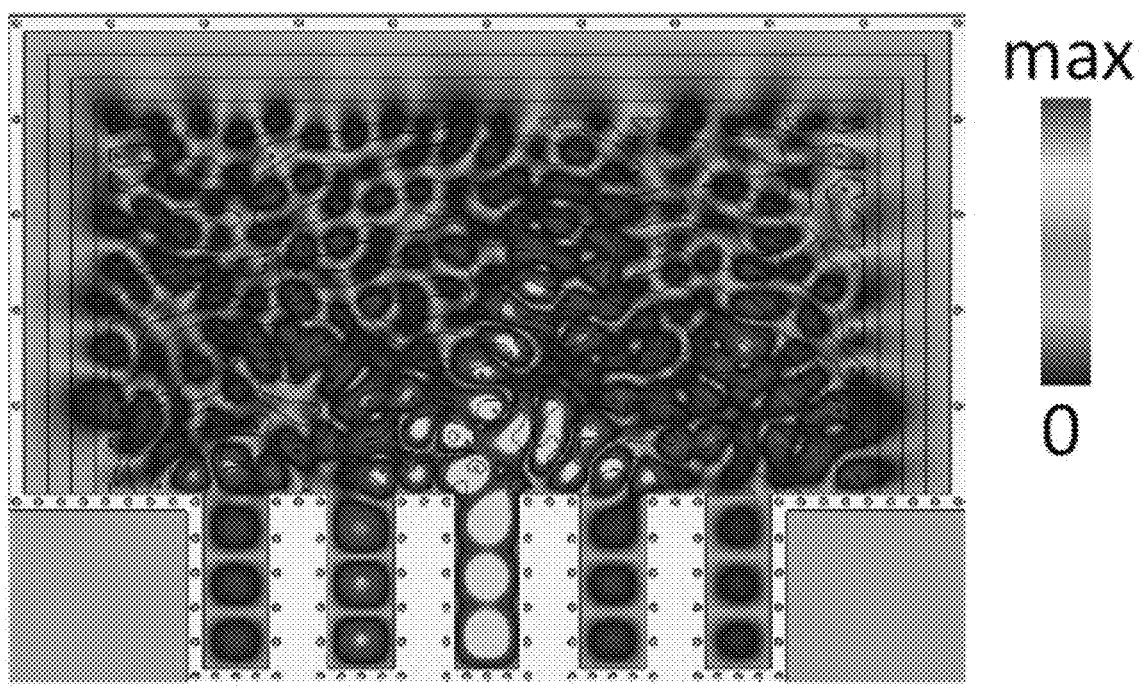
FIG. 40A shows amplitude of the simulated out-of-plane component of the electric field distribution inside the structure.
Figure 40B:
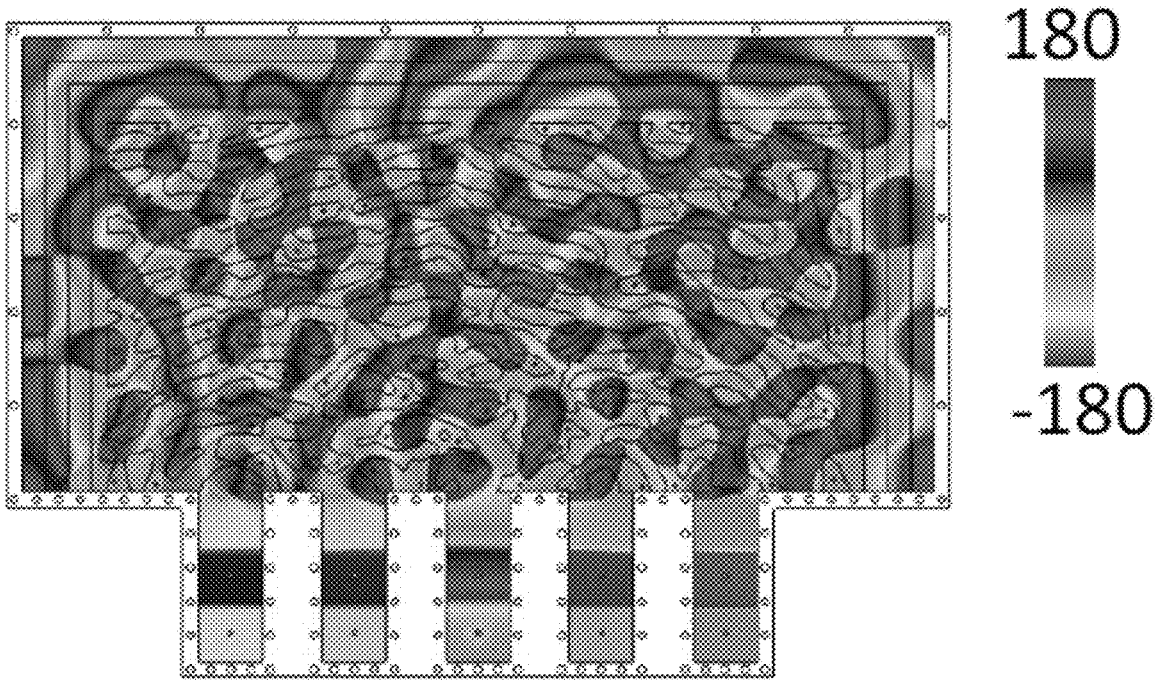
FIG. 40B shows phase of the simulated out-of-plane component of the electric field distribution inside the structure, when excited at port 3.

FIG. 40A shows amplitude of the simulated out-of-plane component of the electric field distribution inside the structure. FIG. 40B shows phase of the simulated out-of-plane component of the electric field distribution inside the structure, when excited at port 3. Time snapshot of the field is shown in FIG. 20F.

Figure 41A:
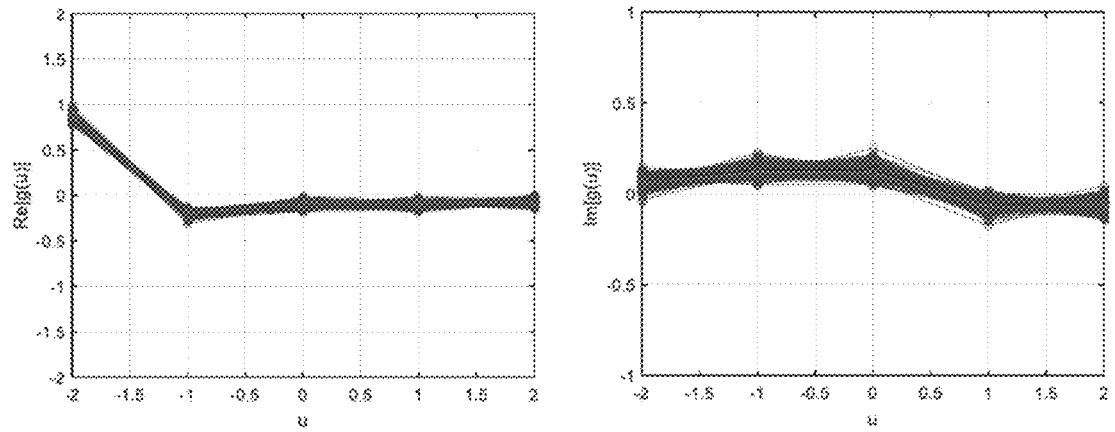
FIG. 41A shows variations in the output signal for 200 cases of noisy kernels in reflective setup.

FIG. 41A shows variations in the output signal for 200 cases of noisy kernels in reflective setup (example three).

Figure 41B:
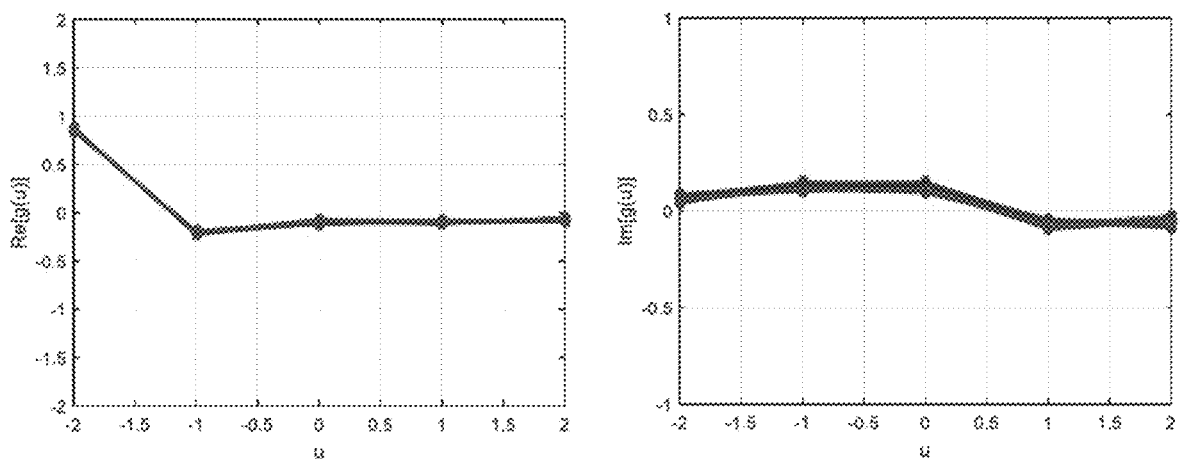
FIG. 41B shows the range of error in the solution becomes less for smaller values of r.

Input signal is applied at port 1 and (a) r=0.1, (b) r=0.04. FIG. 41B shows the range of error in the solution becomes less for smaller values of r.

Figure 42:
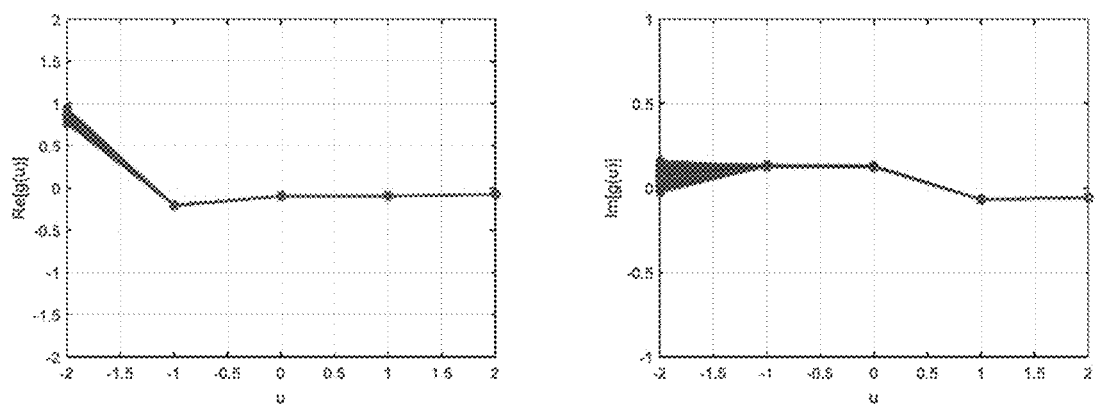
FIG. 42 shows variations in the output signal for 200 cases of noisy coupling elements in reflective setup (example three, schematic shown in FIG. 28A).

FIG. 42 shows variations in the output signal for 200 cases of noisy coupling elements in reflective setup (example three, schematic shown in FIG. 28A). Input signal is applied at port 1 and r=0.01.

Figure 43:
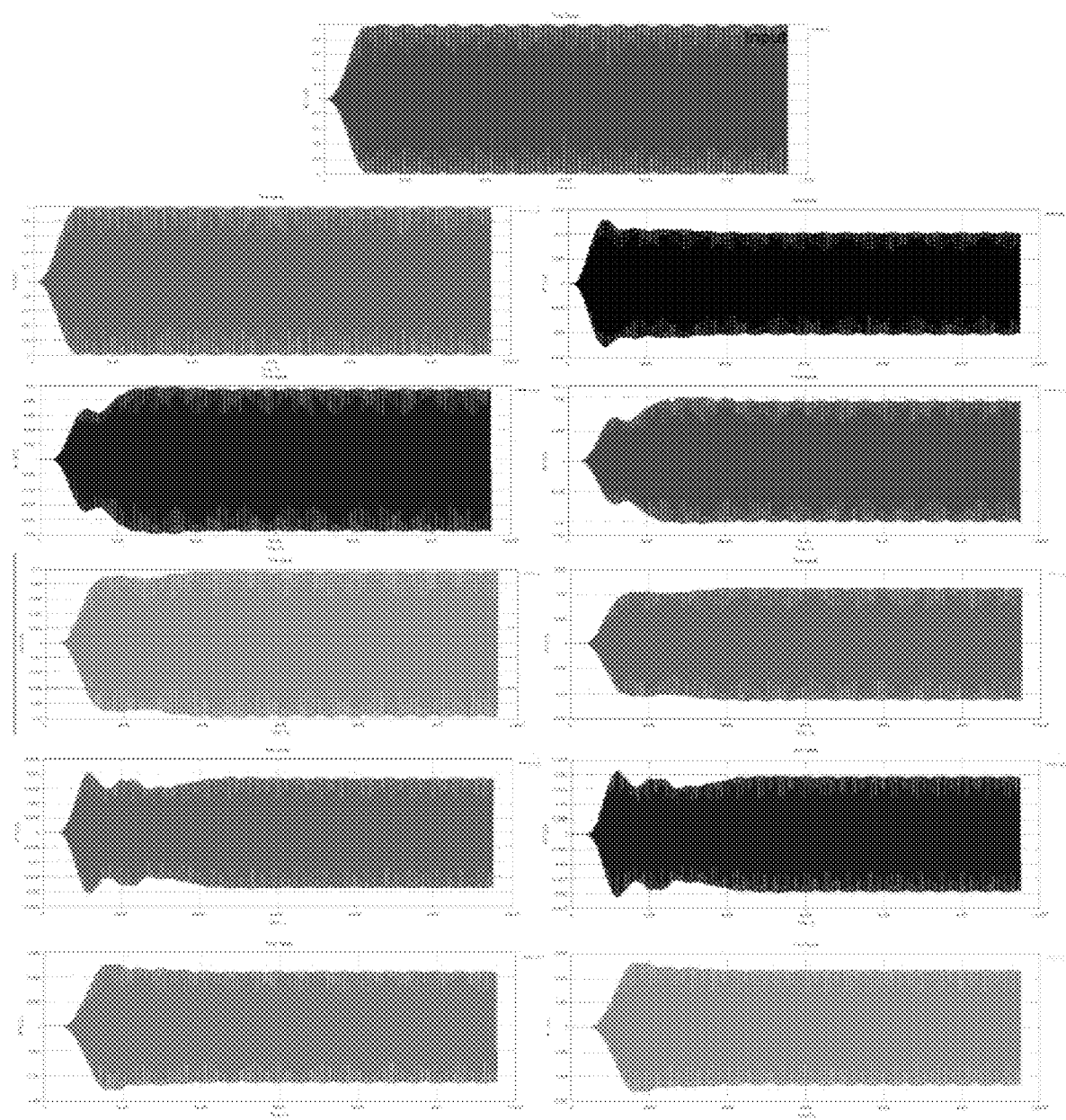
FIG. 43 shows time variations in the output signals at each of the 10 ports in the reflective equation solver simulation with CST software.

FIG. 43 shows time variations in the output signals at each of the 10 ports in the reflective equation solver simulation with CST software. Input signal is shown at the top, being a step sinusoidal function at f=4.34 GHz with rise time of 50 cycles.

A more specific explanation of the above figures follows.

Physical implementation of the mathematical equation in view of reciprocity and passivity is described as follows. The input electromagnetic signal, $I_{in}(u)$, and the wave built up at the input of the kernel in the system shown in FIG. 21 (detailed block diagram representation of FIG. 18A), i.e., g(u), follow the matrix relation, $$G[\overline{u}]=I_{in}[\overline{u}]+S^T[\overline{u},\overline{v}]\cdot g[\overline{v}] \tag{S1}$$

in which $u=(u_1, \ldots u_N)_{tr}$, $v=(v_1, \ldots v_N)^{tr}$ correspond to N sampling points across each continuous variable (in the spatial domain). Vector $\overline{u}$ samples the "input" (or output) side of the kernel operator across [a, b] interval and vector $\overline{v}$ corresponds to the N discrete points of the integration variable v, also sampled between a and b. Here we assume that the operation of kernel is ideally reflectionless, i.e., that the wave flows only along the arrows in FIG. 21 and the reverse wave is not excited along this path. Matrix $S^T$ refers to the transmission part of the scattering matrix of the kernel, $S^K$, while the reflection from input side is assumed to be ideally zero i.e., $$S^K \begin{bmatrix} 0_{N \times N} & (S^T)^{tr} \\ S^T & N.A. \end{bmatrix} \tag{S2}$$

Since the wave propagation is forward (along the arrows), the reflection from the output side of the kernel does not play a role in the calculations (thus marked as N.A. in Eq. (S2)). Elements of $S^T$ are also sampled from the kernel operator at the discretization points defined by $\overline{u}$ and $\overline{v}$, $$S_{n,m}{}^T=K(u_n,v_m)\delta v \tag{S3}$$

for n,m=1, 2, ..., N where δv=b−a/N−1. Eq. (S1) is the discretized version of the general integral equation given in Eq. (1) above. We note that the discretization is in the sampling points only, and the values of fields (e.g., $g[\overline{u}]$ or $I_{in}[\overline{u}]$) are analog (i.e., "continuous-valued") complex numbers that can assume any value.

Looking at Eq. (S2), it is clear that the scattering matrix of the kernel $S^K$, always obeys the reciprocity condition in this setup, independent of the chosen kernel operator K(u,v). This implies that for any mathematical kernel we can always find a reciprocal implementation of the kernel operator. However, in general $S^K$ may not always represent a passive (i.e., lossless or lossy) scattering matrix. In such case, the kernel may be scaled down to approach a passive physical implementation. The possibility of such condition is discussed in detail in "Supplementary Text: Satisfying convergence condition for any arbitrary kernel".

Effect of the Coupling Coefficient on the Accuracy of the Situation

Numerical system-level simulations in CST Studio Suite® (CST Schematic) are used to calculate the solution of the integral equation associated with Eq. (2) above. We use directional couplers with zero reflection and power coupling efficiency of 10% to excite the system and also probe the output signal. FIG. 22 shows the coupling segment of the system shown in FIG. 21, comprising N couplers. The arrows show the direction of propagation of the signal in each waveguide after enforcing zero reflection in the kernel and the couplers.

The scattering matrixes of the N directional couplers are identical and equal to, $$S_{coupler}\begin{pmatrix} 0 & 0 & t_1 & -t_2 \\ 0 & 0 & t_2 & t_1 \\ t_1 & t_2 & 0 & 0 \\ -t_2 & t_1 & 0 & 0 \end{pmatrix} \tag{S4}$$

following the port numbering indicated on FIG. 22. Here, $t_1$ is the transmission coefficient and $t_2$ is the coupling coefficient of the directional couplers, with $|t_1|^2+|t_2|^2=1$. The relation between the input signal and the output in FIG. 22 may be written as, $$g[\overline{u}]=-t_2[\overline{u}]+t_1S^T[\overline{u},\overline{v}]\cdot g[\overline{u}]$$

$$\text{Output}[\overline{u}]=t_1 I_{in}[\overline{u}]+t_2 S^T[\overline{u},\overline{v}]\cdot g[\overline{u}] \tag{S5}$$

Examining Eq. (S5), if $t_1 \to 1$ & $t_2 \to 0$ the first equation is equal to Eq. (S1) after re-scaling the input signal $$I_{in}=-\frac{I_{in-original}}{t_2}.$$

The second equation can be used to extract the solution $g[\overline{u}]$ from the system as, $$G[\overline{u}]=\frac{t_1(\text{Output}[\overline{u}]-t, I_{in}[\overline{u}])}{t_2}+I_{in-original} \tag{S6}$$

We note that the solution maybe directly extracted from the waveguides at the point they enter the kernel (see FIG. 18A or FIG. 21), by using a second set of directional 4 couplers and no further post processing. Here, for the ease of illustration (and experimental considerations), we choose to use only one set of couplers to both excite the system with the input signal $I_{in}[\overline{u}]$ and sample the solution $g[\overline{u}]$.

For the data provided in FIG. 18D in the we use $t_1$=0.9486 and $t_2$=0.3162 indicating 10% power coupling efficiency. We note that $t_1$ is a real number close to one. This implies that while the wave is transmitted through the couplers in the feedback line, it does not accumulate any unwanted phase and its amplitude is almost constant. To study the effect of the probing on the accuracy of the response, we change the power coupling efficiency to 1%, 5%, and 20%, and the solution is calculated for the same input signal and kernel we show in FIGS. 18B-18C. The results are reported in FIG. 23.

Here, we also use N=20 sampling waveguides across the u∈[−2,2] range (i.e., N=20 couplers are used). As intuitively expected, the extracted solution converges to the exact solution (theoretically calculated, gray curves in FIG. 23), when the coupling efficiency is decreased and gets closer to zero. Our studies (not all reported here) indicate that the resilience to power leakage through probing is mostly related to the absolute output power of the kernel. For instance, if the kernel operator is very lossy (i.e., the output power is much smaller than the input), then the system is more vulnerable to the probing effects, which is intuitively expected.

While the presence of the couplers may appear to reduce the accuracy of the response, it is possible to remove the effect of the couplers, as we discuss below. Looking at Eq. (S5) we note that the main source of error is the term $t_1 S^T[\bar{u},\bar{v}] \cdot g[\bar{u}]$ in the first equation. Assuming for the moment that $t_1=1$, then Eq. (S5) would be exactly equal to Eq. (S1), albeit for a re-scaling in the input signal. To circumvent this error in the calculation of the solution, one simple approach is to modify the kernel transfer matrix itself. For instance, if it is desired to find the solution of an integral equation with kernel $K(u,v)$ using couplers with already known coefficients $t_1$ and $t_2$, the implemented kernel must be $$\frac{K(u,v)}{t_2}$$

instead of $K(u,v)$. We will refer to this process as de-embedding the effect of couplers on the solution. As an example, for the case of 20% couplers (dark red and blue lines in FIG. 23) we change the implemented kernel to $$\frac{K(u,v)}{t_1}$$

and compare the results in FIG. 24. The input, $I_{in\text{-}original}$, and exact solution (gray lines/dots) are identical to those in FIG. 23, and the blue and red lines show the solution of the system calculated using Eq. (S6), de-embedding the effect of all couplers. As it can be seen, the solution is 100% accurate (in comparison with the exact solution of Eq. (S1)) and the presentence of couplers has no measurable effect. We note that the only data to perform de-embedding is the transmission coefficient of the directional couplers used in the system.

Kernel and coupler design and extraction of the inverse of the matrix A in the transmissive setup (Example 2 above):

To calculate the inverse of matrix A given in Eq. (3) above, the equation $I_{in}[\bar{u}]=A \cdot g[\bar{u}]$ must be solved for any arbitrary input signal. This equation can be transformed into the general Fredholm integral equation of the second kind as $g[\bar{u}]=I_{in}[\bar{u}]+(I_{S\times S}-A) \cdot g[\bar{u}]$, which is solvable with our system.

In order to create the physical system to mimic the mathematical kernel $(I_{S\times S}-A)$, the transmission part of the scattering matrix of the system follows, $$S^T = I_{5\times 5} - A = \begin{pmatrix} -0.4-0.25i & -0.25+0.35i & 0.35-0.15i & 0.3-0.15i & 0.5-0.15i \\ 0 & 0.4 & 0.2-0.1i & 0.65-0.2i & -0.35+0.3i \\ -0.3+0.15i & -0.3-0.55i & -0.25-0.2i & 0.35+0.25i & -0.3i \\ -0.2-0.5i & -0.2+0.2i & -0.25-0.4i & -0.2+0.1i & -0.45+0.2i \\ 0.5-0.2i & 0.15+0.2i & -0.55-0.25i & 0.3 & 0.35-0.1i \end{pmatrix} \quad (S7)$$

and the complete scattering matrix of the kernel is given in Eq. (S2). Using the requirement in Eq. (S2), i.e., zero reflection matrix and known transmission matrix, in the objective-first design technique (41), we design the structure shown in FIG. 19A. The optimization goals are set to minimize the following error, $$\text{error} = \sum_{i=1}^{10}\sum_{j=1}^{5} |S^K_{simulated}(i,j) - S^K_{desired}(i,j)|^2 \quad (S8)$$

in order to achieve the desired transmission matrix $S^T$ with minimized reflection. The initial design frequency is set at $f_0=4.25$ GHz ($\lambda_0=7.06$ cm), and the distribution of the relative permittivity inside a square region of 60.96 cm×60.96 cm is varied between $\varepsilon_r=1$ (air), and $\varepsilon_r=2.53$ (low-loss Polystyrene). This means that the block size is approximately $8.63\lambda_0 \times 8.63\lambda_0$. The optimal frequency operation point is typically slightly shifted (less than 2.5% difference) compared to the initial design frequency, likely caused by mesh dispersion error in our custom objective-first optimization and FDFD code. Throughout the paper, the results are reported at the optimal frequency (minimum error point), specifically mentioned for each example. FIG. 25 shows the average element error (AEE) defined as, $$AEE = \frac{\sum_{i=1}^{10}\sum_{j=1}^{5} |S^K_{simulated}(i,j) - S^K_{desired}(i,j)|}{50} \quad (S9)$$

for the kernel shown in FIG. 19A. COMSOL Multiphysics® software is used to calculate the scattering matrix of the inhomogeneous kernel, which is then compared with the desired kernel in Eqs. (S7) and (S2). The results are compared for two different mesh sizes in FIG. 25, to confirm convergence of the solution in the inhomogeneous medium. Details of the mesh properties are reported in the caption of FIG. 25. For reflective kernels (discussed in following sections), the denominator of AEE is replaced by 25.

As can be seen in FIG. 25, the AEE has a clear dip around $f_{optimal}=4.344$ GHz which we use to calculate the inverse of matrix A. FIG. 26 displays the electric field distribution inside the designed kernel when excited at different ports. These simulations are used to calculate the complete scattering matrix of the kernel SK and AEE based on Eq. (S9). At the optimal design frequency, the scattering matrix of the designed kernel (in FIG. 19A) is, $$S^T_{simulation} = \begin{pmatrix} -0.36-0.33i & -0.24+0.27i & 0.39-0.1i & 0.28-0.14i & 0.47-0.07i \\ -0.01 & 0.36+0.02i & 0.23-0.1i & 0.62-0.15i & -0.35+0.23i \\ -0.31+0.11i & -0.3-0.55i & -0.22-0.18i & 0.34+0.22i & -0.25i \\ -0.21-0.5i & -0.2+0.19i & -0.21-0.38i & -0.19+0.08i & -0.45+0.16i \\ 0.41-0.23i & 0.14+0.15i & -0.51-0.23i & 0.27-0.02i & 0.31-0.15i \end{pmatrix} \quad (S10)$$

where $S_{simulation}^T$ is to be compared with the goal matrix given in Eq. (S7)). The calculated reflected power at all five input port is less than 0.3% for all excitations.

The directional couplers are also designed at the optimal design frequency to create 10% power coupling efficiency with zero reflection. The transmission phase of the coupler is also set to be zero. This is a crucial consideration to eliminate the effect of the presence of coupler in the signal path. FIG. 27 shows the simulation results of the field distribution in the coupler, comprising two parallel waveguides with PEC walls, each with width of $0.75\lambda_0$. Since we are interested in the fundamental $TE_{10}$ mode, the entire structure is assumed to be infinite in the direction normal to the surface, i.e., the simulation is two-dimensional. We add five openings in the common PEC wall between the waveguides in order to couple a portion of the power between the two waveguides (FIG. 27—lower panel). This coupler is symmetric, and the scattering matrix follows the general format.

$$S_{coupler} = \begin{pmatrix} 0 & 0 & t_1 & -it_2 \\ 0 & 0 & -it_2 & t_1 \\ t_1 & -it_2 & 0 & 0 \\ -it_2 & t_1 & 0 & 0 \end{pmatrix} \quad (S11)$$

in which $t_1$ and $t_2$ are both positive real numbers. The scattering matrix of the implemented kernel in COMSOL at $f_{optimal}$=4.344 GHz is found to be, $$S_{coupler} = \begin{pmatrix} 0.042e^{-i0.6\pi} & 0.042e^{-i0.6\pi} & 0.947 & 0.316e^{-i0.5\pi} \\ 0.042e^{-i0.6\pi} & 0.042e^{-i0.6\pi} & 0.316e^{-i0.5\pi} & 0.947 \\ 0.947 & 0.316e^{-i0.5\pi} & 0.042e^{-i0.6\pi} & 0.042e^{-i0.6\pi} \\ 0.316e^{-i0.5\pi} & 0.947 & 0.042e^{-i0.6\pi} & 0.042e^{-i0.6\pi} \end{pmatrix} \quad (S12)$$

The reflected power from each port of the coupler is less than 0.18% and the power coupling efficiency is 10%

Next, the designed kernel and couplers am assembled in the transmissive setup (similar to FIG. 18A or FIG. 21). Since g[ū] and Iin[ū] follow the general relation $I_{in}[\bar{u}]=A\cdot g[\bar{u}]$ in the system, each column on the inverse matrix can be calculated by exciting the system at the corresponding input. For instance, in order to calculate the first column of A☐1, structure must be excited at port 1 (numbering shown in FIG. 19B), corresponding to excitation vector $I_{in}[\bar{u}]=[I_{in,1}\cos(\omega t+\varphi_{in,1})0,0,0,0]$. The solution g[ū] is then calculated based on equations similar to Eq. (S6), sketched in FIG. 19C.

Two sources of error am present in the simulated solution: 1—error due to deviation of the designed kernel parameters from ideal one (i.e., scattering parameters of the dielectric kernel are not exactly equal to the ideal one, comparing Eq. (S7) with Eq. (S10)), and 2—error due to the presence of the couplers. Each error contributes roughly to half of the final error we observed in the elements of the inverse matrix. The second error, however, can be completely removed through the coupler de-embedding process described further herein. We intentionally did not add this de-embedding step in the above to show the actual simulated results.

Reflective Arrangement of the Equation Solver

We proposed two different arrangements of the feedback system to solve the integral equation presented in Eq. (1), above. As discussed above, the solution to the integral equation is based on a recursive summation of the input signal going through the kernel (see Eqs. (S23) and (S24)). To attain this recursive behavior, we use an external feedback line as shown in FIG. 18A or FIG. 21. Alternatively, feedback mechanism can be implemented in form of internal reflections (cavity like response) as shown in FIG. 20A. In this case, the transfer function of the kernel is defined as the relation between the ingoing (green) and outgoing (red) waves, i.e., the scattering matrix of the block. Similar to the transmissive scenario, a set of coupling elements must be incorporated in the feedback path to apply the input signal (e.g., excite the system) and probe the steady-state response (e.g., read the solution of the equation). The choice of the coupling elements is quite flexible. In the following we discuss two possible scenarios: Partially reflecting mirrors as shown in FIG. 28A, and terminated couplers as shown in FIG. 28B.

Case 1: Using partially reflecting mirrors is described as follows.

FIG. 29 shows the coupling segment of the block-diagram in FIG. 28A, comprising of N mirrors each with two ports. The red and green arrows show the direction of propagating modes on each side of the mirrors. The scattering matrices of the partially reflecting mirrors are all identical and equal to, $$S_{PRM} = \begin{pmatrix} t_1 & t_2 \\ t_2 & t_1 \end{pmatrix} \quad (S13)$$

following the port numbering indicated on FIG. 29. Here, $t_1$ is the reflection coefficient at each port and $t_2$ is the corresponding transmission coefficient between the two ports. Assuming lossless operation, the two coefficients are related as $|t_1|^2+|t_2|^2=1$. Here, we use a symmetric mirror, but the same formation may be extended to the case of an asymmetric mirror as well. The relation between the incident signal and the output in FIG. 28 may be written as, $$G[\bar{u}]=t_2I_{in}[\bar{u}]+t_1S^T[\bar{u},\bar{v}]\cdot g[\bar{u}]$$

$$\text{Output}[\bar{u}]=t_1I_{in}[\bar{u}]+t_2S^T[\bar{u},\bar{v}]\cdot g[\bar{u}] \quad (S14)$$

Examining Eq. (S14) it can be seen that this relation is similar to Eq. (S5), written for a "transmissive" equation solver setup. Accordingly, the signal measured at the output port can be used to calculate the solution following an equation similar to Eq. (S6). The solution may also be directly extracted from the input ports of the kernel using a set of directional couplers, with no further post processing. We note that the previous argument on the effect of couplers on the solution in the d-embedding process is also valid here, as the solution follows similar formulation.

Case 2: Using terminated couplers is described as follows.

FIG. 30 shows one of the terminated couplers in the block-diagram of FIG. 28B, comprising of three open ports and one terminated port (#4). The red and green arrows show the direction of propagating modes on each port of the coupler. The scattering matrix of each terminated coupler can be written as, $$S_{coupler} = \begin{pmatrix} t_{1,1} & t_2 & 0 \\ t_2 & t_{2,2} & t_3 \\ 0 & t_3 & t_{3,3} \end{pmatrix} \quad (S15)$$

following the port numbering indicated on FIG. 30. Here, $t_{1,1}$, $t_{2,2}$ and $t_{3,3}$ are the reflection coefficients at each port (which are designed to be close to one) and $t_2$ and $t_3$ are the transmission coefficients between ports 1 and 2 (excitation path) and ports 2 and 3 (sampling path), respectively. The coupler is terminated at port 4 (e.g., with a PEC wall). The relation between the incident signal and the output in FIG. 30 may be written as, $$g[\bar{u}] = t_2 I_{in}[\bar{u}] + t_{2,2} S^T[\bar{u},\bar{v}] \cdot g[\bar{u}]$$

$$\text{Output}[\bar{u}] = t_3 S^T[\bar{u},\bar{v}] \cdot g[\bar{u}] \quad (S16)$$

Examining Eq. (S16), if $t_{2,2} \to 1$ & $t_2 \to 0$ it can be seen that the first equation is equal to Eq. (S1) after re-scaling the input signal $$I_{in} = \frac{I_{in-original}}{t_2}$$

(this arrangement is identical to our experiment example 3). The second equation can be used to extract the solution $g[\bar{u}]$ from the system as, $$G[\bar{u}] = t_{2,2} \text{Output}[\bar{u}]/t_3 + t_2 I_{in}[\bar{u}] \quad (S17)$$

Experimental Implementation of Kernel 3 in the Reflective Setup

The experimental setup (see FIG. 20C) comprises several pieces: the base, the dielectric structure (kernel), the absorbers, the probes (ports connecting the solver to measurement apparatus), and the lid. In the following we provide the details on the design of each segment.

Base: The base of the device was fabricated via CNC milling out of a dimensionally stable Aluminum alloy (jig plate). This alloy has the property of low residual stress such that a thin structure could be hollowed out on a single side without creating large deformations. In addition to the basic structure of the electromagnetic cavity, there was both probe mounting holes and a constellation of 0.125 inch holes for alignment of the dielectric structure.

Dielectric structure: The dielectric structure was designed using the objective-first optimization technique (41). The objective function of the optimization was defined to minimize the error between design's reflective matrix and the desired reflective matrix $S^K$ built from $K_3(u,v)$. The optimization was performed at the initial design frequency of $f_0 = 4.25$ GHz ($\lambda_0 = 7.06$ cm) wherein the rectangular design region (60.96 cm×30.48 cm, $8.63\lambda_0 \times 8.63\lambda_0$) was initially varied such that the permittivity of each point was bounded between [1,2,53]. Following satisfactory convergence, a second stage of optimization was performed in which penalties were introduced that encourage the structure to binarize between air and Rexolite, a low-loss polystyrene with a permittivity near 2.53. The second stage of optimization concluded when a satisfactorily small error in the binarized structure was achieved. The desired kernel is lossy and as an energy absorption mechanism we designed the kernel in situ with a free space margin of $0.176\lambda_0$ followed by a Perfectly Matched Layer (PML). In experiment we use commercial absorbing material (see below).

FIG. 20D shows the finalized design used in the experiment. After the completion of the design, the optimal operation frequency is found by investigating the AEE across frequency, as shown in FIG. 31, calculated based on full-wave simulation of the kernel in CST Studio Suites® software. The results are compared for two different mesh sizes in FIG. 31, to confirm convergence of the solution in the inhomogeneous medium. Details of the mesh properties are reported in the caption of FIG. 31. As it can be seen, the AEE has a clear dip around $f_{optimal} = 4.344$ GHz which we use to calculate "simulation" results reported in FIGS. 20E-20G. FIG. 32 displays the electric field distribution inside the designed kernel when excited at different ports. The difference between the optimal and design frequencies is attributed to mesh dispersion error.

After the completion of the design and simulations, the physical structure was fabricated out of Rexolite. The plastic was initially predrilled with the same constellation of 0.125 inch holes. The plastic was then attached to sacrificial aluminum with 3M VHB tape and bolts using these holes. The Rexolite pieces were then cut using CNC Milling. Following removal of the bolts, the parts were released from the tape by a 48 hour soak in methanol and gentle mechanical encouragement. The pieces were assembled by matching the constellation of holes in the base to the holes in the pieces using 0.125 inch Rexolite roughened dowels. The tops of the dowels were then filed flat.

Absorbers: The absorber is AN-77 from Emmerson-Cummings, a three-layer graphite impregnated foam such that the conductivity increases with greater depth. The foam was cut via bandsaw into ¼ inch thick slices and placed such that the "front" surface of the absorber faced the dielectric structure and the "back" was at against the wall of the base. Additionally, chamfers were used to ensure that the individual layers were continuous at the corners. A model of this foam (as opposed to PML) was used in all simulations of the assembled system.

Probes: The RF probes were fabricated from Type-N Through Hull adapters (AMP Part number 1057290-1). Using a CNC mill, the dielectric was trimmed flush with the surface and the center conductor was cut to protrude only 1.5 mm, as determined by traditional optimization using CST Studio Suites® in accordance with the desired coupling parameters (see "Coupler Design" below). Additionally, the mounting holes were counterbored such that the probes could be mounted with the top of the bolts flush with the probe surface. Following mounting, the probes were taped in using 3M copper tape with conductive adhesive and rubbed in to activate the pressure sensitive adhesive.

Lid: The top (lid) of the structure was fabricated via water jet cutting out of 6061 Aluminum. The top and base were bolted together. At critical locations around the five waveguides where the unattenuated wave will directly impinge on the bolted interface, the bolts were spaced no further than 30 mm apart. A neoprene gasket and backing plate insured a uniform pressure. At locations on the perimeter of the device which are effectively hidden by the absorber, the top bolt spacing was relaxed. At all locations where the top and the base were in contact, the joint was sealed using 3M double sided copper tape with conductive adhesive. An even pressure was applied to the top to keep it pressed against the Rexolite pieces such that a uniform height was maintained within the cavity.

Measurement: The device was measured using an Agilent 5071C VNA. It was calibrated with a full 2-Port calibration prior to measurement. Each of the five couplers has an "input" probe and an "output" probe, corresponding to ports 1 and 3 in FIGS. 30 and 33. Every combination of input and output probes was measured for a total of 25 measurements. 50 Ohm terminators ae used on each of the unused coaxial ports during measurements to maintain matching.

Coupler Design: The terminated couplers are designed over a reasonably wide frequency range around $f_0=4.25$ GHz such that approximately 90% power was reflected with zero phase delay as seen by the kernel. The basic coupler design comprises a ~$125\lambda_{guided}$ waveguide stub with a PEC back wall (terminated port) into which input and sensing probes are placed, each in a separate standing wave field maximum. The excitation and probing ports each couple approximately 5% power. Keeping the stub as short as possible minimizes dispersion in the feedback into the kernel. Separating the probes minimizes coupling between the input and sensing elements. The waveguide is $TE_{10}$ single-moded and the coupling occurs between the TEM mode of the coaxial cables and the $TE_{10}$ mode of the waveguide. The specific design parameters were obtained through optimization in CST Studio Suites® software by varying the probe pin height, the waveguide stub length, and the probe placement.

The final coupler design was simulated by itself and used to determine the de-embedding coefficients needed in Eq. (S16) (namely $t_2$ and $t_3$) and the recursion parameter $t_{2,2}$. As can be seen in FIG. 33, these parameters are dispersive and will be slightly different at the design frequency $f_0=4.25$ GHz compared to $f_{optimal}=4.33$ GHz. It is only fair that we are gathering a solution, [ū], for the problem at hand which is defined by both the kernel and the recursion parameter, $t_{2,2}$. In other words, we must assume the device is functioning properly such that $t_{2,2}=\sqrt{0.9}=0.948+0i$, despite knowing otherwise. Any deviation in $t_{2,2}$ due to dispersion or otherwise manifests as error in the garnered solution, [u], which is small as seen in FIGS. 20A-G. However, we allow ourselves to utilize the most accurate frequency dependent deembedding coefficients $t_2$ and $t_3$ as these reflect the relationship of the probes to the system and are secondary to the integral equation.

$$S_{coupler-implemented} = \begin{pmatrix} -0.59 - 0.77i & 0.21 + 0.1i & -0.02 - 0.02i \\ 0.21 + 0.1i & 0.945 & -0.21 - 0.1i \\ -0.02 - 0.02i & -0.21 - 0.1i & -0.59 - 0.78i \end{pmatrix} \quad (S18)$$

As discussed in "Materials and Methods: Reflective arrangement of the equation solver" a partially reflecting mirror maybe used in place of the terminated coupler. The major drawback of such structure is the large reflection from the excitation port (port 2, FIG. 29), which will mask the signal coupling out from the system (Output). Using the terminated 3-port coupler, we create two separate ports: one to excite the structure (port 1 in FIG. 30) and one measure the output (port 3 in FIG. 30). As shown in Eqs. (S16) and (S17), the output signal does not include the strong background input signal, and can be measured more accurately.

Comparison between the reflective and transmissive setup for solving the integral equation with kernel $K_3(u,v)$, example 3 above.

To calculate the solution of the Integral equation associated with $K_3(u,v)$ given in Eq. (4) above, we can use two different approaches: internal feedback and external feedback mechanism. The design procedure and results for the internal feedback mechanism or the reflective setup are reported elsewhere herein. Here, we provide the alternative approach based on transmissive setup and three sets of data will be compared in the following:

i) Simulation results using transmissive setup, ii) Simulation results using reflective setup (thin-lines in FIG. 20G), iii) Experimental results using reflective setup (thick-lines in FIG. 20G).

In order to create the physical system to mimic the mathematical kernel over the range [−2,2] and with five sampling points (N=5), the transfer matrix of the system must follow.

$$S_{ideal}^T = \begin{pmatrix} -0.1 + 0.39i & -0.15 + 0.17i & 0.03 - 0.22i & 0.05 - 0.1i & 0.02 + 0.22i \\ -0.15 + 0.17i & -0.02 - 0.17i & 0.24 - 0.29i & 0.3 - 0.06i & 0.05 + 0.24i \\ 0.03 - 0.22i & 0.24 - 0.29i & 0.36 - 0.12i & 0.24 + 0.05i & 0.03 - 0.01i \\ 0.05 - 0.1i & 0.3 - 0.06i & 0.24 + 0.05i & -0.02 + 0.04i & -0.15 - 0.04i \\ 0.02 + 0.22i & 0.05 + 0.24i & 0.03 - 0.01i & -0.15 - 0.04i & -0.1 + 0.04i \end{pmatrix} \quad (S19)$$

in which $S_{n,m}^T=K_3(U_n,V_m)$ for n,m=1, . . . , 5 and the complete scattering matrix of the kernel is given in Eq. (S2). Similar to the design of the inhomogeneous kernel for the implementation of the matrix $I_{5\times5}-A$, we use the objective-first optimization technique to design the inhomogeneous distribution of permittivity inside a square region of size 60.96 cm×60.96 cm. The relative permittivity is varied between $\varepsilon_r=1$ (air), and $\varepsilon_r=2.53$ (low-loss Polystyrene) and the initial design frequency is set at $f_0=4.25$ GHz ($\lambda_0=7.06$ cm). FIG. 34 shows the optimized permittivity distribution for this kernel. FIG. 35 shows the distribution of the out-of-plane component of the electric field inside the kernel for excitation at different ports. The scattering matrix of the implemented kernel is calculated through full-wave simulation of the kernel in the COMSOL software and compared with the desired one, given in Eq. (S19). The average element error plot versus frequency (FIG. 36) indicates that the optimal design frequency is at 4.344 GHz, less than 2.3% from the initial design frequency. The results are compared for two different mesh sizes in FIG. 36, to confirm convergence of the solution in the inhomogeneous medium. Details of the mesh properties are reported in the caption of FIG. 36.

At the optimal design frequency, the scattering matrix of the designed kernel (in FIG. 34) is, $$S_{transmissive}^T = \begin{pmatrix} -0.18+0.48i & -0.1+0.13i & -0.03-0.24i & 0.01-0.06i & 0.04+0.24i \\ -0.05+0.14 & -0.02-0.18i & 0.27-0.3i & 0.31-0.09i & 0.03+0.27i \\ -0.03-0.23i & 0.27-0.3i & 0.29-0.11i & 0.22+0.08i & 0.06 \\ 0.03-0.07i & 0.33-0.09i & 0.17+0.06i & 0.01i & -0.14-0.07i \\ 0.07+0.21i & 0.03+0.25i & 0.08-0.01i & -0.08-0.05i & -0.13+0.05i \end{pmatrix} \quad (S20)$$

where $S_{transmissive}^T$ is to be compared with the goal matrix given in Eq. (S19)). The calculated reflected power at all five input ports is less than 1.1% for all excitations.

The directional couplers are identical to those characterized in Eq. (S12) and FIG. 27, operating with the fundamental TE$_{10}$ mode of the waveguides. Next, the designed kernel and couplers are assembled in the transmissive setup (similar to FIG. 18A or FIG. 21), to calculate g[ū] for an arbitrary input signal I$_{in}$(ū) based on equations similar to Eq. (S6). FIG. 37 shows the distribution of power inside the solver for two different input signal vectors I$_{in}$(ū). Performance of the solver in transmissive setup is characterized in FIG. 38. The results are compared with those reported in FIG. 20G, for the reflective design, showing very good agreement. Indeed, both setups may equivalently be used, depending on the application. The reflective setup is typically smaller, yet, as discussed herein, it does not support nonsymmetric kernels. We also note that to maintain reciprocity in the reflecting setup, K$_3$[u,v] is chosen such that K$_3$[u,v]=K$_3$[v,u], so S$^K$ would be automatically symmetric. In addition, this is a passive kernel, i.e., K$_3$–(S$^K$)$^H$(S$^K$) is a positive-definite matrix.

FIG. 39 compares the experimentally measured scattering parameters (complete set of 25 parameters) to full-wave simulations of the same configuration, across the 4-4.5 GHz frequency range. For the maximum match, the simulation results (dashed) are slightly redshifted (≈40 MHz). The results indicate very good match between the simulation and measurement, also manifested in FIG. 20E and FIG. 20G. At the optimal design frequency, the scattering matrix of the implemented kernel (FIG. 20D) is estimated as, $$S_{reflective} = \begin{pmatrix} -0.07+0.38i & -0.08+0.16i & 0.05-0.3i & 0.04-0.13i & -0.03+0.18i \\ -0.08+0.16i & -0.04-0.12i & 0.18-0.24i & 0.31-0.04i & 0.11+0.29i \\ 0.05-0.3i & 0.18-0.24i & 0.29-0.06i & 0.21 & 0.08-0.09i \\ 0.04-0.13i & 0.31-0.04i & 0.21 & -0.14+0.08i & -0.15-0.11i \\ -0.03+0.18i & 0.11+0.29i & 0.08-0.09i & -0.15-0.11i & 0.1i \end{pmatrix} \quad (S21)$$

to be compared with the ideal kernel given in Eq. (S19). FIG. 40 also shows the amplitude and phase of the electric field distribution inside the kernel, associated with the data presented in FIG. 20F.

Effect of non-idealities and noise is described as follows.

Dealing with an analog system, non-idealities present in the structure and implementation, are expected to impact the calculated solution of the integral equation in the physical system. In general, error is added in two distinct forms, systematic errors and random errors. If possible, systematic errors should be modeled and removed/de-embedded from the measurements. On the other hand, random errors are by definition impossible to predict and their statistical effect must be determined through techniques such as Monte-Carlo type simulations. To assess the extent of such effects, we have performed a series of numerical simulations in CST schematics (at the system level using scattering parameters of each element, as shown in FIG. 21), varying different parameters of the system. Two sources of error are studied.

First, as discussed above, the implemented kernel of the integral equation may differ from the ideal (provided) kernel. Such differences can create error in the calculation of the solution of the integral equation or the inverse of a matrix. Second, the coupling elements used to apply the input signal and extract the solution may be different from the ideal scenario (non-zero reflection, specific coupling coefficient, etc.). In each case, we assume a certain range of error (randomly generated) added to each element of "ideal" scattering matrix of different components. i.e., $$S_{n,m}^{non-ideal} = S_{n,m}^{ideal} + U(0,r)\exp(i2\pi U(0,1)) \quad (S22)$$

Here, $S_{n,m}^{non-ideal}$ is the (n,m) element of the "noisy" scattering matrix, $S_{n,m}^{ideal}$ is the (n,m) element of the ideal scattering matrix and U(0,r) is the uniform distribution function in the range (0,r) as shown in Eq. (S22), a complex number is added to each element of the ideal matrix with amplitude randomly varying between (0,r) and phase randomly assigned in the (0,2π) range. We repeat each simulation 200 times, estimating the range of the error in the solution based on the amount of the random error added to the scattering matrix.

FIG. 41A shows the output wave for applied input signal to port 1 of the equation solver based on reflective setup and integral equation kernel K$_3$(u,v) in schematic modeling (FIG. 8A model is used). The ideal solution is shown in blue while the results of 200 simulation with noisy kernels are shown in red lines. Here, a very large range of variation in scattering elements are assumed (r=0.1), and yet, the solution is very robust to such variations. As expected, (shown in FIG. 41B), the range of error in the solution becomes less for smaller values of r. The solution is more sensitive to variations in the elements of "partially reflecting mirror". This is shown in FIG. 42 where we compare the ideal solution with case of 200 simulations, assuming r=0.01 in mirrors' scattering matrix elements. This is expected as the solution is proportional to the inverse of the coupling coefficient (see Eq. (S6)) which is a small number. In reality, the coupling element is characterized prior to assembly into the system which will reduce these effects.

We also note that the resilience to noise depends on the kernel of choice and the implementing setup (reflective vs. transmissive). We have performed similar studies for other cases (different values of r, input, etc.) which are not presented here for the sake of brevity.

Time response is described as follows.

To completely characterize the proposed system, we need to estimate the response time in the steady state, which is the time needed for solution to the equation to be achieved after the input signal is applied. For this purpose, we use numerical simulation of the fabricated device in CST Studio Suite®. As shown in FIG. 43, the input signal (from each of the five ports in FIGS. 20B-C, one-by-one) is a step sinusoidal function at f=4.34 GHz with rise time of 50 cycles. Output is measured at all 10 ports (see FIG. 28B) and the results are shown for input signal applied to port 1. The results for excitation at other ports are similar in nature. The steady-state solution Is achieved in approximate 200 cycles.

The recursive approach to solve the integral equation $g(u)=I_{in}(u)+\int_a^b K(u,v)g(v)dv$ is convergent to the desired solution (in the steady state), if all the eigenvalues of kernel transfer matrix $S^T$ are smaller than "unity" in amplitude (40). This can be seen by looking at the equation in the "i-th" round:

$$g_i[\bar{u}]=I_{in}[\hat{u}]+S^T([\bar{u},\bar{v}]) \cdot g_{i-1}[\bar{u}] \quad (S23)$$

Assuming $g_0=0$ (i.e., before applying the input signal), the steady-state solution is, $$g_i[\bar{u}] = I_{in}[\bar{u}] \cdot \sum_{n=0}^{i-1} (S^T[\bar{u},\bar{v}])^n \quad (S24)$$

For this series to be convergent, all the eigenvalues of the matrix $S^T$ have to be smaller than unity in amplitude (40). This is also equivalent to calculating the inverse of the matrix $I_{N\times n}-S^T$ in which $I_{N\times N}$ is the identity matrix of order N (note that $g[\bar{u}]$ equals $(I_{N\times N}-S^T)^{-1} \cdot I_{in}[\bar{u}]$ in Eq. (S1))

As mentioned in the Materials and Methods description above, there is complete freedom in the choice of kernel regarding reciprocity. This means that the transmissive structure is always a reciprocal system, independent from the choice of kernel. The eigenvalues of the kernel transfer matrix $S^T$, however, are not guaranteed to be smaller than unity in amplitude and the convergence condition of Eq. (S24) may not be in general satisfied. It has been suggested in literature (34) that the kernel (or its transfer matrix) maybe scaled down by the amplitude of the largest eigenvalue to impose the convergence of the solution in the recursive setup, i.e., $K_{modified}(u,v)=K(u,v)/|\lambda_{max}|$ (34). The eigenvalues of the modified kernel are thus all smaller than unity in amplitude and the solution to the corresponding integral equation (or matrix inversion) is thus convergent in an iterative setup.

While this trick can assure the convergence of the solution to the equation $g_{modified}(u)=I_{in}(u)+\int_a^b K_{modified}(v)dv$, or equivalently inversion of the matrix $(I_{N\times N}-S_{modified}^T)^{-1}$, it however fundamentally changes the equation. Indeed, $g_{modified}(u)$ is not proportional to $g(u)$ because $(I_{N\times N}-S_{modified}^T)^{-1}$ is not proportional to $(I_{N\times N}-S^T)^{-1}$. To address this problem, we investigate in the following the possibility of modifying the kernel and input signal such that the solution of the modified equation remains proportional to the initial solution and the eigenvalues of the modified kernel (transfer matrix) may all become smaller than unity in amplitude.

Let us start with the initial problem:

$$I_{in}[\bar{u}]+S^T[\bar{u},\bar{v}] \cdot g[\bar{u}]=g[\bar{u}] \quad (S2s)$$

Now let's scale the "entire" equation by factor α and rearrange the equation in form of the initial equation, $$\alpha I_{in}[\bar{u}]+\alpha S^T[\bar{u},\bar{v}] \cdot g[\bar{u}]=\alpha g[\bar{u}] \rightarrow$$
$$I_{in,modified}[\bar{u}]+S_{modified}^T[\bar{u},\bar{v}] \cdot g[\bar{u}]=g[\bar{u}] \quad (S26)$$

In which $I_{in,modified}[\hat{u}]=\alpha I_{in}[\bar{u}]$ and $S^T_{modified}=\alpha S^T-\alpha I_{N\times N}+I_{N\times N}$.

The question is: can parameter a be properly chosen such that all the eigenvalues of the new matrix $S_{modified}^T$ are smaller than unity in amplitude? In that case, the solution of such system is exactly the solution of the original equation if one applies $$I_{in,modified}[\bar{u}]=\alpha I_{in}[\bar{u}]$$

We start by looking at the eigenvalues of $S^t$ and $S_{modified}^T=\alpha S^T-\alpha I_{N\times N}+I_{N\times N}$. Eigenvalues are the solutions of the following determinant equations, $$|S^T[\bar{u},\bar{v}]-\lambda I_{N\times N}|=0 \rightarrow \lambda$$

$$|S_{modified}^T-\lambda_{modified} I_{N\times N}|=0 \rightarrow \lambda \quad (S27)$$

Substituting $S_{modified}^T=\alpha S^T-\alpha I_{N\times N}+I_{N\times N}$ and simplifying Eq. (S27) we get, $$|\alpha S^T-\alpha I_{N\times N}+I_{N\times N}-\lambda_{modified} I_{N\times N}|=0 \quad (S28)$$

After some straightforward mathematical simplifications, Eq. (S28) can be reduced to, $$|S^T-(1-\alpha^{-1}+\alpha^{-1}\lambda_{modified})I_{N\times N}|=0 \quad (S29)$$

Comparing Eqs. (S29) and (S27), the general relation between λ and $\lambda_{modified}$ can be found as.

$$1-\alpha^{-1}+\alpha^{-1}\lambda_{modified}=\lambda \quad (S30)$$

Or equivalently, $$\lambda_{modified}-1=\alpha(\lambda-1) \quad (S31)$$

If λ is outside the unit circle in the complex plane then the Eq. (S1) may not be solved recursively. With proper scaling, the left side of Eq. (S31) is desired to move inside the circle with radius one and centered at x=−1, which means that amplitude of $\lambda_{modified}$ modified would then become smaller than unity. Depending on the distribution of eigenvalues λ in the complex plane, this may not be always possible, except for the trivial case of α=0. In cases that such transformation is possible, the linear integral (matrix) equation in Eq. (S1) can be solved in a recursive setup (as suggested in this paper) with the following normalization applied to the equation:

$$S_{modified}^T=\alpha S^T+(1-\alpha)I_{N\times N} \quad (S32)$$

Objective-first Design is described as follows.

In order to create a physical representation for the ideal kernels shown in FIG. 18A, we engineer the inhomogeneous distribution of relative permittivity inside a predefined and compact region, as shown in FIGS. 19A and 20). The dielectric distribution is designed using a custom Mathematica code developed in our group, essentially implementing our own Finite Difference Frequency Domain (FDFD) solver. The solver models a two-dimensional domain as a grid of points using conventional Yee cells to solve Maxwell's equations in the frequency domain and as a system of simultaneous equations. This can be captured in the matrix form as Mx=B where x is a vector containing all unknown electric and magnetic fields. M is a sparse square matrix containing the nearest neighbor relationships between the fields, specifically capturing the local permittivity and permeability, and B is the source term containing excitations to the system such as electric dipoles and waveguide ports. Since M is square, the system is fully determined with one unique solution, satisfying the constraints of the system.

Optimization with such solver typically involves systematically changing the structure (i.e., distribution of the inhomogeneous permittivity) and revaluating the system to determine whether the change has improved or deteriorated the response, based on a predefined optimization goal. In general, assuming no previous knowledge about the structure and treating the permittivity of every point on the grid as an optimization parameter can be problematic since determining the gradient of the loss function potentially requires a separate numerical simulation for each parameter to determine the local gradient for that point on the optimization trajectory. Here, and in order to avoid such large calculation cost, we adapted the Objective First Design (OFD) technique recently used for the design and optimization of several photonic structures (41). The OFD technique starts with a source-less system Mx=0 and appends to this system a series of additional constraints Ax=c, which can "pin" the values of electric and magnetic fields at a specific position or on the ports. As a result, the desired scattering matrix is mathematically represented as a set of constraints (not as part of the loss function) resulting in a system of equations which is over-constrained. Performing a least square minimization in this context means reducing the residual error in the fields as they attempt to satisfy Maxwell's Equations, and the resulting electric and magnetic fields in x will only approximately satisfy Maxwell's equations. These fields can be then used to calculate a permittivity distribution, $$\varepsilon(x, y) = \frac{\nabla \times H}{i\omega E},$$

which is slightly different from the starting one. The difference between the old and new permittivity can be likened to a gradient operation and can be used to define a step direction. The step direction is defined for all permittivity values in the design area simultaneously, dramatically reducing the computational time required to optimize a structure. After updating the permittivity, we repeat this process, bringing the permittivity closer and closer to the "optimal one" which satisfies Maxwell's equations under the imposed constraints.

It is useful to consider the differences between the old and new permittivities as defining a "force" on each permittivity pixel. This force can be combined with a regularization force and binarization force to create a structure which is manufacturable. For instance, for the experiment (structure shown in FIGS. 20B-C), relative permittivity is encouraged to be either 1 (air) or 2.53 (low-loss Polystyrene), and unattainable sharp features are avoided in the distribution of the dielectric. In each iteration, we then utilize our FDFD simulation code to calculate the total error, 20 as defined in Eq. (S8). Once the error is low enough (i.e., $|S-S_{goal}|^2<0.01$, we conclude the optimization and choose the final distribution of permittivity.

In all cases, final distribution of relative permittivity is extracted and its performance is rechecked with commercial full-wave simulation tools (38).

REFERENCES AND NOTES

1. C. Corduneanu, *Integral Equations and Applications* (Cambridge Univ. Press, 1991).
2. A. Sommerfeld, *Partial Differential Equations in Physics* (Academic Press, 1949), vol. 1.
3. B. Noble, Methods Based on the Wiener-Hopf Technique for the Solution of Partial Differential Equations (Chelsea Publishing, 1988).
4. S. C. Chapra, R. P. Canale, *Numerical Methods for Engineers* (McGraw-Hill, 2010).
5. C. O. Broyden, *Math. Comput.* 19, 577-593 (1965).
6. H. J. Caulfield. S. Dolev, *Nat. Photonics* 4, 261-263 (2010).
7. X. Lin et al., *Science* 361, 1004-1008 (2018).
8. T. W. Hughes, M. Minkov, Y. Shi, S. Fan, *Optica* 5, 864-871 (2018).
9. T. Zhu et al., *Nat. Commun.* 8, 15391 (2017).
10. M. Ferrera et al., *Nat. Commun.* 1, 29 (2010).
11. M. A. Preciado, M. A. Muriel, *Opt. Lett.* 33, 1348-1350 (2008).
12. J. Azaña, *Opt. Lett.* 33, 4-6 (2008).
13. J. Xu. X. Zhang, J. Dong, D. Liu, D. Huang, *Opt. Lett.* 32, 1872-1874 (2007).
14. M. Kulishov, J. Azaña, *Opt. Let.* 30, 2700-2702 (2005).
15. W. Liu et al., *Nat. Photonics* 10, 190-195 (2016).
16. T. Yang et al., *Sci. Rep.* 4, 5581(2014).
17. R. Slavik et al., *Opt. Express* 16, 18202-18214(2008).
18. D. R. Solli, B. Jalali, *Nat. Photonics* 9, 704-706 (2015).
19. D. R. Solli, G. Herink, B. Jalali, C. Ropers, *Nat. Photonics* 6, 463-468 (2012).
20. D. A. Miller, *Optica* 2, 747-750 (2015).
21. D. Pérez et al., *Nat. Commun.* 8, 636 (2017).
22. D. Pérez, I. Gasulla, J. Capmany, *Opt. Eras* 26, 27265-27278 (2018).
23. P. Ambs, *Adv. Opt. Technol.* 2010, 372652(2010).
24. N. Engheta, R. W. Ziolkowski, Eds., *Metamaterials: Physics and Engineering Explorations* (Wiley, 2006).
25. A. Silva et al., *Science* 343, 160-163 (2014).
26. A. Pors, M. G. Nielsen. S. I. Bozhevolnyi, *Nano Lett.* 15, 791-797 (2015).
27. S. AbdollahRamezani, K. Arik, A. Khavasi, Z. Kavehvash, *Opt. Lett.* 40, 5239-5242 (2015).
28. L. L. Doskolovich, D. A. Bykov, E. A. Bezus, V. A. Soifer, *Opt. Lett.* 39, 1278-1281 (2014).
29. W. Thomson, *Proc. R. Soc. London* 24, 269-271 (1876).
30. V. Bush, *J. Franklin Inst.* 212, 447-488 (1931).
31. J. Cederquist, *J. Opt. Soc. Am.* 71, 651-655 (1981).
32. H. Rajbenbach, Y. Fainman, S. H. Le, *Appl. Opt.* 26, 1024-1031 (1987).
33. J. Cederquist. S. H. Lee, *J. Opt. Soc. Am.* 70, 944-953 (1980).
34. K. Wu, C. Soci, P. P. Shum, N. I. Zhehudev, *Opt. Express* 22, 295-304 (2014).
35. F. B. Hildebrand. *Methods of Applied Mathematics* (Courier Corporation, 2012).
36. Materials and methods are available as supplementary materials.
37. D. M. Pozar, *Microwave Engineering* (John Wiley & Sons, 2009).
38. CST Design Studio; We used the schematic solver (www.cst.com/products/cstds) to model ideal blocks on the basis of their scattering matrixes. We used the full-wave solver (www.cst.com/products/csts2) for modeling the metamaterial structures.

39. Matlab (www.mathworks.com/products/matlab.html) and Mathematica (www.wolfram.com/mathematica) numerical solvers.
40. R. Oldenburger, *Duke Math. J.* 6, 357-361 (1940).
41. A. Y. Piggott et al., *Nat. Photonics* 9, 374-377 (2015).
42. D. A. B. Miller, *Photon. Res.* 1, 1-15 (2013).
43. G. Gok, A. Grbic, *Phys. Rev. Lett.* 111, 233904 (2013).
44. D. A. B. Miller, *J. Lightwave Technol.* 31, 3987-3994 (2013).

SUPPLEMENTAL REFERENCES

Sp1. C. Corduneanu, *Integral Equations and Applications* (Cambridge Univ. Press, 1991).
Sp 2. A. Sommerfeld, *Partial Differential Equations in Physics* (Academic Press, 1949), vol. 1.
Sp 3. B. Noble, Methods Based on the Wiener-Hopf Technique for the Solution of Partial Differential Equations (Chelsea Publishing, 1988).
Sp 4. S. C. Chapra, R. P. Canale, Numerical *Methods for Engineers* (McGraw-Hill, 2010).
Sp 5. C. G. Boyden, A class of methods for solving nonlinear simultaneous equations. *Math. Comput.* 19, 577-593 (1965). doi:10.1090/S0025-5718-1965-0198670-6
Sp 6. H. J. Caulfield, S. Dolev, Why future supercomputing requires optics. *Nat. Photonics* 4, 261-263 (2010). doi:10.1038/nphoton.2010.94
Sp 7. X. Lin, Y. Rivenson, N. T. Yardimci, M. Veli, Y. Luo, M. Jarrahi, A. Ozcan, All-optical machine learning using diffractive deep neural networks. *Science* 361, 1004-1008 (2018). doi:10.1126/science.aat8084 Medline
Sp 8. T. W. Hughes, M. Minkov. Y. Shi. S. Fan. Training of photonic neural networks through in situ backpropagation and gradient measurement. *Optica* 5, 864-871 (2018). doi:10.1364/OPTICA.5.000864
Sp 9. T. Zhu, Y. Zhou, Y. Lou, H. Ye, M. Qiu, Z. Ruan, S. Fan, Plasmonic computing of spatial differentiation. *Nat. Commun.* 8, 15391 (2017). doi:10.1038/ncomms15391 Medline
Sp 10. M. Ferrera, Y. Park, L. Razzari, B. E. Little, S. T. Chu, R. Morandotti, D. J. Moss. J. Azaña, On-chip CMOS-compatible all-optical integrator. *Nat. Commun.* 1, 29 (2010). doi:10, 1038/ncomms1028 Medline
Sp 11. M. A. Preciado, M. A. Muriel. Ultrafast all-optical integrator based on a fiber Bragg grating: Proposal and design. *Opt. Lett.* 33, 1348-1350 (2008). doi:10.1364/OL.33.001348 Medline
Sp 12. J. Azaña, Proposal of a uniform fiber Bragg grating as an ultrafast all-optical integrator. *Opt. Lett.* 33, 4-6 (2008). doi:10.1364/OL.33.000004 Medline
Sp 13. J. Xu, X. Zhang, J. Dong, D. Liu, D. Huang, High-speed all-optical differentiator based on a semiconductor optical amplifier and an optical filter. *Opt. Lett.* 32, 1872-1874 (2007). doi:10.1364/OL.32.001872 Medline
Sp 14. M. Kulishov, J. Azaña, Long-period fiber gratings as ultrafast optical differentiators. *Opt. Lett.* 30, 2700-2702 (2005). doi:10.1364/OL.30.002700 Medline
Sp 15. W. Liu. M. Li, R. S. Guzzon, E. J. Norberg, J. S. Parker, M. I.u, L. A. Coldren, J. Yao, A fully reconfigurable photonic integrated signal processor. *Nat. Photonics* 10, 190-195 (2016). doi:10.1038/nphoton.2015.281
Sp 16. T. Yang, J. Dong, L Lu, L. Zhou, A. Zheng, X. Zhang. J. Chen. All-optical differential equation solver with constant-coefficient tunable based on a single microring resonator. *Sci. Rep.* 4, 5581 (2014).
Sp 17. R. Slavik, Y. Park, N. Ayotte, S. Doucet, T.-J. Ahn, S. LaRochelle, J. Azaña, Photonic temporal integrator for all-optical computing. *Opt. Express* 16, 18202-18214 (2008). doi:10.1364/OE.16.018202 Medline
Sp 18. D. R. Solli, B. Jalali, Analog optical computing. *Nat. Photonics* 9, 704-706(2015). doi:10.1038/nphoton.2015.208
Sp 19. D. R. Solli, G. Herink. B. Jalali, C. Ropers, Fluctuations and correlations in modulation instability. *Nat. Photonics* 6, 463-468 (2012). doi:10.1038/nphoton.2012.126
Sp 20. D. A. Miller, Perfect optics with imperfect components. *Optica* 2 747-750 (2015). doi:10.1364/OPTICA.2.000747
Sp 21. D. Pérez, 1. Gasulla, L. Crudgington, D. J. Thomson, A. Z. Khokhar, K. Li, W. Cao. G. Z. Mashanovich, J. Capmany, Multipurpose silicon photonics signal processor core. *Nat. Commun.* 8, 636 (2017). doi:10.1038/s41467-017-00714-1 Medline
Sp 22. D. Pérez, I. Gasulla, J. Capmany, Field-programmable photonic arrays. *Opt. Express* 26, 27265-27278 (2018). doi:10.1364/OE.26.027265 Medlin
Sp 23. P. Ambs, Optical computing: A 60-year adventure. *Adv. Opt. Technol.* 2010, 372652(2010). doi:10.1155/2010/372652
Sp 24. N. Engheta, R. W. Ziolkowski, Eds., *Metamaterials: Physics and Engineering Explorations* (Wiley, 2006).
Sp 25. A. Silva, F. Monticone, G. Castaldi, V. Galdi, A. Alù, N. Engheta, Performing mathematical operations with metamaterials. *Science* 343, 160-163 (2014). doi:10.1126/science.1242818 Medline
Sp 26. A. Pors, M. G. Nielsen, S. I. Bozhevolnyi, Analog computing using reflective plasmonic metasurfaces. *Nano Lett.* 15, 791-797 (2015). doi:10.1021/n15047297 Medline
Sp 27. S. AbdollahRamezani, K. Arik, A. Khavasi, Z. Kavehvash. Analog computing using graphene-based metalines. *Opt. Lett.* 40, 5239-5242(2015).
Sp 28. L. L. Doskolovich, D. A. Bykov, E. A. Bezus, V. A. Soifer, Spatial differentiation of optical beams using phase-shifted Bragg grating. *Opt. Lett.* 39, 1278-1281 (2014). doi:10.1364/OL39.001278 Medline
Sp 29. W. Thomson, *Proc. R. Soc. London* 24, 269-271 (1876).
Sp 30. V. Bush, The differential analyzer. A new machine for solving differential equations. *J. Franklin Inst.* 212, 447-488 (1931). doi:10.1016/S0016-0032(31)90619-6
Sp 31. J. Cederquist, Integral-equation solution using coherent optical feedback. *J. Opt. Soc. Am.* 71, 651-655 (1981). doi:10.1364/JOSA.71.000651
Sp 32. H. Rajbenbach, Y. Fainman, S. H. Lee, Optical implementation of an iterative algorithm formatrix inversion. *Appl. Opt.* 26, 1024-1031 (1987). doi:10.1364/AO.26.001024 Medline
Sp 33. J. Cederquist, S. H. Lee, Coherent optical feedback for the analog solution of partial differential equations. *J. Opt. Soc. Am.* 70, 944-953 (1980). doi:10.1364/JOSA.70.000944
Sp 34. K. Wu, C. Soci, P. P. Shum, N. I. Zheludev, Computing matrix inversion with optical networks. *Opt. Express* 22, 295-304 (2014). doi:10.1364/OE.22.000295 Medline
Sp 35. P. B. Hildebrand, *Methods of Applied Mathematics* (Courier Corporation, 2012).
Sp 36. Materials and methods are available as supplementary materials.
Sp 37. D. M. Pozar, *Microwave Engineering* (John Wiley & Sons, 2009).
Sp 38. CST Design Studio; We used the schematic solver (www.cst.com/products/cstds) to model ideal blocks on the basis of their scattering matrixes. We used the full-wave solver (www.cst.com/products/csts2) for modeling the metamaterial structures.

Sp 39. Matlab (www.mathworks.com/products/matlab.html) and Mathematica (www.wolfram.com/mathematica) numerical solvers.

Sp 40. R. Oldenburger, Infinite powers of matrices and characteristic roots. *Duke Math. J.* 6, 357-361 (1940). doi:10.1215/S0012-7094-40-00627-5

Sp 41. A. Y. Piggott, J. Lu, K. G. Lagoudakis, J. Petykiewicz, T. M. Babinec, J. Vučković, Inverse design and demonstration of a compact and broadband on-chip wavelength demultiplexer. *Nat. Photonics* 9, 374-377 (2015). doi: 10.1038/nphoton.2015.69

Sp 42. D. A. B. Miller. Self-configuring universal linear optical component [Invited]. *Photon. Res.* 1, 1-15 (2013). doi:10.1364/PRJ.1.000001

Sp 43. G. Gok, A. Grbic, Tailoring the phase and power flow of electromagnetic fields. *Phys. Rev. Lett.* 111, 233904 (2013). doi:10.1103/PhysRevLett.111.233904 Medline Sp 44. D. A. B. Miller, Establishing optimal wave communication channels automatically. *J. Lightwave Technol.* 31, 3987-3994 (2013). doi:10.1109/JLT.2013.2278809

The present disclosure relates to at least the following aspects.

Aspect 1. A device comprising: a metastructure comprising a plurality of physical features configured to transform an analog signal according to a kernel of an integral equation; and one or more waveguides coupled to the metastructure and configured to recursively supply a transformed analog output signal of the metastructure to an input of the metastructure to iteratively cause one or more transformed analog signals output from the metastructure to converge to an analog signal representing a solution to the integral equation.

Aspect 2. The device of Aspect 1, wherein the analog signal comprises a visible spectrum light signal.

Aspect 3. The device of any of Aspects 1-2, wherein the analog signal comprises an infrared light signal.

Aspect 4. The device of any of Aspects 1-3, wherein the analog signal comprises one or more of a microwave signal, a radio frequency signal, or an electromagnetic radiation signal.

Aspect 5. The device of any of Aspects 1-4, wherein the one or more waveguides comprise a plurality of waveguides coupled to different portions of the metastructure.

Aspect 6. The device of any of Aspects 1-5, wherein the one or more waveguides each comprise a respective first end coupled to a first location of the metastructure and a respective second end coupled to a second location of the metastructure, the first and second locations optionally being opposite one another.

Aspect 7. The device of any of Aspects 1-6, wherein the physical features comprise a plurality of Mach-Zehnder interferometers.

Aspect 8. The device of Aspect 7, wherein phase configurations of phase shifters of the plurality of Mach-Zehnder interferometers configure, at least in part, the plurality of Mach-Zehnder interferometers to transform the analog signal according to the kernel.

Aspect 9. The device of any of Aspects 7-8, wherein an arrangement of the plurality of Mach-Zehnder interferometers in one or more of an array or a mesh configure, at least in part, the plurality of Mach-Zehnder interferometers to transform the analog signal according to the kernel.

Aspect 10. The device of any of Aspects 1-9, wherein the physical features comprise a plurality of regions of inhomogeneous characteristics.

Aspect 11. The device of any of Aspects 1-10, wherein the physical features comprise a plurality of regions of inhomogeneous permittivity.

Aspect 12. The device of any of Aspects 1-11, wherein the physical features are determined based on an optimization process.

Aspect 13. The device of any of Aspects 1-12, wherein the integral equation comprises one or more of a linear integral equations or a translationally variant linear integral equation.

Aspect 14. The device of any of Aspects 1-13, wherein the integral equation comprises an equation of a set of coupled integral equations.

Aspect 15. A method, comprising: supplying an analog signal to an input of a metastructure, wherein the analog signal represents an input value of an integral equation, and wherein the metastructure comprises a plurality of physical features configured to transform the analog signal according to a kernel of the integral equation; recursively supplying a transformed analog signal output from the metastructure to an input of the metastructure; and determining a solution to the integral equation based on a recursively transformed analog signal output from the metastructure.

Aspect 16. The method of Aspect 15, wherein the analog signal comprises a visible spectrum light signal.

Aspect 17. The method of any of Aspects 15-16, wherein the analog signal comprises an infrared light signal.

Aspect 18. The method of any of Aspects 15-17, wherein the analog signal comprises one or more of a microwave signal, a radio frequency signal, or an electromagnetic radiation signal.

Aspect 19. The method of any of Aspects 15-18, wherein recursively supplying the transformed analog signal output from the metastructure to an input of the metastructure comprises supplying the transformed analog signal via one or more waveguides.

Aspect 20. The method of Aspect 19, wherein the one or more waveguides comprise a plurality of waveguides coupled to different portions of the metastructure.

Aspect 21. The method of any of Aspects 19-20, wherein each of the one or more waveguides comprise a respective first end coupled to a first location of the metastructure and a respective second end coupled to a second side location of the metastructure, wherein the first and second locations are optionally opposite one another.

Aspect 22. The method of any of Aspects 15-21, wherein the physical features comprise a plurality of Mach-Zehnder interferometers.

Aspect 23. The method of Aspect 22, wherein phase configurations of phase shifters of the plurality of Mach-Zehnder interferometers configure, at least in part, the plurality of Mach-Zehnder interferometers to transform the analog signal according to the kernel.

Aspect 24. The method of any of Aspects 22-23, wherein an arrangement of the plurality of Mach-Zehnder interferometers in one or more of an array or a mesh configure, at least in part, the plurality of Mach-Zehnder interferometers to transform the analog signal according to the kernel.

Aspect 25. The method of any of Aspects 15-24, wherein the physical features comprise a plurality of regions of inhomogeneous characteristics.

Aspect 26. The method of any of Aspects 15-25, wherein the physical features comprise a plurality of regions of inhomogeneous permittivity:

Aspect 27. The method of any of Aspects 15-26, wherein the physical features am determined based on an optimization process.

Aspect 28. The method of any of Aspects 15-27, wherein the integral equation comprises one or more of a linear integral equations or a translationally variant linear integral equation.

Aspect 29. The method of any of Aspects 15-28, wherein determining the solution to the integral equation based on the recursively transformed analog signal output from the metastructure comprises determining that the recursively transformed analog signal has reached a steady state condition.

Aspect 30. The method of any of Aspects 15-29, wherein the integral equation comprises an equation of a set of coupled integral equations, and wherein determining the solution to the integral equation comprising determining a solution of the set of coupled integral equations.

Aspect 31. The device of any of Aspects 1-14, wherein the transformed analog signals are output to the one or more waveguides via the input.

Aspect 32. The method of any of Aspects 15-30, wherein recursively supplying a transformed analog signal output from the metastructure to an input of the metastructure comprises recursively receiving the transformed analog signals from the input and providing the transformed analog signals back to the input.

Definitions

It is to be understood that the terminology used herein is for the purpose of describing particular aspects only and is not intended to be limiting. As used in the specification and in the claims, the term "comprising" can include the embodiments "consisting of" and "consisting essentially of." Unless defined otherwise, all technical and scientific terms used herein have the same meaning as commonly understood by one of ordinary skill in the art to which this disclosure belongs. In this specification and in the claims which follow, reference will be made to a number of terms which shall be defined herein.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y." unless indicated otherwise. Likewise, the statement "about X, Y. or about Z" has the same meaning as "about X, about Y, or about Z," unless indicated otherwise. The term "about" as used herein can allow for a degree of variability in a value or range, for example, within 10%, within 5%, or within 1% of a stated value or of a stated limit of a range, and includes the exact stated value or range. The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more, or 100%.

In this document, the terms "a," "an," or "the" are used to include one or more than one unless the context clearly dictates otherwise. The term "or" is used to refer to a nonexclusive "or" unless otherwise indicated. The statement "at least one or A and B" has the same meaning as "A, B, or A and B." In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section.

In the methods described herein, the acts can be carried out in any order without departing from the principles of the invention, except when a temporal or operational sequence is explicitly recited. Furthermore, specified acts can be carried out concurrently unless explicit claim language recites that they be carried out separately. For example, a claimed act of doing X and a claimed act of doing Y can be conducted simultaneously within a single operation, and the resulting process will fall within the literal scope of the claimed process.

What is claimed:

1. A device comprising:
a metastructure comprising a plurality of physical features configured to transform an analog signal according to a kernel of an integral equation; and
one or more waveguides coupled to the metastructure and configured to recursively supply a transformed analog output signal of the metastructure to an input of the metastructure to iteratively cause one or more transformed analog signals output from the metastructure to converge to an analog signal representing a solution to the integral equation.

2. The device of claim 1, wherein the analog signal comprises one or more of a visible spectrum light signal, an infrared light signal, a microwave signal, a radio frequency signal, or an electromagnetic radiation signal.

3. The device of claim 1, wherein the one or more waveguides comprise a plurality of waveguides coupled to different portions of the metastructure.

4. The device of claim 1, wherein the one or more waveguides each comprise a respective first end coupled to a first location of the metastructure and a respective second end coupled to a second location of the metastructure, the first and second locations being opposite one another.

5. The device of claim 1, wherein the physical features comprise a plurality of Mach-Zehnder interferometers.

6. The device of claim 5, wherein phase configurations of phase shifters of the plurality of Mach-Zehnder interferometers configure, at least in part, the plurality of Mach-Zehnder interferometers to transform the analog signal according to the kernel.

7. The device of claim 1, wherein the physical features comprise a plurality of regions of one or more of inhomogeneous characteristics or inhomogeneous permittivity.

8. The device of claim 1, wherein the physical features are determined based on an optimization process.

9. The device of claim 1, wherein the integral equation comprises one or more of a linear integral equations, a translationally variant linear integral equation, or a set of coupled integral equations.

10. The device of claim 1, wherein the transformed analog signals are output to the one or more waveguides via the input.

11. A method, comprising:
supplying an analog signal to an input of a metastructure, wherein the analog signal represents an input value of an integral equation, and wherein the metastructure comprises a plurality of physical features configured to transform the analog signal according to a kernel of the integral equation;
recursively supplying a transformed analog signal output from the metastructure to an input of the metastructure; and
determining a solution to the integral equation based on a recursively transformed analog signal output from the metastructure.

12. The method of claim 11, wherein the analog signal comprises one or more of a visible spectrum light signal, an infrared light signal, a microwave signal, a radio frequency signal, or an electromagnetic radiation signal.

13. The method of claim 11, wherein recursively supplying the transformed analog signal output from the metastructure to an input of the metastructure comprises supplying the transformed analog signal via one or more waveguides.

14. The method of claim 13, wherein the one or more waveguides comprise a plurality of waveguides coupled to different portions of the metastructure.

15. The method of claim 13, wherein each of the one or more waveguides comprise a respective first end coupled to a first location of the metastructure and a respective second end coupled to a second side location of the metastructure, wherein the first and second locations are opposite one another.

16. The method of claim 11, wherein the physical features comprise a plurality of Mach-Zehnder interferometers.

17. The method of claim 11, wherein the physical features comprise a plurality of regions of one or more of inhomogeneous characteristics or inhomogeneous permittivity.

18. The method of claim 11, wherein the integral equation comprises one or more of a linear integral equations, a translationally variant linear integral equation, or a set of coupled integral equations.

19. The method of claim 11, wherein determining the solution to the integral equation based on the recursively transformed analog signal output from the metastructure comprises determining that the recursively transformed analog signal has reached a steady state condition.

20. The method of claim 11, wherein recursively supplying the transformed analog signal output from the metastructure to an input of the metastructure comprises recursively receiving the transformed analog signal from the input and providing the transformed analog signals back to the input.

* * * * *